United States Patent
Landa et al.

(10) Patent No.: US 9,559,617 B2
(45) Date of Patent: Jan. 31, 2017

(54) METHOD AND DEVICE FOR GENERATING ELECTRICITY AND METHOD OF FABRICATION THEREOF

(75) Inventors: Benzion Landa, Nes Ziona (IL); Yosef Yayon, Rehovot (IL); Sagi Abramovich, RaAnana (IL); Asher Ofir, Doar-Na Modiln (IL); Nir Rubin Ben-Haim, Hod-HaSharon (IL); Amir Lion, Kfar-MaAs (IL)

(73) Assignee: Landa Labs (2012) Ltd., Rehovot (IL)

( * ) Notice: Subject to any disclaimer, the term of this patent is extended or adjusted under 35 U.S.C. 154(b) by 1088 days.

(21) Appl. No.: 13/392,571

(22) PCT Filed: Aug. 26, 2010

(86) PCT No.: PCT/IL2010/000704
§ 371 (c)(1),
(2), (4) Date: Feb. 27, 2012

(87) PCT Pub. No.: WO2011/024173
PCT Pub. Date: Mar. 3, 2011

(65) Prior Publication Data
US 2012/0153772 A1 Jun. 21, 2012

Related U.S. Application Data

(63) Continuation-in-part of application No. PCT/IL2009/000831, filed on Aug. 27, 2009.
(Continued)

(30) Foreign Application Priority Data
Sep. 8, 2008 (GB) .................................. 0816418.8

(51) Int. Cl.
*H02N 1/00* (2006.01)
*H02K 44/00* (2006.01)
(Continued)

(52) U.S. Cl.
CPC ................. *H02N 3/00* (2013.01); *H01J 45/00* (2013.01); *H02N 11/002* (2013.01); *Y10T 428/249921* (2015.04)

(58) Field of Classification Search
CPC ............................... H02K 44/00; H02K 44/08
(Continued)

(56) References Cited

U.S. PATENT DOCUMENTS 3,214,616 A * 10/1965 Stewart Way et al. ......... 310/11
3,355,605 A * 11/1967 Okress ............................ 310/11
(Continued)

FOREIGN PATENT DOCUMENTS

CN 1058676 2/1992
CN 1138775 12/1996
(Continued)

OTHER PUBLICATIONS

Communication Pursuant to Article 94(3) EPC Dated May 7, 2013 From the European Patent Office Re. Application No. 09787547.0.
(Continued)

*Primary Examiner* — Jose Gonzalez Quinones

(57) ABSTRACT

Particulated structures and their method of manufacture for use in an electrical generator employing gas-mediated charge transfer are disclosed. The structures comprise a multiplicity of particles which contain voids between first and second opposing surfaces of said particles. At least a portion of said opposing surfaces are modified such that the charge transferability of said first opposing surfaces differs from the charge transferability of said second opposing surfaces.

10 Claims, 13 Drawing Sheets

US 9,559,617 B2

Page 2

Related U.S. Application Data

(60) Provisional application No. 61/310,188, filed on Mar. 3, 2010, provisional application No. 61/310,313, filed on Mar. 4, 2010, provisional application No. 61/136,317, filed on Aug. 28, 2008.

(51) Int. Cl.
*H02N 10/00* (2006.01)
*H02N 3/00* (2006.01)
*H01J 45/00* (2006.01)
*H02N 11/00* (2006.01)

(58) Field of Classification Search
USPC .......................... 310/11, 306, 209, 309, 308
See application file for complete search history.

(56) References Cited

U.S. PATENT DOCUMENTS

| | | | |
|---|---|---|---|
| 4,281,280 A * | 7/1981 | Richards | H02N 3/00 |
| | | | 310/306 |
| 6,064,137 A | 5/2000 | Cox | |
| 6,181,049 B1 | 1/2001 | Streckert et al. | |
| 6,407,477 B1 | 6/2002 | King et al. | |
| 6,489,704 B1 * | 12/2002 | Kucherov et al. | 310/306 |
| 6,841,891 B1 | 1/2005 | Luchinskiy et al. | |
| 7,109,408 B2 | 9/2006 | Kucherov et al. | |
| 2002/0121088 A1 | 9/2002 | Zuppero et al. | |
| 2004/0050415 A1* | 3/2004 | Kucherov et al. | 136/252 |
| 2006/0019160 A1 | 1/2006 | Han | |
| 2006/0038290 A1* | 2/2006 | Tavkhelidze | H01J 9/02 |
| | | | 257/734 |
| 2006/0250067 A1* | 11/2006 | Nanataki et al. | 313/311 |
| 2007/0042667 A1 | 2/2007 | Sung | |
| 2007/0126312 A1 | 6/2007 | Sung | |
| 2010/0170550 A1 | 7/2010 | Hiroyama | |

FOREIGN PATENT DOCUMENTS

| | | |
|---|---|---|
| CN | 1638255 | 7/2005 |
| CN | 1641921 | 7/2005 |
| CN | 1695292 | 11/2005 |
| CN | 1713416 | 12/2005 |
| CN | 101036198 | 9/2007 |
| DE | 10228222 | 2/2004 |
| EP | 1548924 | 6/2005 |
| EP | 1562248 | 8/2005 |
| EP | 2159856 | 3/2010 |
| JP | 63-169655 | 7/1988 |
| JP | 2003-250285 | 9/2003 |
| JP | 2003343237 A * | 12/2003 |
| RU | 2260879 | 9/2005 |
| RU | 53818 | 5/2006 |
| WO | WO 01/67529 | 9/2001 |
| WO | WO 2005/018082 | 2/2005 |
| WO | WO 2008/150007 | 12/2008 |
| WO | WO 2010/023669 | 3/2010 |
| WO | WO 2011/024173 | 3/2011 |

OTHER PUBLICATIONS

Communication Pursuant to Article 94(3) EPC Dated May 24, 2013 From the European Patent Office Re. Application No. 10771217.6.
Examination Report Dated Mar. 6, 2013 From the Instituto Mexicano de la Propiedad Industrial Re. Application No. MX/a/2011/002281 and Its Summary in English.
Notice of Acceptance Dated Jun. 26, 2013 From the Instituto Mexicano de la Propiedad Industrial Re. Application No. MX/a/2011/002281.
Office Action and Search Report Dated Jul. 1, 2013 From the State Intellectual Property Office of the People's Republic of China Re. Application No. 200980142795.7 and Its 'Translation Into English.

Office Action Dated Apr. 14, 2013 From the Israel Patent Office Re. Application No. 211485 and Its Translation Into English.
Office Action Dated May 30, 2013 From the Israel Patent Office Re. Application No. 218353 and Its Translation Into English.
Restriction Official Action Dated Nov. 18, 2013 From the US Patent and Trademark Office Re. U.S. Appl. No. 13/061,160.
Examination Report Dated Nov. 12, 2013 From the Instituto Mexicano de la Propiedad Industrial Re. Application No. MX/a/2012/002417 and Its Translation Into English.
Notice of Reason for Rejection Dated Feb. 4, 2014 From the Japanese Patent Office Re. Application No. 2011-524519.
Notification of Office Action Dated Feb. 20, 2014 From the State Intellectual Property Office of the People's Republic of China Re. Application No. 201080038164.3 and Its Translation Into English.
Office Action Dated Apr. 14, 2014 From the State Intellectual Property Office of the People's Republic of China Re. Application No. 200980142795.7 and Its Translation into English.
Office Action Dated Dec. 26, 2013 From the State Intellectual Property Office of the People's Republic of China Re. Application No. 200980142795.7 and Its Translation Into English.
Official Action Dated Jun. 3, 2014 From the US Patent and Trademark Office Re. U.S. Appl. No. 13/061,160.
Official Action Dated Jan. 29, 2014 From the US Patent and Trademark Office Re. U.S. Appl. No. 13/061,160.
Request for Examination Dated Nov. 13, 2013 From the Federal Service for Intellectual Property, Rospatent, Federal State Budgetary Institution, Federal Institute of Industrial Property of the Russian Federation Re. Application No. 2011142298 and Its Summary in English.
Search Report Dated Feb. 20, 2014 From the State Intellectual Property Office of the People's Republic of China Re. Application No. 201080038164.3 and Its Translation Into English.
Corrected International Preliminary Report on Patentability Dated Mar. 14, 2012 From the International Preliminary Examining Authority Re. Application No. PCT/IL2010/000704.
International Preliminary Report on Patentability Dated Jun. 14, 2011 From the International Examining Authority Re. Application No. PCT/IL2009/000831.
International Preliminary Report on Patentability Dated Feb. 24, 2012 From the International Preliminary Examining Authority Re. Application No. PCT/IL2010/000704.
International Search Report and the Written Opinion Dated Sep. 16, 2011 From the International Searching Authority Re. Application No. PCT/IL2010/000704.
International Search Report and the Written Opinion Dated Oct. 18, 2010 From the International Searching Authority Re. Application No. PCT/IL2009/000931.
Invitation Pursuant to Rules 66.2c), 66.3 and 66.4 of the PCT Dated Jun. 2, 2011 From the International Preliminary Examining Authority Re. Application No. PCT/IL2009/000831.
Office Action Dated Aug. 23, 2011 From the State Intellectual Property Office of the People's Republic of China Re. Application No. 200980142795.7 and Its Translation into English.
Patents Act 1977: Search Report Under Section 17(5) Dated Aug. 28, 2009 From the Intellectual Property Office of the United Kingdom Re.: Application No. GB0816418.8.
Request for Examination Dated Jul. 19, 2011 From the ROSPATENT, Federal Government Institution, 'Federal Institute of Industrial Property of the Federal Service for Intellectual Property, Patents and Trademarks' of the Russian Federation Re. Application No. 2011111135 and Its Summary Into English.
Response Dated Sep. 8, 2011 to Request for Examination of Jul. 19, 2011 From the ROSPATENT, Federal Government Institution, 'Federal Institute of Industrial Property of the Federal Service for Intellectual Property, Patents and Trademarks' of the Russian Federation Re. Application No. 2011111135.
Response Dated Dec. 15, 2011 to Written Opinion of Sep. 16, 2011 From the International Searching Authority Re. Application No. PCT/IL2010/000704.
Response Dated Jan. 17, 2011 to Written Opinion of Oct. 18, 2010 From the International Searching Authority Re. Application No. PCT/IL2009/000931.

(56) References Cited

OTHER PUBLICATIONS

Second Written Opinion Dated Feb. 22, 2011 From the International Preliminary Examining Authority Re. Application No. PCT/IL2009/000831.
Supplementary Response Dated May 30, 2011 to Second Written Opinion of Feb. 22, 2011 From the International Preliminary Examining Authority Re. Application No. PCT/IL2009/000831.
Angrist "Perpetual Motion Machines", Scientific American, XP002036811, 218(1): 114-122, Jan. 1, 1968.
Dudley "Maxwell's Pressure Demon and the Second Law of Thermodynamics", Internet Citation, XP008128581, p. 1-10, Jan. 1, 2006.
Notice of Reason for Rejection Dated Sep. 30, 2014 From the Japanese Patent Office Re. Application No. 2012-526182 and Its Translation Into English.
Notification of Office Action Dated Oct. 30, 2014 From the State Intellectual Property Office of the People's Republic of China Re. Application No. 201080038164.3 and Its Translation Into English.
Office Action Dated Oct. 7, 2014 From the Israel Patent Office Re. Application No. 218353 and Its Translation Into English.
Office Action Dated Sep. 19, 2014 From the State Intellectual Property Office of the People's Republic of China Re. Application No. 200980142795.7 and Its Translation into English.
Notice of Reason for Rejection Dated Feb. 3, 2015 From the Japanese Patent Office Re. Application No. 2011-524519 and Its Translation Into English.
Office Action Dated Apr. 7, 2015 From the State Intellectual Property Office of the People's Republic of China Re. Application No. 200980142795.7 and Its Translation Into English.
Decision of Rejection Dated Jul. 3, 2015 From the Japanese Patent Office Re. Application No. 2012-526182.
Official Action Dated Jul. 6, 2015 From the US Patent and Trademark Office Re. U.S. Appl. No. 13/061,160.
Patent Examination Report Dated Jun. 12, 2015 From the Australian Government, IP Australia Re. Application No. 2010288080.
Office Action Dated Sep. 6, 2015 From the State Intellectual Property Office of the People's Republic of China Re. Application No. 200980142795.7 and Its Translation Into English.
Decision of Rejection Dated Aug. 28, 2015 From the Japanese Patent Office Re. Application No. 2011-524519 and Its Translation Into English.
Notice of Preliminary Rejection Dated Mar. 9, 2016 From the Korean Intellectual Property Office Re. Application No. 2011-7005453 and Its Translation Into English.
Official Action Dated Dec. 30, 2015 From the US Patent and Trademark Office Re. U.S. Appl. No. 13/061,160.
Requisition by the Examiner Dated Feb. 17, 2016 From the Canadian Intellectual Property Office Re. Application No. 2,732,712.
Notice of Preliminary Rejection Dated Sep. 29, 2016 From the Korean Intellectual Property Office Re. Application No. 2011-7005453 and Its Translation Into English.

\* cited by examiner

METHOD AND DEVICE FOR GENERATING ELECTRICITY AND METHOD OF FABRICATION THEREOF

RELATED APPLICATIONS

This application is a National Phase of PCT Patent Application No. PCT/IL2010/000704 having International filing date of Aug. 26, 2010, which claims the benefit of priority of U.S. Provisional Patent Application No. 61/310,188, filed on Mar. 3, 2010, and 61/310,313, filed on Mar. 4, 2010. PCT Patent Application No. PCT/IL2010/000704 is also a Continuation-In-Part of PCT/IL2009/000831 having International filing date of Aug. 27, 2009, which claims the benefit of priority of U.S. Provisional Patent Application No. 61/136,317 filed on Aug. 28, 2008 and UK Patent Application No. 0816418.8 filed on Sep. 8, 2008.

FIELD AND BACKGROUND OF THE INVENTION

The present invention, in some embodiments thereof, relates to energy conversion and, more particularly, but not exclusively, to a device and method for generating electricity. Some embodiments relate to a method suitable for fabricating a structure which can be incorporated in a device for generating electricity.

Energy conversion systems receive energy in one form and convert it to energy in another form. In many cases, mechanical energy, resulting for instance from heat engines, hydro, or wind power, drives the rotation of turbines resulting in the generation of electricity. In other cases, no moving parts are involved in the conversion process, such as in solid-state electricity generators. Closed electrochemical cells, commonly known as batteries, are but one example of such electricity generators, but are generally used for storage rather than meaningful electricity production, since their production is limited by the amount of chemical reactant contained in the battery. Open electrochemical cells, such as fuel cells which can be replenished (for example with hydrogen as the core reagent in the oxidation reaction producing the chemical energy to be converted) are more likely to be used for the general production of electricity. Both the closed and open devices share the principle that an irreversible chemical reaction is taking place between the electrodes and the electrolyte, or within the electrolyte, generally resulting in chemical degradation of parts of the devices, such as corrosion of the electrodes, or consumption of the fuel.

Additional energy conversion systems include thermoelectric, thermionic and thermotunnelling devices, where thermal energy is converted to electricity. These devices generally rely on a high temperature gradient between a cold and a hot surface and/or on high operating temperatures. In most cases, the surfaces are in vacuum to ensure that the thermal gradient driving the electricity production is maintained. However, in some such devices, gases such as cesium vapor can be used to modify the properties of the surfaces and to prevent the formation of space charge near the electrodes.

SUMMARY OF THE INVENTION

Some embodiments of the present invention are concerned with a device for generating electricity that derives energy from thermal motion of gas molecules.

In some embodiments, the device comprises a gas medium and a multiplicity of particles distributed to form a particulated structure having inter-particles voids therein. The gas medium includes gas molecules that are in thermal motion in the voids. Some of the voids, together with particles flanking these voids, act as active cells as follows. For a given such active cell, the gas molecules become charged at a surface of a particle flanking one side of the void and by thermal motion move across the void to a surface of another particle flanking the opposing side of the void and transfer net charge to the other particle.

The external sides of the particulated structure may serve as surface electrodes. Optionally, at least one surface electrode is applied to the particulated structure.

The gas medium can be introduced into the particulated structure before use. Alternatively, the particulated structure can be provided with the gas molecules in the inter-particle voids.

The ability of a solid surface to transfer charge to the gas molecules or to receive charge from the gas molecules, is referred to herein as the "charge transferability" of the surface in the presence of the gas. The term "charge transferability" is further discussed below.

The charge transferability of the two opposing surfaces of an active cell within the device differs. The present inventors have discovered several techniques to ensure that the two surfaces have different abilities to transfer charges. Preferably, the particles are surface-modified in situ such that, for a given active cell, the particle surfaces generally facing one another at opposite sides of the inter-particle void have different charge transferability.

Several in situ modification techniques are contemplated. Generally, the modification is induced by an electric field which is directed generally along the thickness direction of the structure and/or perpendicularly to the surface electrodes. The electric field serves as a symmetry breaker which provides for the difference in charge transferability between opposing particle surfaces. The electric field can be generated using an electrically powered voltage source. Alternatively, the electric field can be generated by interposing the particulated structure between two electrodes having different work functions, wherein the required electric field is generated by virtue of this difference in the work function. The electric field can either modify one of the two opposing surfaces, or it can modify both opposing surfaces in an asymmetrical manner.

The surface modification can be in the presence of a liquid or a gas, and it can be performed at elevated or non-elevated temperatures as further detailed hereinbelow. Representative examples of surface modification processes which are contemplated include, without limitation, chemical modification, adsorption, plating, coating and surface polarization or orientation. These modifications may be effected by means of electrical, thermal, electrochemical, or electrothermal processes, and any combination thereof.

According to an aspect of some embodiments of the present invention, there is provided a method of fabricating a particulated structure for use in an electrical generator utilizing a compatible gas to transfer charge between particles. The method comprises: forming a structure from a multiplicity of particles, wherein the structure contains voids between first and second opposing surfaces of at least some of the particles; and modifying at least a portion of the opposing surfaces such that, in conjunction with the compatible gas, the charge transferability of the first opposing surfaces differs from the charge transferability of the second opposing surfaces.

According to some embodiments of the invention, forming is performed between a first surface electrode and a second surface electrode while the particles are in dry form.

According to some embodiments of the invention, forming is performed within a supporting assembly.

According to some embodiments of the invention, forming is performed while the particles are in a slurry.

According to some embodiments of the invention, the forming is effected by coating, casting, molding, application of mechanical pressure to the slurry, rod coating, spray coating, spin coating, slurry extrusion, and combinations thereof.

According to some embodiments of the invention, the method further comprises applying to the structure at least one surface electrode.

According to some embodiments of the invention, the modification comprises an electrochemical modification performed in a liquid.

According to some embodiments of the invention, the liquid comprises a polar solvent. According to some embodiments of the invention, the liquid comprises a nonpolar solvent.

According to some embodiments of the invention, the liquid comprises a solvent selected from the group comprising benzene, chloroform, dimethyl sulfoxide, ethanol, hexane, dodecane, isoparafinic hydrocarbon, isopropanol, methanol, water, and combinations thereof.

According to some embodiments of the invention, the liquid further comprises one or more electroactive species selected from the group comprising salts, dyes, oxides, monomers and surfactants.

According to some embodiments of the invention, the electroactive species are selected from the group comprising cesium acetate, manganese sulfate, nickel chloride, nickel nitrate, rare earth neodecanoate and versatate salts, cerium 2-ethylhexanoate, manganese propionate and neodecanoate, neodymium 2-ethylhexanoate, cobalt borate neodecanate complexes; Basonyl® blau 636, Flexo Black, Methyl Violet 2B; titanium isopropoxide, magnesium methoxide, nickel oxide; pyrrole; barium-(bis(tridecyl) sulfosuccinate)$_2$ and dioctyl sodium sulfosuccinate; and combinations thereof.

According to some embodiments of the invention, the modification comprises an electrochemical modification performed in a gaseous environment.

According to some embodiments of the invention, the gaseous environment is one or more gases selected from the group comprising reducing, oxidizing and halogenizing gases.

According to some embodiments of the invention, the gas is selected from the group comprising nitrogen dioxide, nitrogen trifluoride and hydrogen chloride.

According to some embodiments of the invention, the modification comprises electrothermal modification.

According to some embodiments of the invention, the modification is performed in the presence of an electric field generally perpendicular to the opposing surfaces, the electric field being generated by an external power source.

According to some embodiments of the invention, the method comprises applying to the structure surface electrodes having different work function, wherein the modification of the surfaces of the particles is performed at least in part by an electric field generated by virtue of the difference in work function.

According to some embodiments of the invention, the method comprises drying or evacuating a fluid from at least a portion of the structure prior to the modification.

According to some embodiments of the invention, the method further comprises drying or evacuating a fluid from at least a portion of the structure subsequent to the modification.

According to some embodiments of the invention, the structure is formed by applying a slurry of the particles to a substrate and is then removed from the substrate subsequent to the drying or evacuating.

According to an aspect of some embodiments of the present invention, there is provided a particulated structure manufactured by the method as delineated above or further detailed or exemplified below.

According to an aspect of some embodiments of the present invention, there is provided a particulated structure for use in an electrical generator device utilizing a compatible gas to transfer charge between particles for converting thermal energy to electricity. The particulated structure comprises: a multiplicity of particles and voids, the voids being between first and second opposing surfaces of at least some of the particles; wherein the charge transferability of at least a portion of the first opposing surfaces, in conjunction with the gas, differs from the charge transferability of at least a portion of the second opposing surfaces, such that the respective first active surfaces are operative to transfer an electric charge to gas molecules interacting therewith and the respective second active surfaces are operative to receive an electric charge from gas molecules interacting therewith, resulting in a charge transfer between opposing particles and a net charge transfer from one side of the particulated structure to an opposite side thereof.

According to an aspect of some embodiments of the present invention, there is provided an electrical generator device for converting thermal energy to electricity. The device comprises the particulated structure as delineated above or described or exemplified below, and a gas medium having gas molecules in at least a portion of the voids.

According to some embodiments of the invention, for each particle of a portion of the particles, the charge transferability is generally the same for all surfaces of the particle.

According to some embodiments of the invention, the first opposing surface and the second opposing surface have substantially identical chemical composition.

According to some embodiments of the invention, the particulated structure or device further comprises a first electrode and a second electrode disposed such that the particulated structure is between the electrodes, wherein the first electrode and the second electrode have operative surfaces of the same material.

According to some embodiments of the invention, particulated structure or device further comprises a first electrode and a second electrode disposed such that the particulated structure is between the electrodes, wherein the first electrode and the second electrode have operative surfaces of materials characterized by different work function.

According to some embodiments of the invention, for at least a portion of the particle surfaces, a concentration of types of molecules, atoms or ions is different on the first opposing surface than on the second opposing surface.

According to some embodiments of the invention, the particles form a self-supporting structure.

According to some embodiments of the invention, the particles are in a powder form and are contained in a supporting structure.

According to some embodiments of the invention, there is a net charge transfer from one side of the particulated structure to an opposite side thereof in the absence of externally applied voltage.

According to an aspect of some embodiments of the present invention, there is provided a method of powering an electrically activated system. The method comprises connecting the electrically activated system to the electrical generator device.

According to some embodiments of the invention, the particles are non-porous. According to some embodiments of the invention, the particles are porous. According to some embodiments of the invention, the particles are swellable. According to some embodiments of the invention, the particles are non-swellable. According to some embodiments of the invention, the particles are coated. According to some embodiments of the invention, the particles are uncoated.

According to some embodiments of the invention, the particles have an average thickness of less than 1 µm.

According to some embodiments of the invention, the longest dimension of the particles is less than 1 millimeter.

According to some embodiments of the invention, the voids between the particles are maintained by spacers.

According to some embodiments of the invention, the voids between the particles are maintained by outwardly protruding roughness features.

According to some embodiments of the invention, the particles are generally platelet-like.

According to some embodiments of the invention, the particles are distributed in a generally uniform orientation.

According to some embodiments of the invention, the particles are made of a material selected from the group comprising metals, semi-metals, alloys, intrinsic or doped, inorganic or organic, semi-conductors, dielectric materials, intrinsic or doped polymers, conducting polymers, layered materials, ceramics, oxides, metal oxides, salts, crown ethers, organic molecules, quaternary ammonium compounds, cermets, glass and silicate compounds, and any combination thereof.

According to some embodiments of the invention, the particles are made of a material selected from the group comprising glass, vermiculite, exfoliated vermiculite, expanded vermiculite, perlite, phlogopite mica, graphene, graphite, graphite oxide, reduced graphite oxide, aluminum and silica coated aluminum.

According to some embodiments of the invention, the structure is enclosed in an encapsulation configured to contain a compatible gas medium.

According to some embodiments of the invention, the gas medium is selected from the group comprising air, argon, chlorine, diethylamine, helium, hydrogen chloride, krypton, methane, neon, nitrogen, nitrogen dioxide, nitrogen trifluoride, octafluoropropane, sulfur dioxide, sulfur hexafluoride, sulfuryl fluoride, tetrafluoromethane, water vapor, xenon, and combinations thereof.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In addition, the materials, methods, and examples are illustrative only and are not intended to be limiting.

BRIEF DESCRIPTION OF THE DRAWINGS

Some embodiments of the invention are herein described, by way of example only, with reference to the accompanying drawings and images. With specific reference now to the drawings in detail, it is stressed that the particulars shown are by way of example and for purposes of illustrative discussion of the disclosed embodiments of the invention. In this regard, the description taken with the drawings makes apparent to those skilled in the art how embodiments of the invention may be practiced.

In the drawings.

DESCRIPTION OF SPECIFIC EMBODIMENTS

Figure 1:
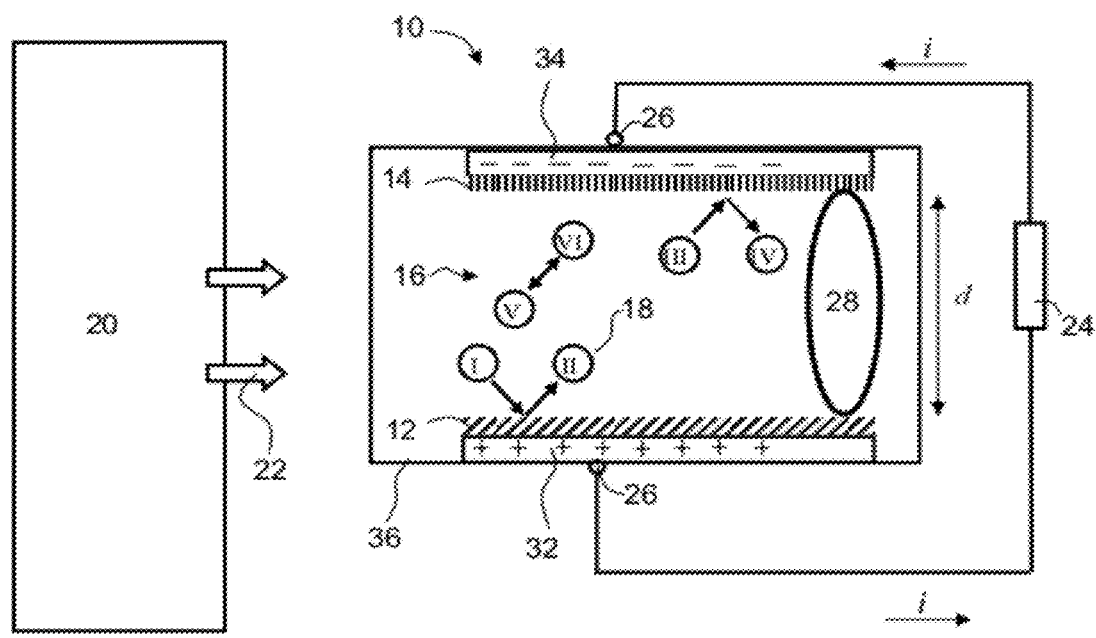
FIG. 1 is a schematic illustration of a cell for generating electricity, according to various exemplary embodiments of the present invention.

The present invention, in some embodiments thereof, relates to energy conversion and, more particularly, but not exclusively, to a particulated structure, a device and a method for generating electricity. Some embodiments relate to a method suitable for fabricating a particulated structure which can be incorporated in a device for generating electricity.

It is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways. Furthermore, while the inventors believe that the theoretical explanation given for the operation of the various embodiments is correct, the apparatus and method as described and claimed are not dependent on the described theory. The various embodiments are not necessarily mutually exclusive, as some embodiments can be combined with one or more other embodiments to form new embodiments. For clarity, certain elements in some of the drawings are illustrated not-to-scale. The drawings are not to be considered as blueprint specifications.

Referring now to the drawings, FIG. 1 illustrates a cell device 10 for generating electricity, according to various exemplary embodiments of the present invention. Cell device 10 can be incorporated in a particulated structure (see FIGS. 2A-E). Cell device 10 comprises a pair of spaced apart surfaces 12 and 14, and can accommodate a compatible gas medium 16 between surfaces 12 and 14. The space between the surfaces is referred to herein as a void or gap. Surfaces 12 and 14 are part of or are supported by substrates 32 and 34, respectively. Gas molecules 18 (also indicated as Roman numerals I to VI) transport charge from first surface 12 to second surface 14. The motion of the gas molecules is caused by their thermal energy and is determined by the temperature of the gas. The temperature of the gas is maintained by thermal energy 22, supplied by a heat reservoir 20 as further detailed hereinunder.

In the schematic illustration of FIG. 1, during the interaction with surface 12, an electrically neutral or charged gas molecule I receives at least one negative charge from surface 12 resulting in a molecule II which leaves surface 12 following interaction therewith. When an electrically charged or neutral gas molecule III arrives at surface 14 and interacts therewith, surface 14 receives at least one negative charge from the molecule resulting in molecule IV which leaves surface 14 following interaction therewith. Outgoing molecule II is essentially the same as incoming molecule I except for its charge. Similarly, outgoing molecule IV is essentially the same as incoming molecule III except for its charge. When gas molecule II crosses the gap between surfaces 12 and 14 and transfers charge between the two surfaces, then II and III represent the same gas molecule, including the charge. When molecule IV crosses the gap and transfers charge between the two surfaces, then IV and I may represent the same gas molecule, including the charge.

When any two neutral or charged gas molecules V and VI collide in the gap between the two surfaces, the molecules can transfer electrical charge between them. Molecules V and VI can interact with surface 12, in the same manner as gas molecule I in the previously described process, or with surface 14, in the same manner as gas molecule III. Molecules leaving the surfaces might also collide with additional gas molecules within the gap. For instance, molecule II leaving surface 12 might indirectly cross the gap to surface 14, colliding in-between with an intermediate gas molecule, as in the process described for molecules V and VI, which in turn transfer the negative charge to surface 14.

Thus, the first surface serves as an electrical charge donor surface and the second surface serve as an electrical charge receiver surface. The situation may also be reversed, with the first surface serving as an electrical charge receiver and the second surface serving as an electrical charge donor surface.

As used herein, the term "compatible gas" refers to a gaseous medium having molecules which facilitate transfer of charge between two surfaces by gaining or losing charge during an interaction of these molecules with the surfaces.

Hereafter "gas molecule" includes both neutral gas molecules, and gas ions having negative or positive charge.

Gas molecules may transfer net negative charge from surface 12 to surface 14 either directly or indirectly via interaction between gas molecules in the gap between the two surfaces. In this charge transfer process, surface 12 becomes positively charged and surface 14 becomes negatively charged, thus establishing a potential difference between the surfaces. This potential difference can be exploited by connecting a load 24 (e.g., via electrical contacts 26) to the surfaces. Electrical current i flows from surface 12 to surface 14 through the load. Thus, isolated cell 10 can produce an electrical current and a plurality of such cells can be incorporated in a structure and ultimately a power source device which supplies electrical current to a circuit, appliance or other load.

The interaction between the molecules and the surfaces can be momentary, e.g., via an elastic or inelastic collision process, or prolonged, e.g., via an adsorption-desorption process, according to the teachings International Publication No. WO 2010/023669 A2, the contents of which are hereby incorporated by reference.

As used herein, "adsorption-desorption process" or "adsorption-desorption charge transfer process" means a process in which the molecule is firstly adsorbed by the surface for a sufficiently long time such that the molecule loses a significant amount of its kinetic energy and is subsequently desorbed from the surface, wherein the net charge of the molecule before the adsorption is different from the net charge of the molecule after the desorption.

In some adsorption-desorption processes, the molecule and the surface are in thermal equilibrium during the time interval at which the molecule is adsorbed. During the time of adsorption, the molecule can be considered as part of the surface. Thus, during this time interval, the electronic wave function of the surface includes the electronic wave functions of all molecules at the surface, including those which were adsorbed by the surface. Typically, but not necessarily, the adsorbed molecules are at the outermost molecular layer of the surface.

A "momentary process" between a molecule and a surface refers to a process in which the gas molecule is sufficiently close to the surface to allow charge transfer between the surface and the molecule, wherein the time interval of the process is significantly shorter than the time required for reaching thermal equilibrium between the molecule and the surface.

One type of momentary process is a collision. A gas molecule and a solid surface are said to be "in collision" if there is at least a partial spatial overlap between the electronic wave function of the molecule and the electronic wave function of the surface. Typically, a gas molecule and a solid surface are considered to be in collision when the distance between the center of the gas molecule and the center of the outermost atom of the solid surface is less than 10 Angstroms, or alternatively less than 5 Angstroms (depending upon the particular surface material and gas used to implement the cell).

A collision is said to be "elastic" when the kinetic energy before the collision equals the kinetic energy after the collision, and "inelastic" when the kinetic energy before the collision is higher than the kinetic energy after the collision. The collision between the molecules and the surface can be elastic or inelastic.

In any of the above scenarios, the ordinarily skilled person will appreciate that the process makes surface 12 positively charged and surface 14 negatively charged, as illustrated in FIG. 1. Thus, in accordance with some preferred embodiments of the present invention, the gas molecules mediate negative charge transfer from surface 12 to surface 14 and/or positive charge transfer from surface 14 to surface 12.

In various exemplary embodiments of the invention, charge transfer from surface 12 to the molecules and from the molecules to surface 14 are facilitated by transferring electrons. Thus, in these embodiments the molecules receive electrons from surface 12 and transfer electrons to surface 14.

In various exemplary embodiments of the invention, the kinetic energy of the gas molecules is due solely to the temperature of the gas. In these embodiments, no additional mechanism, (such as an external voltage source) is required for maintaining the motion of the gas molecules, which is entirely due to thermal energy. Moreover, though the gas interacts with the operating surfaces, unlike fuel cells, such interactions do not involve irreversible chemical reactions and the gas is not consumed in the process.

When cell device 10 reaches a steady state, the amount of charge passing through the load is approximately the same as the amount of charge transferred to the respective surface by the gas molecules, and, for a given load and temperature, the potential difference between the surfaces is approximately constant. Small temperature differences between the surfaces, even if present, do not play a significant part in the charge transfer mechanism described above. The presence of temperature differences, however, is not necessarily excluded according to all embodiments.

The presence of charge on surfaces 12 and 14 creates an electrical potential which poses a barrier for the molecules transporting charge from one surface to the other. This manifests itself as attractive forces applied by surface 12 or 14 on oppositely charged molecules and as repulsive forces on like-charged molecules, as they rebound off their respective surfaces.

In thermally isolated conditions, the transfer of charges by the molecules rebounding between the surfaces (and, in so doing, overcoming the potential barrier) would continuously reduce the average kinetic energy of the gas molecules, resulting in a cooling of the gas medium to a temperature at which the kinetic energy of the gas molecules could no longer overcome the potential barrier. However, since device 10 is in thermal communication with thermal reservoir 20, thermal energy 22 is continuously supplied to the gas medium, thus replenishing the kinetic energy of the gas molecules. Thermal reservoir 20 can, for example, be the environment in which cell device 10 operates (for example the natural environment), and the thermal energy can be supplied to cell device 10 by conduction, convection and/or radiation and in turn be transferred to the gas medium.

Once the potential difference between the surfaces reaches a steady state, charge transfer may be suppressed due to the electric field that has built up following the accumulation of charges on the surfaces. When cell device 10 is connected to load 24, accumulated charges are conducted from the surfaces through the load, thereby allowing the process of charge transfer to continue. As a result of the electrical current flowing through the load, heat or other useful work is produced at the load. Thus, at least part of the thermal energy transferred from reservoir 20 to the gas medium 16 is used by load 24 to perform useful work.

The direction which a molecule leaves a surface depends on many parameters, such as the velocity (i.e., speed and direction) of the molecule arriving at the surface and the type of interaction between the molecule and the surface (e.g., number, location and orientation of surface atoms participating in the collision). Once the gas molecule leaves the surface in a particular direction, it travels a certain distance until it collides with a surface or another gas molecule and changes direction. The mean distance between two successive collisions of a gas molecule is known as the mean free path, and is denoted by the Greek letter $\lambda$. The value of $\lambda$, depends on the diameter of the molecule, the gas pressure and the temperature. In various exemplary embodiments of the invention, for any given pressure and composition of gas, the gap d between the surfaces is sufficiently small so as to limit the number of intermolecular collisions. This configuration increases the probability of a sufficiently energetic molecule successfully traversing the gap without colliding with other gas molecules.

Aside from reducing the number of intermolecular collisions, a sufficiently small gap also lowers the image charge potential barrier produced by the interaction between the charged molecule and the surfaces, as described in International Publication No. WO 2010/023669 A2, the contents of which are hereby incorporated by reference.

Preferably, the gap d between surfaces 12 and 14 is of the order of the mean free path of the gas molecules at the operating temperature and pressure of device 10. For example, d can be less than 10 times the mean free path, more preferably less than 5 times the mean free path, more preferably less than 2 times the mean free path. For example, d may be approximately the mean free path or less. A typical value for the gap d between surfaces 12 and 14 is less than or about 1000 nm, more preferably less than about 100 nm, more preferably less than about 10 nm, more preferably less than or about 2 nm.

The separation between the surfaces 12 and 14 can be maintained in more than one way. In some embodiments of the present invention, one or more non-conductive spacers 28 are interposed between the surfaces to maintain separation. The spacer is "non-conductive" in the sense that it prevents substantial flow of charges from one surface to the generally facing surface, thus enabling an electrical potential to exist across the gap. The size of spacer 28 is selected in accordance with the size d of the gap. Preferably, the dimension of the spacer is the desired spacing. The spacer can, for example, be a nanostructure of any shape. The cross-sectional area of the spacers in a plane essentially parallel to the surfaces is preferably on average substantially smaller or smaller than (e.g., less than 10% or less than 20% of) the area of surfaces 12 and 14, so as to allow sufficient effective exposure of the surfaces to one another.

In some embodiments of the present invention, the separation between the surfaces is maintained by means of the outwardly protruding roughness features (see FIGS. 2B, 2C and 2E for illustration) of such surfaces. These embodiments are particularly useful when at least one of surfaces 12 and 14 is made of a material which is poorly electrically conductive.

The gas mediated charge transfer between the surfaces according to some embodiments of the present invention occurs at temperatures which are substantially below 400° C., or below 200° C., or below 100° C., or below 50° C. Yet, in some embodiments, the gas mediated charge transfer occurs also at temperatures higher than 400° C. Operation at temperatures below 0° C. is not excluded from the scope of the present invention. Although no extreme temperature conditions are necessary for the operation of the cell or device of the present embodiments, the proportion of high speed gas molecules able to be efficient charge transporters increases with temperature.

In various exemplary embodiments of the invention, both surfaces are at a temperature which is less than 30° C. and above 15° C., for example, at room temperature (e.g., about 25° C.) or in its vicinity. In some embodiments of the invention both surfaces are at a temperature which is less than 15° C. and above 0° C. and in some embodiments of the invention both surfaces are at a temperature which is less than 0° C.

In various exemplary embodiments of the invention the two surfaces are within 50° C., or within 10° C., or within 1° C. of each other.

Since the potential difference between the surfaces is generated by thermal motion of molecules serving as charge transporters from one surface to the other, there is no need to maintain a temperature gradient between the surfaces. Thus, the two surfaces can be at substantially the same temperature. This is unlike traditional thermoelectric converters in which an emitter electrode is kept at an elevated temperature relative to a collector electrode and the flow of electrons through the electrical load is sustained by means of the Seebeck effect. In such traditional thermoelectric converters, there are no gas molecules which serve as charge transporters. Rather, the thermal electrons flow directly from the hot emitter electrode to the cold collector electrode.

Figure 2A:
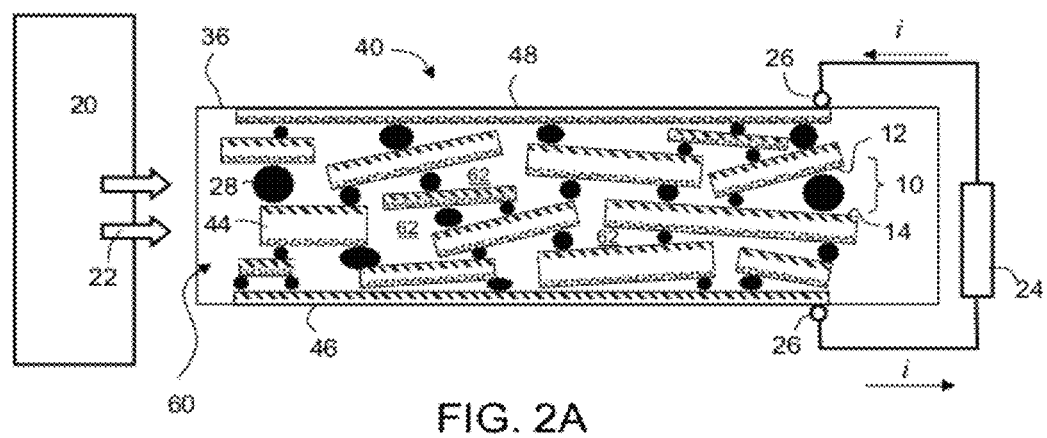
FIGS. 2A-2E are schematic illustrations of a device which comprises a particulated structure for directly converting thermal energy to electricity, according to various exemplary embodiments of the present invention.
Figure 2B:
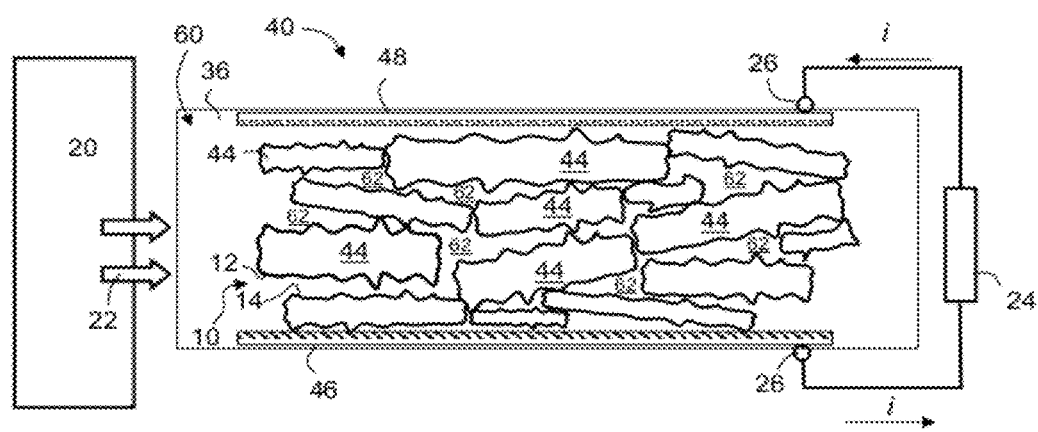
Figure 2C:
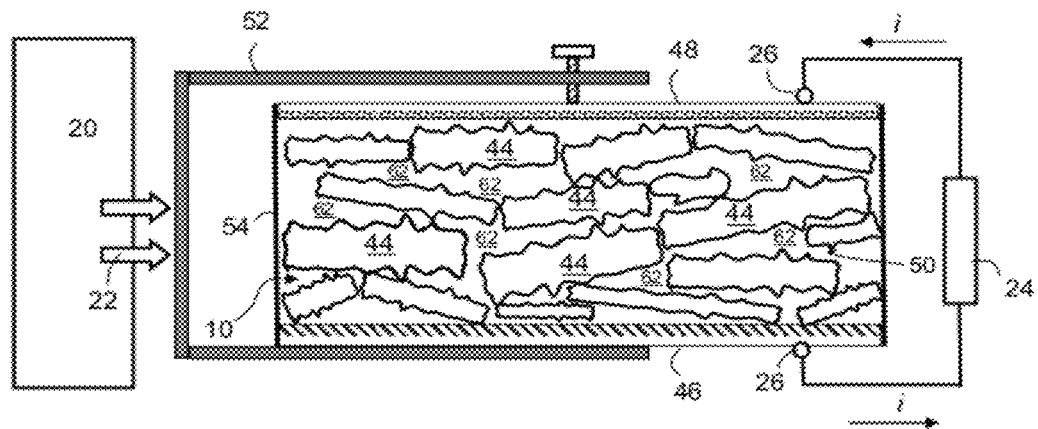
Figure 2D:
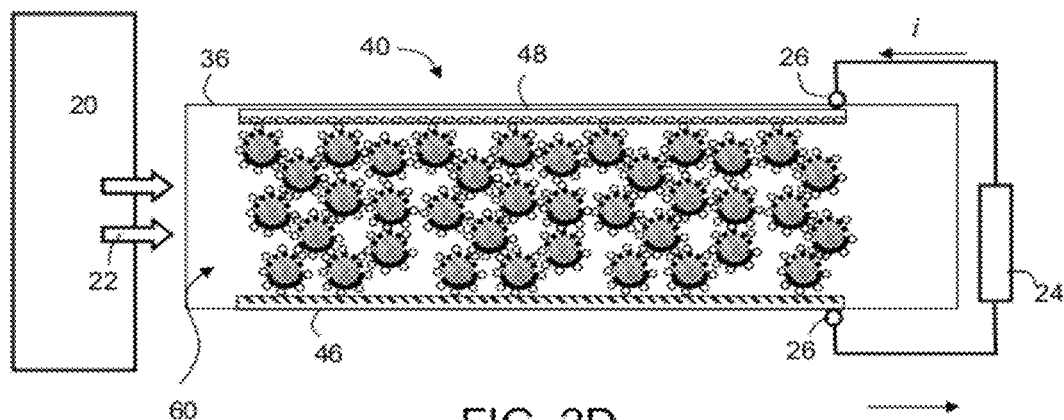
Figure 2E:
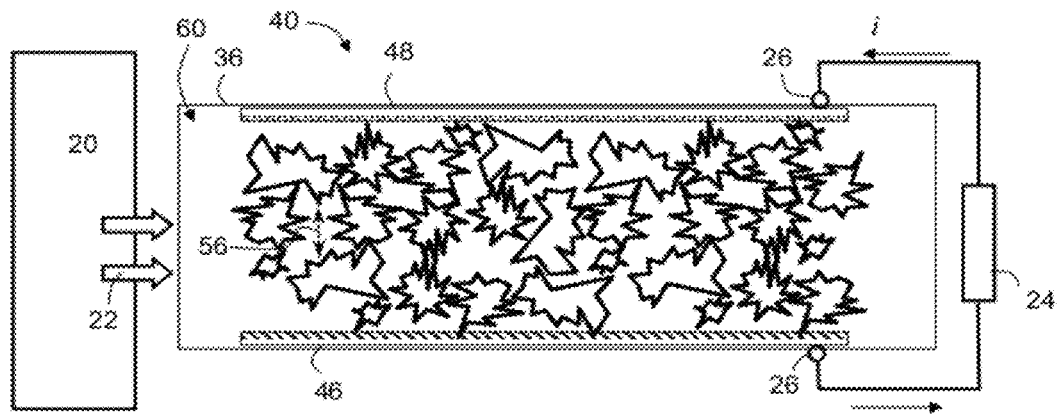

Surfaces 12 and 14 can have any shape. Typically, as illustrated in FIGS. 1 and 2A-2C, the surfaces may be generally planar, but non-planar configurations are also contemplated (as illustrated in FIGS. 2D-2E). Surfaces 12 and 14 may be made of different materials or may be made of the same material with the surfaces being modified, so as to allow the gas molecule, via the gas mediated charge transfer effect, to acquire negative charge (e.g., by gaining an electron) while contacting surface 12 and/or to acquire positive charge (e.g., by losing an electron) while contacting surface 14.

The gas mediated charge transfer of the present embodiments is attributed to the charge transferability of the gas and/or surfaces.

"Charge transferability," as used herein in connection with a surface means the ability of a surface to transfer charge to the gas molecules or to receive charge from the gas molecules, and as used herein in connection with a gas molecule means the ability of a gas molecule to transfer charge to the surface or to receive charge from the surface.

Charge transferability describes the interaction between the particular surface and the particular gas molecules and reflects the likelihood of charge transfer, the degree of charge transfer as well as the polarity of charge transfer, caused by the interaction. In this document, a surface is said to have positive charge transferability when the gas molecule positively charges the surface, and negative charge transferability when the gas molecule negatively charges the surface. For example, a surface with positive charge transferability is a surface which loses an electron to a gas molecule, either neutralizing the gas molecule or forming a molecule-electron unit. A surface with negative charge transferability is a surface which receives an electron from a neutral gas molecule or a molecule-electron unit.

Charge transferability depends on the properties of both the surface and the gas participating in the charge transfer. Charge transferability may also depend on temperature and/or pressure of the gas, since temperature and pressure affect the kinetic energy of the gas molecules as well as many material properties such as energy gap, thermal expansion, conductivity, work function and the like. Quantitatively, charge transferability, denoted $\Theta$, can be expressed in energy units. For example, a positive charge transferability can be defined as $\Theta = E^S_{min}$, where $E^S_{min}$ is the minimal energy required to remove an electron from the surface and to attach it to a neutral gas molecule, and a negative charge transferability can be defined as $\Theta = -E^M_{min}$, where $E^M_{min}$ is the minimal energy required to remove an electron from a neutral gas molecule and transfer it to the surface.

It is appreciated that when $\Theta$ is expressed in energy units as defined above, its value is, in some cases, not necessarily identical to the energy which is required for transferring the charge to a neutral molecule, since charge transfer can also occur when the molecules and/or surfaces are already charged. Thus, the energy required to remove an electron from the gas molecule and bind it to the surface can be higher or lower than $E^M_{min}$, and the energy which is required to remove an electron from surface and attach it to the gas molecule can be higher or lower than $E^S_{min}$, as will now be explained in more details.

When a gas molecule is positively charged, there is an attractive Coulombic force between the molecule and an electron. Thus, the work done in removing an electron from the surface and attaching it to the positively charged molecule can be lower than $E^S_{min}$, since the molecule favors such attachments. On the other hand, the work done in removing an electron from the positively charged molecule and transferring it to the surface can be higher than $E^M_{min}$, since positively charged molecules do not favor detachment of electrons therefrom.

The situation is reversed when a gas molecule is negatively charged. The work done in removing an electron from the negatively charged molecule and transferring it to the surface can be lower than $E^M_{min}$, particularly in the case in which the electron is loosely attached to the molecule. This is because the binding energy of a loosely connected electron is lower than the binding energy of a valence electron of a neutral molecule. The work done in removing an electron from the surface and attaching it to a negatively charged molecule can be higher than $E^S_{min}$, due to the repulsive Coulombic force between the electron and the molecule.

Both $E^S_{min}$ and $E^M_{min}$ depend on the nature of the solid surface as well as the gas medium. Thus, the charge transferability describing the interaction of a given solid surface with one gas medium is not necessarily the same as the charge transferability describing the interaction of the same solid surface with another gas medium.

For some solid surfaces, the charge transferability of the surface is correlated to the work function of the surface. However, these two quantities are not the same. Whereas the work function of the surface is defined as the minimal energy which is required for freeing an electron from the surface (generally to vacuum), the charge transferability is related to the energy required to remove electrical charge and attach it to a gas molecule, and thus it depends on the properties of the gas molecule as well as those of the surface.

It is noted that a solid material having a certain work function in vacuum may behave differently in the presence of a gas medium and may display distinct contact potential differences in various gaseous environments. Throughout this specification and in the claims, the term "charge transferability" describes the behavior of a particular solid surface in the presence of a particular gas medium and not in vacuum.

In addition to the work function, the charge transferability of a surface also depends upon its dielectric constant and on the ability of the gas molecule to receive or lose charge. This ability of the gas molecule to receive or lose charges is affected by electron affinity, ionization potential, electronegativity and electropositivity of the gas medium, which thus also roughly correlate with charge transferability.

It is a well established fact that gas molecules can exchange charge with surfaces. In 1922, K. H. Kingdon and Irving Langmuir found that Cesium atoms colliding with a tungsten wire become positively charged (Proceedings of The 24$^{th}$ meeting of the American Physical Society, Cambridge, Mass., 1922, page 381).

The charge transfer between gas molecules and surfaces (hence, the charge transferability) can be characterized by various methods. One known method is surface ionization (SI), in which adsorbed molecules, in thermal equilibrium with a first electrode surface, are desorbed as ions and collected by a second electrode to generate current (E. Ya. Zandberg and N. I. Ionov, "Surface Ionization", Israel program for scientific translations, Jerusalem, 1971). A second method is hyperthermal surface ionization (HSI). In this method, molecules at high speed (i.e., having kinetic energy above the average thermal energy) get ionized while being scattered from a first surface and collected by a second surface to generate current (Albert Danon and Aviv Amirav, "Surface-Molecule electron transfer: $I_2$-Diamond scattering at 1-12 eV", Physical Review Letters, 61, 2961 (1988)). In both SI and HSI methods, a voltage is applied between the two electrodes to pull the ions from the first to the second electrode. The amplitude and direction of the current measured on the second electrode is correlated to the charge transferability between the material of the first electrode and the gas molecules being desorbed or scattered therefrom.

Another technique for assessing the charge transferability of a test material to a specific gas is described in Example 2 of International Publication No. WO 2010/023669 A2, the contents of which are hereby incorporated by reference.

Whether the charge transferability is measured directly or only a proxy of the charge transferability (e.g., work function) is measured, the values of the charge transferability or its proxy describing the interaction of surfaces 12 and 14 with the gas medium differ.

In various embodiments of the invention, the charge transferability describing the interaction of surface 12 with the gas medium is positive. Typically, but not necessarily, the charge transferability describing the interaction of surface 14 with the gas medium is negative. It is appreciated that it is sufficient for the charge transferability of surface 12 to be positive, because when a molecule having a loosely attached electron collides with or is adsorbed by surface 14, it has a non-negligible probability of transferring the electron to surface 14 even when the charge transferability of surface 14 is not negative for neutral molecules.

Appropriate charge transferability for each surface can be achieved by a judicious selection of the gas medium and the materials from which surfaces 12 and 14 are made (which may be surface modifications of substrates 32 and 34). Substrates made of suitable materials can be used without any modification. Alternatively, once a substrate is selected, the respective surface can, according to some embodiments of the present invention, be modified or coated so as to enhance or reduce the charge transferability to a desired level.

Surface modification can include alteration of the surface of the substrate, addition of material or materials to the surface of the substrate, removal of material or materials from the surface, or combination of these procedures.

Alteration of the surface of the substrate may include chemical reactions, including but not limited to oxidation or reduction, and chemical or physical adsorption processes including deposition or coating as further detailed below.

Addition of material or materials to the surface may include, without limitation, coating by one or more layers, adsorption of one or more layers of molecules or atoms and the like. In some embodiments, the material which forms the respective surface directly coats the substrate. In some embodiments, one or more undercoats are provided, interposed between the substrate and the material which forms the respective surface. When the modification includes addition of material, the underlying material of the substrate can still be part of the surface and participates in the charge transfer process.

Removal of material or materials from the surface includes, without limitation, lift off techniques, etching, and the like. Any of such surface modifications may be referred to herein as surface activation or simply activation.

Reference is now made to FIGS. 2A-2E which are schematic illustrations of a power source device 40, according to various exemplary embodiments of the present invention. Device 40 comprises a plurality of cells 10 each having a pair of surfaces 12 and 14 described above and a gap for accommodating a gas medium (see 16 in FIG. 1A for illustration) between the surfaces. Via the gas mediated charge transfer effect, molecules of the gas medium transport negative charge from surface 12 to surface 14 and/or positive charge from surface 14 to surface 12, as further detailed hereinabove.

Cells 10 are interconnected thereamongst so as to allow current to flow between adjacent serially connected cells. Preferably, the cells are arranged in series and in parallel, with the series arrangement providing an increased voltage output as compared to a single cell and the parallel arrangement providing an increased current. The interconnections may derive from layered, ordered or random distribution and/or orientations of the surfaces of the particles which comprise the cells.

As used herein "serially connected cells" refers to cells arranged such that current flows from one cell to and through the adjacent cell.

The total voltage of the device is the sum of voltages along the series direction, and the total current is determined by the transport area in the transverse direction.

In the illustration shown in FIGS. 2A-2E, device 40 comprises a multiplicity of particles 44 distributed to form a particulated structure. Particles 44 serve as substrates 32 and 34 (shown in FIG. 1).

As used herein, the term "multiplicity" refers to a number which is ranging from more than a thousand individuals to a large indefinite number, for instance, of particles.

The term "particulated," as used herein, means comprising particles which are smaller than the electrodes, and individually smaller than 5 mm, preferably smaller than 1 mm, more preferably smaller than 0.1 mm and most preferably smaller than 0.01 mm in their longest dimension. In their thickness dimension, the individual particles can be smaller than 10 µm, preferably smaller than 100 nm, more preferably smaller than 1 nm and most preferably equal to or smaller than 0.3 nm. Such particles may be of any shape, including but not limited to irregular, spherical, spheroid, elongated, flat, lamellar or platelet-like. The preferred shape is flat (e.g., platelet-like) to provide a relatively large interaction area between the gas and the particles. The particles may be disconnected from one another or may be partially connected (e.g., bonded, touching or otherwise connected together) and partially disconnected.

The distribution of the particles in the particulated structure can be random or it can possess some order. For example, in some embodiments the particles are stacked in a layerwise manner; in some embodiments the particles are arranged layerwise, but instead of being stacked one over the other, each layer is comprised of a multiplicity of particles that can be laterally displaced from one another and/or overlapping one another; and in some embodiments the particles are distributed randomly or according to an arbitrary three-dimensional distribution in the volume between the electrodes. The term "particulated structure", as used herein, encompasses all these embodiments including all combinations or subcombinations thereof. The structure need not be rigid.

Particles 44 are distributed in a volume 60 defined between two electrodes 46 and 48. In some embodiments, electrodes 46 and 48 are planar or near planar and may have the spacing protrusions or roughness mentioned above. The gas molecules (not shown, see 18 in FIG. 1 for illustration) are in thermal motion in inter-particle voids 62.

In some embodiments the particles are distributed in a layerwise manner in volume 60, and in some embodiments the particles are distributed in a non-layerwise manner in volume 60.

In some embodiments of the present invention, at least a portion of particles 44 are generally platelet-like.

As used herein "platelet-like particles" refers to particles whose dimension along the thickness direction is at least X times smaller than its longest dimension, where X equals 10 or 100.

Platelet-like particles can be distributed either in a uniform or a non-uniform orientation within volume 60.

As used herein, "uniform orientation" refers to a structural configuration in which more than 50% of the particles are oriented generally parallel or at a small angle (e.g., at most 30° or at most 20°) to one another and to the external electrodes 46 and 48.

As used herein, "non-uniform orientation" refers to a structural configuration in which for any imaginary plane within the structure, at least 50% of the particles are slanted at an angle of at least 30° with respect to the plane.

A platelet-like particle may be a particle comprising a singe layer or multiple layers. The term "surface" as used herein refers to the outermost layer which can act as one of the surfaces of a cell. Each platelet-like particle may have two planar or near planar surfaces, which preferably have different charge transferabilities, illustrated in FIG. 2A as different hatchings. For clarity of presentation, these different charge transferabilities are not illustrated in FIG. 2B-2E. Several preferred techniques for providing particles with different charge transferabilities on opposing surfaces are described hereinunder and exemplified in the Examples section that follows.

Although some embodiments of the invention are described with reference to platelet-like particles, it is to be understood that more detailed reference to platelet-like particle is not to be interpreted as limiting the scope of the invention in any way. As shown in FIGS. 2A-2E, the particulated structure can be formed of particles of any shape, including, without limitation, irregular, spherical, spheroid, elongated, flat, lamellar and platelet-like. For any of these shapes, opposing surfaces can have different charge transferabilities. This configuration ensures that the particle surfaces opposing one another across the gap have different charge transferabilities, thereby facilitating the process of gas mediated charge transfer. In some embodiments (see, e.g., FIGS. 2A, 2B, 2D and 2E), particles 44 form a self-supporting particulated structure, and in some embodiments (see, e.g., FIG. 2C) the particles are contained in a supporting assembly 52. The planar sides of the mechanical holder may be formed generally by electrodes 46 and 48.

The side wall(s) 54 of holder 52 are preferably electrically non-conductive and are optionally not present. Although the particulated structure contained within a mechanical holder is illustrated in FIG. 2C with particles being spaced apart by means of roughness features 50, this need not necessarily be the case since the inter-particle voids can also be maintained by non-conductive spacers 28, as further detailed hereinabove and schematically illustrated in FIG. 2A and FIG. 2D.

Particles 44, which may be viewed as a plurality of charge transfer elements facilitating the transfer of charge between electrodes 46 and 48, may be disconnected from one another, or may be partially connected and partially disconnected. Certain porous materials for instance may be viewed as comprising a plurality of charge transfer elements, which are partially connected and disconnected, with internal voids at least partially gas permeable.

Consistent with embodiments of the invention, surfaces of particles and charge transfer elements may "oppose" or "generally face" each other. As used herein, neither term requires a specific angle of orientation. Rather, the terms "opposing" and "generally facing", when used to refer to surfaces of adjacent particles or other charge transfer elements, include any orientation where a path exists between surfaces. Therefore, for example, although adjacent particles illustrated in FIG. 2D are round, pathways exist between adjacent surfaces of differing particles, and therefore adjacent surfaces oppose and generally face each other.

Similarly, despite the irregular and somewhat randomly angled nature of opposing particle surfaces illustrated in FIG. 2E, surfaces of adjacent particles are still said to oppose and generally face each other because an electron pathway exists between the surfaces. A representative example of such pathway is shown by arrow 56.

In operation, one of the surfaces of each particle pair transfers negative charge to at least some of the gas molecules and the opposing surface across the gap receives negative charge from at least some of the charged gas molecules as further detailed hereinabove. In addition to gas mediated charge transfer, there may also be charge conduction through the particles in the thickness direction. The latter charge conduction is established by virtue of the particles' electrical conductance, which is determined by the geometry (particularly the thickness) and the conductivity of the particles. It is noted that when the particles are very thin, even materials generally thought of as being non conductive can be considered conductive. Preferred conductivity values suitable for certain embodiments are provided below.

The particles between electrodes 46 and 48 form a particulated structure which can be viewed as a distribution of a large number of cells similar to cell 10. The power density of the device increases with the total active surface, which is approximately the sum of the active surfaces of the particles.

As used herein "active surfaces," means those surfaces of the particles which oppose one another and participate in the charge transfer process, namely they interact with the gas and transfer or receive net charge from the molecules.

Depending upon the dimensions and geometry of the particles, useful devices could have particle densities ranging from several thousand particles per cubic centimeter for coarse particles to, preferably, hundreds of millions of particles per cubic centimeter for very fine particles. Ideally, for a given particle, the surface on one side of the particle serves as an electron donor of one cell, the surface on the other side of the particle serves as an electron receiver of another cell, and the particle itself serves as an electrical interconnect between the two cells. The inward facing surfaces of electrodes 46 and 48 preferably also serve as an electron donor surface and an electron receiver surface respectively, such that gas mediated charge transfer also takes place between these electrodes and the particles that are immediately adjacent to the electrodes. Alternatively, in some embodiments the electrode surfaces are in intimate contact with the adjacent particle surfaces (that is, there are substantially no gaps between them), as in the case of electrodes which are applied to the structure by coating, sputtering or vacuum metallization. Thus, electrical charge is transported from one electrode to the other, through the particles, thereby generating a potential difference between the electrodes, optionally in the absence of any external voltage source. Electrodes 46 and 48 can be connected to external load 24.

When the number of particles is large and the size of individual particles is small, it is not necessary for all the particles to participate in the charge transfer process. In some embodiments of the present invention, for each particle of a portion of the particles, the charge transferability is generally the same for all surfaces of the particle. These embodiments are typical, but not exclusive, for a particulated structure fabricated according to some of the teachings that are described below. One example is a situation in which two or more adjacent particles fail to maintain a void therebetween. Another example is a situation in which the gap between two adjacent particles is too large. In these situations, the opposite surfaces of these particles need not to have different charge transferability and at least one of these particles may have generally the same charge transferability for all its surfaces.

Heat exchange between the gas medium and heat reservoir 20 maintains the thermal motion of the gas molecules which transport charge between the surfaces of each cell. The heat exchange may be effected directly between the gas and reservoir 20 and/or via the thermal conductivity of the particles.

Broadly speaking, it is desired to reduce or eliminate electrical contact between adjacent particles in the direction perpendicular to the electrode surfaces, in order to maximize the total electrical potential of the structure and to minimize backward leakage current.

As used herein a "backward leakage current" refers to an electrical current which is enabled by contact and which is directed oppositely to the direction of the gas mediated charge transfer. Such shunted current reduces the overall efficiency of the device.

The backward leakage current can be generated by direct conduction between adjacent particles and can be reduced in more than one way. In some embodiments, particles 44 can be separated by spacers 28, as shown in FIG. 2A. Spacers 28 are preferably non-conductive such as to reduce or eliminate the backward leakage current through the spacers.

In some embodiments, illustrated in FIGS. 2B-2E, voids 62 between adjacent particles are maintained by means of roughness features 50, outwardly protruding from oppositely facing surfaces. The overall contact area between the surfaces is generally small such that the leakage current through roughness features 50 is also small. The leakage current can further be reduced by selecting at least one of the facing surfaces to be a poorly-conducting material.

Also contemplated are embodiments in which some particles are separated by spacers and some particles are separated by outwardly protruding roughness features.

The present inventors appreciate that some local leakage currents may exist among adjacent particles that are not sufficiently separated. However, the effect of these currents on the overall potential difference between electrodes 46 and 48 is believed to be negligible since local currents are compensated by gas mediated charge transfer between other particles in the device. Since the particulated structure has a large number of particles and a large number of cells, even a significant number of such localized short circuited cells would have a negligent effect upon overall system efficiency.

Devices 10 and 40 may, in some embodiments, comprise a sealed enclosure 36 for maintaining gas pressure and preventing leakage or contamination of the gas medium. For clarity of presentation, enclosure 36 is shown only in FIGS. 1A, 2A, 2B, 2D and 2E, but use of sealed enclosure in other embodiments, such as the embodiment described above with reference to FIG. 2C is also contemplated.

The pressure within enclosure 36 can be different (either above or below) from the ambient pressure. The pressure within encapsulation 36 can be selected so as to achieve a desired mean free path (the higher the pressure, the lower the mean free path) and/or a desired thermal conductivity (the higher the pressure, the higher the thermal conductivity). By reducing the pressure within encapsulation 36, the mean free path is increased, and by increasing the pressure, the number of carrier molecules and the thermal conductivity are increased. An optimum pressure balances these effects to produce a maximum current. In various exemplary embodiments of the invention the pressure within encapsulation 36 is lower than 10 atmospheres, although higher pressures are also contemplated, particularly for close-spaced gaps. In fact, for gaps in the nanometer range, especially when using gases of small molecular diameter (such as helium), high efficiencies can be achieved at gas pressures of hundreds of atmospheres. In general, for such small gaps, the upper pressure limit will be set by either pressure containment considerations or by the liquefaction pressure of the gas at operating temperatures. Preferable gas pressures are in excess of one atmosphere. Typically, the gas pressure is higher than 1.1 atmospheres or higher than 2 atmospheres or higher than 3 atmospheres or higher than 4 atmospheres or higher than 5 atmospheres.

Following is a description of methods suitable for fabricating a particulated structure, according to some embodiments of the present invention.

It is to be understood that, unless otherwise defined, the operations described hereinbelow can be executed either contemporaneously or sequentially in many combinations or orders of execution. Specifically, the ordering of the flowchart diagrams is not to be considered as limiting. For example, two or more operations, appearing in the following description or in the flowchart diagrams in a particular order, may be executed in a different order (e.g., a reverse order) or substantially contemporaneously. Additionally, several operations described below are optional and need not be executed.

Figure 3A:
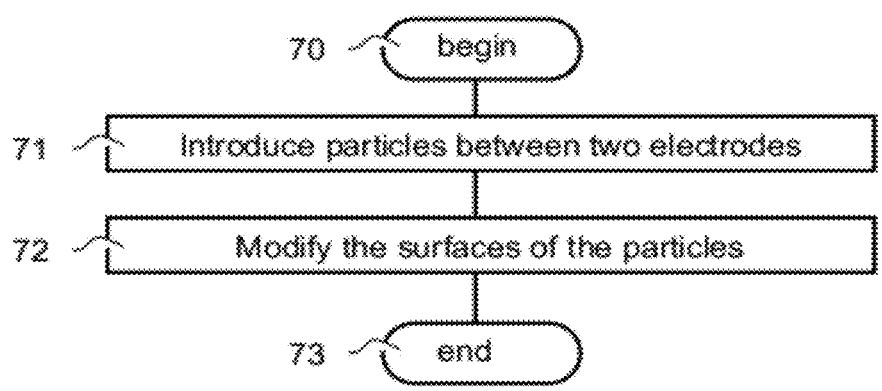
FIG. 3A is a flowchart diagram of a method for fabricating a particulated structure, according to some embodiments of the present invention.

Reference is now made to FIG. 3A which is a flowchart diagram of a method for fabricating a particulated structure, according to some embodiments of the present invention.

The method begins at 70 and continuous to 71 at which particles are introduced between two surface electrodes. The particles can be in a dry powder form or in a form of a slurry, as further detailed below. The method continues to 72 at which the particles, or at least a portion thereof, are modified such that for each modified particle the charge transferability of one of its surfaces differs from the charge transferability of the opposite surface. The modification can be performed in either a liquid or a gaseous environment, and at any suitable temperature. In some embodiments, the modification is performed at room temperature (e.g., about 25° C.) or in its vicinity. In some embodiments, the modification is performed at temperatures that are elevated with respect to room temperature (e.g., more than 100° C., or more than 200° C., or more than 500° C. or more than 700° C.).

Preferably, the surface modification is performed in the presence of an electric field generally perpendicular to the surfaces of the electrodes. Optionally, the electric field is applied once part or all the inter-particle voids are filled with the modification inducing medium. When the particles are platelet-like particles in a uniform orientation, the electric field is also mainly perpendicular to the generally planar surfaces of the particles. The electric field can be generated by applying voltage to electrodes 46 and 48 or by any other technique known in the art. Some of these techniques are described below.

The electric field serves as a symmetry breaker which provides for asymmetric modification of opposing surfaces and a difference in charge transferability between opposing particle surfaces. The electric field preferably generates the condition for a process in which the surface properties of at least at one of the opposing surfaces of each particle pair are modified.

Figure 3B:
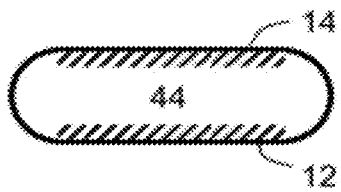
FIGS. 3B-3C are schematic illustration of a surface modification process in the presence of an electric field, according to some embodiments of the present invention.
Figure 3C:
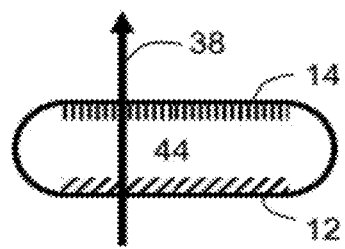

The situation is illustrated in FIGS. 3B-3C. FIG. 3B shows a particle 44 having two surfaces 12 and 14 with the same charge transferability. FIG. 3C shows the same particle 44 in the presence of an electric field generally shown as arrow 38. The electric field breaks the symmetry along the thickness direction of particle 44, and facilitates a process in which surfaces 12 and 14 acquire different charge transferabilities, in a manner that will now be explained.

Upon activation of the electric field, one or more of the following mechanisms ensures the modification of the surface properties: (i) a chemical reaction at the particle's surface(s), (ii) a change in the polarization of the particle's surface(s), and (iii) a migration of ions from one surface to the other.

Since the desired charge transferability may be achieved by surface modification techniques, particle 44 can be made of any material provided that it can conduct an adequate electrical current, at least in its thickness direction, allowing the current to flow through the load. Adequate electrical conductivity can be established using either a substrate having high conductivity (e.g., above $10^3$ S/m) or a substrate having poor conductivity (e.g., below $10^{-9}$ S/m) or a substrate having midrange conductivity (e.g., between $10^{-9}$ to $10^3$ S/m), provided that the substrate has sufficient conductance in the thickness direction (i.e. in the direction of the current flow). Thus, if the substrate is thin, it can have a relatively low conductivity and still be useful in some embodiments of the invention.

Following is a description of several modification procedures, according to some embodiments of the present invention.

In some embodiments of the present invention, prior to the application of electric field, the particulated or layered structure is impregnated with or contacted by a liquid medium having optionally therein electroactive species (e.g., dissolved or suspended salts, oxides, monomers, surfactants, dyes, and the like) such that at least part of the inter-particle voids are occupied by the liquid medium. The liquid medium may comprise a polar solvent or a non-polar solvent. When the particulated structure is prepared from a slurry, it is optionally dried prior to being impregnated with the liquid medium. Alternatively, the slurry itself may contain the electroactive species, in which case, the structure need not be dried prior to application of the electric field.

When the modification inducing medium is a liquid medium which comprises electroactive species, the chemical interaction at the surface may include (i) a chemical reaction (namely a transformation in the chemical composition of the surface), (ii) adsorption of at least a component of the electroactive species at the surface, and/or (iii) enhancement of the concentration of electroactive species or a component thereof (e.g., via electroplating or electrophoresis). Following the surface modification in liquid, the structure is dried.

A voltage is preferably applied to the structure to generate an electric field generally perpendicular to the surfaces of the electrodes. Following application of the electric field, at least one of the two opposing surfaces has been modified and therefore has a different charge transferability from the opposing surface.

The term "surface," as used herein in connection to a particle encompasses both the entire surface of a particle and a portion of the surface of the particle.

The chemical interaction at the surface may be an actual chemical reaction or may be adsorption of at least a component of the electroactive species at the surface or may be the concentration of at least a component of the electroactive species due to electroplating or electrophoresis of at least a constituent of the electroactive species. Optionally, the liquid medium may contain oppositely charged types of electroactive species such that one type interacts with one surface while the other type interacts with the opposing surface.

Representative examples of electroactive species suitable for the present embodiments include, without limitation, salts such as cesium acetate ($CH_3CO_2Cs$), manganese sulfate ($MnSO_4$), nickel chloride ($NiCl_2$), nickel nitrate ($Ni(NO_3)_2$), rare earth neodecanoate and versatate salts, cerium 2-ethylhexanoate, manganese propionate and neodecanoate, neodymium 2-ethylhexanoate and cobalt borate neodecanate complexes; dyes such as Basonyl® blau 636, Flexo Black, and Methyl Violet 2B; oxides such as titanium isopropoxide, magnesium methoxide, and nickel oxide; surfactants such as barium-(bis(tridecyl) sulfosuccinate)$_2$, and dioctyl sodium sulfosuccinate ($C_{20}H_{37}O_7NaS$); and combinations thereof. The liquid carrier can be an organic solvent, preferably of high purity, such as, but not limited to, benzene, chloroform, dimethyl sulfoxide, ethanol, hexane, isopropanol, isoparafinic hydrocarbon (e.g., Isopar® L), methanol; deionized water; and combinations thereof.

Following the preparation of a particulated structure from a slurry and/or surface modification in liquid, the structure may be dried. In some embodiments, the drying procedure may shrink the total volume (surfaces and liquid) such that, after evacuation, the distance between surfaces can be smaller than before drying.

In some embodiments, electrochemical modification in a gaseous environment is employed. In these embodiments, the particulated structure is contacted with a modifying gas (e.g., nitrogen dioxide, nitrogen trifluoride or hydrogen chloride), preferably at a pressure which is sufficiently high to fill at least part of the inter-particle voids with gas. When the particulated structure is formed from a slurry, the structure is preferably dried or partially dried before contacting it with the gas. A voltage is then applied to the structure to generate an electric field generally perpendicular to the surfaces of the electrodes. Some of the gas molecules are ionized (e.g., by the electric field interaction with the particle surface or other mechanisms). These ions modify the surface of the particle with which they interact. The gas induced surface modification occurs on at least one of the two opposing surfaces such that for each modified particle, the charge transferability of one surface differs from that of the opposing surface. In some embodiments, the gas is evacuated from the structure after the modification.

Typically, the applied voltage is selected such as to generate an electrical field of the order of $10^3$-$10^6$ v/m within the particulated structure. The duration of the chemical surface modification can vary, depending on the type of particles, liquid carrier, electroactive species or gas, and on the conditions at which the modification is performed. Typical duration is from several seconds to several hours, though in some cases many hours may be required (e.g., 12 hours, or 24 hours; or 36 hours, or 48 hours).

In some embodiments, electrothermal modification in a gaseous environment is employed. In these embodiments, a voltage is applied to the structure to generate an electric field generally perpendicular to the surfaces of the electrodes, but not necessarily in the presence of additional liquid carrier, electroactive species or gas. When the particulated structure is formed from slurry, the structure is preferably dried prior to the application of voltage. The voltage is optionally applied at temperatures which are elevated above room temperature. The combination of high temperature and electric field results in polarization of molecules at the surface of the particles and/or migration of ions towards the surface of the particle such that the different charge distributions are formed on the opposing surfaces of the particles. Typically, the applied voltage is selected such as to generate an electrical field of the order of $10^3$-$10^6$ v/m within the particulated structure. Typical temperatures suitable for the electrothermal modification are up to about 800° C.

The present inventors also contemplate a technique in which no external voltage is applied to the structure. In these embodiments, the particulated structure is situated between electrodes of different work function.

It is known that when two materials of different work function are shorted, electrons flow from the low work function material to the high work function material in order to equalize Fermi energy levels between the two materials. The characteristic time scale of this process is lower for materials of low conductivity than for materials of high conductivity. For example, if the materials are metals, this process occurs almost instantaneously. The equalization of the Fermi levels of the two materials causes mutual charging wherein the low work function material becomes positively charged and the high work function material become negatively charged. Similarly, such difference in charge distribution between adjacent surfaces establishes an electric field directed from the low work function material to the high work function material. Thus, an unbound positively charged molecule between those surfaces drifts towards the high work function surface and away from the low work function surface. When the particulated structure is situated between electrodes of different work function, it is essentially in an electric field which results in polarization of molecules at the surface of the particles and/or migration of ions towards the surfaces of the particles such that different charge distributions are formed at the opposing surfaces of the particles. Typically, the difference in work function between the electrodes is greater than or equal to 0.1 eV at room temperature.

Also contemplated are embodiments, in which two or more of the above modification techniques are combined. For example, a particulated structure can have electrodes having different work function and be further electrochemically or electrothermally modified.

In any of the above surface-modification techniques, the temperature and/or electric field may vary during the modification. For example, the process can begin with high temperatures and continue under the same electric field while the structure cools to room temperature. Another example is a process in which the electric field is increased while the temperature is decreased.

It was found by the present inventors that any of the above surface modification techniques effect a difference in charge transferability on opposing surfaces of the particles, hence facilitating generation of electricity according to the principles of gas mediated charge transfer. In experiments conducted by the inventors of the present invention, substantially stable currents were generated and sustained over prolonged periods of time, demonstrating that the surface modification techniques of the present embodiments effect a steady thermal energy conversion.

The method ends at 73.

Figure 4:
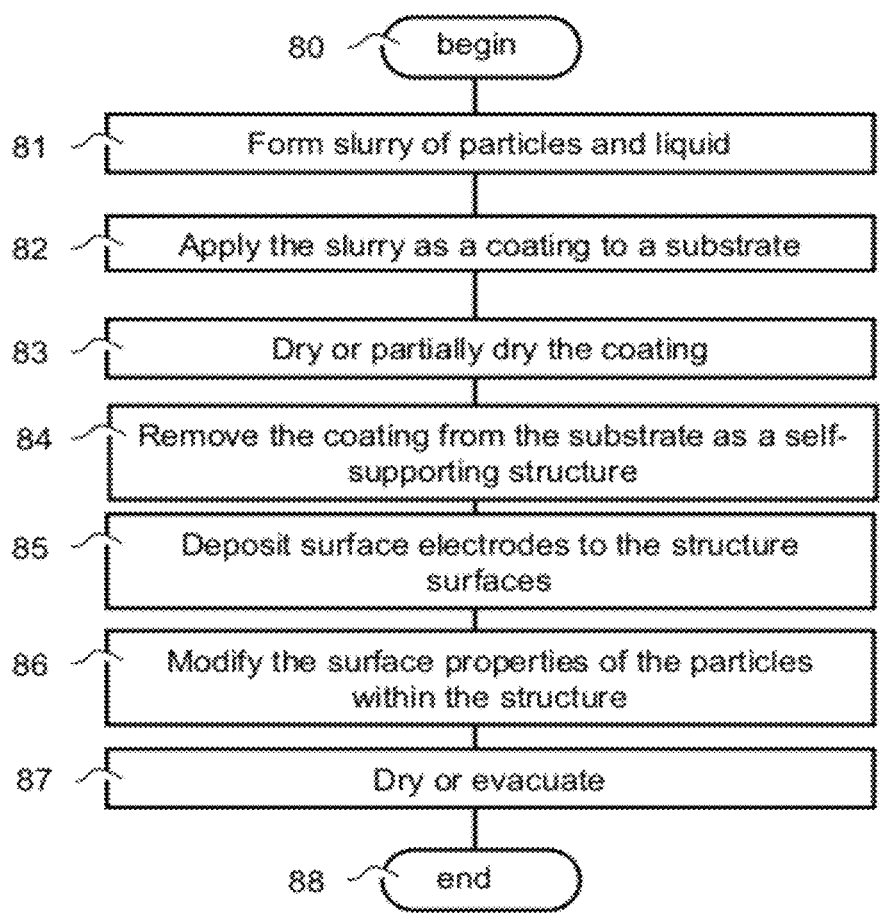
FIG. 4 is a flowchart diagram of a method for fabricating a particulated structure from a slurry, according to some embodiments of the present invention.

More detailed methods for fabricating a particulated structure according to some embodiments of the present invention are described below with reference to FIGS. 4-6. FIG. 4 is a flowchart diagram of a method for fabricating a particulated structure from a slurry, according to some embodiments of the present invention.

The method begins at 80 and continues to 81 at which a slurry of particles and liquid is formed. The particles can be made of any suitable material. Representative examples of suitable particles include, without limitation, glass flakes, vermiculite, perlite, MicroLite®, graphite, graphene, graphite oxide (GO), reduced graphite oxide (r-GO) and aluminum flakes. When the conductivity of the particles is high (e.g., when the particles are aluminum flakes) they are optionally coated by a thin layer (e.g., 10 nm) of reduced conductance, e.g., silica or the like. This embodiment is particularly useful when it is desired to manufacture a particulated structure in which inter-particle voids are maintained by means of roughness features.

The liquid can be of any type, provided it does not adversely react with the particles during the preparation of the slurry. Representative examples of liquids suitable for the present embodiments include, without limitation, water (preferably deionized water), organic solvent (e.g., chloroform, ethanol, isopropanol, etc.) and acetic acid. The concentration of the particles within the liquid is typically up to 10% by weight. Prior to mixing, the particles may be subjected to a protocol selected to increase their wettability and/or reduce their adhesiveness. Such protocol may include chemical treatment, mechanical treatment, washing and the like.

The method proceeds to 82 at which the slurry is applied to a substrate to form a planar surface on the substrate. This coating, forming, molding or casting process can be performed in any suitable manner known in the art, including without limitation spin coating, centrifugal casting, wire rod coating, reverse roll coating, blade coating, spray coating and the like. In some embodiments, the slurry is molded or extruded, in which case it is not necessarily applied on a substrate.

In alternative embodiments, the slurry can be made by in-situ formation of the particles in the liquid (e.g., by sol-gel reactions, polymerization, crystallization, precipitation and the like).

In some embodiments, the process involves application of mechanical pressure. For example, a highly viscous slurry can be placed in a mold in which the slurry is subjected to a mechanical pressure applied on at least one of the surfaces of the mold so as to form a planar surface of the slurry. The walls of the mold, including at least one of its surfaces, are optionally coated with an anti-adhesive material (e.g., Teflon®) to ease later release of the particulated structure therewith. Prior to the application of pressure, the mold and slurry can be subjected to shear or vibration so as to remove air trapped between the particles and orient the particles parallel to the surface of the mold. The vibration frequency and amplitude can vary and is typically dependent upon the size of the mold. For a 5 centimeter diameter mold, for example, the vibration frequency can be set to 50 Hz with amplitude of a few tenths of a millimeter. A typical pressure in the mold is up to about 700 kg per square centimeter.

In some embodiments, the slurry is applied by spin coating. For example, the slurry can be placed on a rotatable support substrate, such that when the substrate is rotated, a thin, preferably planar, layer of the slurry is formed on the surface of the substrate. Thereafter, the slurry is preferably dried, at least partially, to form a particulated structure on the surface of the support substrate. The process can be performed repeatedly, wherein at each phase an additional layer of slurry is formed on a previously formed particulated structure, until a desired thickness of the particulated structure is reached. During spinning, the slurry can be subjected to various types of treatments including, e.g., air blowing, heating and the like. A typical spinning speed is about 200 RPM, and a typical air blowing temperature is up to about 60° C.

In some embodiments, the slurry is applied by rod coating. For example, the slurry can be placed on a support substrate, and a moving rod can be used to coat the slurry to a predetermined thickness. Thereafter, the slurry is preferably dried, at least partially, to form a particulated structure on the surface of the support substrate. The process can be performed repeatedly, wherein at each phase an additional layer is coated on a previously formed layer, until a desired thickness of the particulated structure is reached. During coating, the slurry may be subjected to various types of treatments including, e.g., air blowing, heating and the like. A typical speed of the rod is about 3 to 5 cm/sec, and a typical air blowing temperature is up to about 70° C.

In some embodiments, the slurry is applied by spray coating. For example, the slurry can be fed into a spraying device, such as a spray gun or the like. The device can then be operated to spray the slurry onto a substrate. The operating parameters of the device (air flow, nozzle tip, spray spread) can be adjusted so as to achieve a generally uniform coating. The support substrate is optionally coated with release material (e.g., Teflon®) to ease later separation of the particulated structure from its substrate. Optionally, the substrate can be heated from below to facilitate drying of the coating during and between successive activations of the spraying device. A typical heating temperature of the underlying substrate is up to about 80° C. The size of the droplets is affected by the viscosity of the slurry, the pressure of the carrier fluid (e.g., air) and the size of the spray nozzle. Similarly, the uniformity of each layer is affected by the distance between the spray nozzle and the support substrate and depends on the previously mentioned characteristics of the air gun and slurry. A typical distance between the spray nozzle and the support substrate is up to about 15 cm, generally around 10 cm.

In some embodiments the slurry is introduced into a supporting assembly 52 having one or more side walls 102 and a base 104 (see FIG. 6A), where base 104 can serve as the substrate.

Once the slurry is applied to the substrate, the method optionally and preferably continues to 83 at which the liquid slurry is dried. This can be done by exposing the structure to high temperature (e.g., 200° C. or more) for a period of several hours. The drying can also be performed under vacuum conditions. In some embodiments, the method continues to 84 at which the self-supporting structure is optionally separated from the substrate. This can be done at elevated temperatures so as to facilitate separation between the dried particulated structure and the substrate. The removal of the structure from its supporting substrate can also be facilitated by applying the slurry to a substrate precoated with a release material (e.g., Teflon®).

In various exemplary embodiments of the invention, the method proceeds to 85 at which the structure is coated by a surface electrode. This can be done by any technique known in the art, such as, but not limited to, sputtering. For example, an electrically conductive material (e.g., aluminum, chromium, gold, manganese, molybdenum, nickel, palladium, platinum, titanium, tungsten, etc.) can be sputtered onto the surfaces of the structure to form surface electrodes. The process is preferably executed under vacuum conditions. Other electrode forming techniques such as chemical or physical deposition are not excluded from the scope of the present invention. Also contemplated are embodiments in which one or more surface electrodes are prepared separately (e.g., on a planar surface) and are laminated to the particulated structure or otherwise held in electrical contact with the surface of the structure. Alternatively or additionally, the electrodes may be made of materials which intrinsically accept or donate charge or which have intrinsic charge transferabilitiy characteristics or may be coated with materials that accept or donate charge or which have charge transferabilitiy characteristics.

The method optionally continues to 86 at which the surfaces of the particles are modified. This can be done by any of the surface modification techniques described above.

Following modification, the method optionally continues to 87 at which the structure is subjected to drying or, optionally, gas evacuation as further detailed hereinabove.

In some embodiments, the structure is subjected to an annealing procedure following the initial modification. This is particularly useful when the modification is in liquid and annealing may improve the resulting charge transferability. This is the case, for example, when the modification of the surfaces is achieved by sol-gel electrophoresis in which annealing promotes the crystallization of the desired molecules in a configuration improving the charge transferability of the surface. Annealing may also improve the charge transferability of a surface by removing from the deposited layer heat-sensitive contaminants which may affect charge transferability. In these embodiments, the annealing is executed at high temperatures (e.g., above 250° C.) and for a period of time (e.g., 5-60 minutes).

The method ends at 88.

Figure 5:
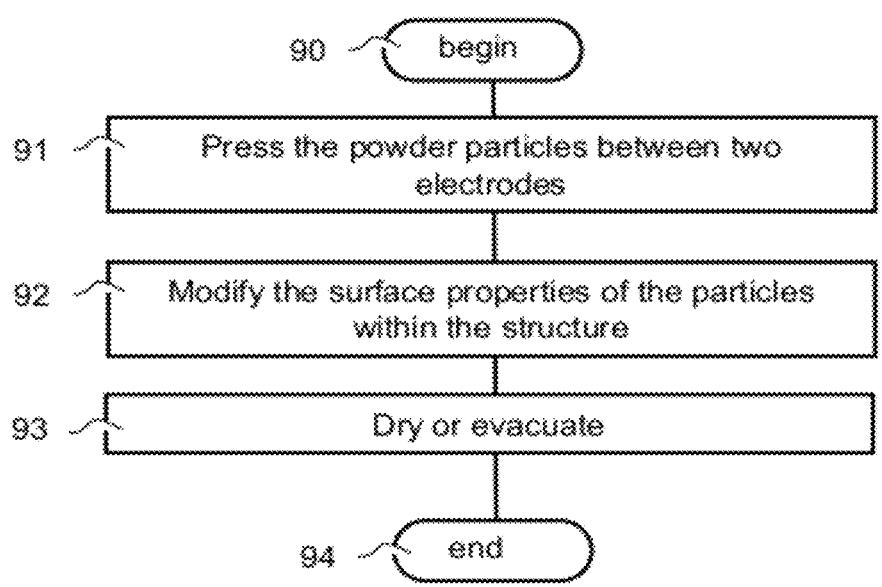
FIG. 5 is a flowchart diagram of a method for fabricating a particulated structure from a powder, according to some embodiments of the present invention.

Reference is now made to FIG. 5 which is a flowchart diagram of a method for fabricating a particulated structure from dry powder or slurry, according to some embodiments of the present invention. The powder or slurry generally comprises particles with or without spacers as further detailed hereinabove.

Although applicable for any suitable dry particulate material, this method is particularly useful for particles which do not readily form self-supporting structures when dried from a slurry. Representative example of such particles including, without limitation, aluminum flakes.

Figures 6A, 6B, 6C:
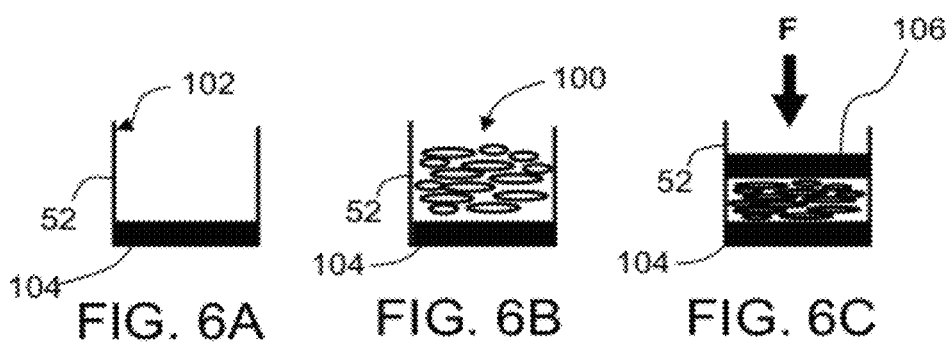
FIGS. 6A-6C are schematic illustrations of a process suitable for pressing a powder in a supporting assembly, according to some embodiments of the present invention.

The method begins at 90 and continues to 91 at which the particles are pressed between a bottom surface electrode and a top surface electrode within the supporting assembly by bolting a screw to apply a pressure of up to about 1.5 ton (20 MPa/210 bar). An exemplified procedure is schematically illustrated in FIGS. 6A-6C.

The particles 100 are introduced into supporting assembly 52 having one or more side walls 102 and a base 104. Side wall(s) 102 are preferably made of an electrically non-conductive and non-adhesive material (e.g., Teflon®) and base 104 is electrically conductive and can serve as a bottom electrode. An additional surface electrode 106 (which can serve as upper electrode) is introduced into supporting assembly 52 and a force F is applied on electrode 106 so as to press particles 100 between electrodes 104 and 106. Optionally, supporting assembly 52 is shaken gently prior to the application of pressure, so as to orient the particles parallel to, or at some small angle to, electrodes 104 and 106. Following application of force, side wall(s) 102 are optionally removed.

The method proceeds to 92 at which the method modifies at least a portion of the particles such that charge transferability of one its surfaces differs from charge transferability of opposing surface. The surface modification procedure can be according to any of the embodiments described above. When an electrochemical modification in liquid environment is employed, the entire structure 52 is preferably contacted by an appropriate liquid medium such that at least part of the inter-particle voids are wetted by the liquid medium. Thereafter, voltage is applied between electrodes 104 and 106 as further detailed hereinabove. When an electrochemical modification in a gaseous environment is employed, structure 52 is contacted with the appropriate gas, preferably at a pressure which is sufficiently high to fill at least part of the inter-particles voids with the gas. Thereafter voltage is applied between the electrodes as further detailed hereinabove.

Following surface modification, chemical or otherwise, the method optionally continues to 93 at which the structure is subjected to desiccation or optional gas evacuation as further detailed hereinabove.

The method ends at 94.

In some embodiments of the present invention, each of surfaces 12 and 14 of particles 44 is smooth. In these embodiments the surfaces have a surface roughness which is less than or about 20 Å RMS, more preferably less than or about 10 Å RMS, more preferably less than or about 5 Å RMS, as conventionally determined by image analysis of Atomic Force Microscopy (AFM) using standard procedures. Also contemplated are atomically flat surfaces. Further contemplated are surfaces having RMS roughness of several nanometers or tens of nanometers (e.g., up to about 100 nanometers). It is to be understood, however, that surfaces that are not substantially smooth are not excluded from the scope of the present invention.

In alternative embodiments, the surfaces of the particles include outwardly protruding roughness features, as further detailed hereinabove.

Suitable materials which can be used for surface 12 and/or surface 14 of particles 44, include magnetic or non-magnetic substances such as, but not limited to, metals, semi-metals, alloys, intrinsic or doped, inorganic or organic, semi-conductors, dielectric materials, intrinsic or doped polymers, conducting polymers, layered materials, ceramics, oxides, metal oxides, salts, crown ethers, organic molecules, quaternary ammonium compounds, cermets, glass and silicate compounds, and any combination thereof.

Suitable and representative examples of materials which can be used for any of surface 12 and/or 14 of particles 44, or as modifiers of surface 12 and/or 14 include, without limitation, metals and semi metals (e.g., nickel, gold, cobalt, palladium, platinum, graphite, graphene, aluminum, chromium, gadolinium, molybdenum, hafnium, tantalum, etc.) and oxides thereof (e.g., gadolinium oxide, graphite oxide (optionally reduced or partially reduced), silica, lanthanum (III) oxide, magnesium methoxide, magnesium oxide, manganese dioxide, manganese nickel oxide, titanium oxide, titanium isopropoxide, tin-doped indium oxide (ITO) and tungsten trioxide), alloys (e.g., stainless steel), semi-conductors (e.g., boron or phosphorous doped silicon wafers), ceramics, optionally doped, (e.g., glass ceramics such as MACOR®, aluminum nitride, lanthium hexaboride and boron nitride), cermets (e.g., chromium silicide silica), glass and silicate compounds (e.g., glass, silicon dioxide and phlogopite mica), salts such as calcium salts (e.g., calcium petronate, calcium naphtenate salts such as NAP-ALL®, $CaF_2$), rare earth salts (e.g., rare earth neodecanoate or versatate salts such as TEN-CEM®, rare earth octoate salts such as HEX-CEM® which are octoate salts prepared from 2-ethylhexanoic acid), zirconium salts (e.g., zirconium carboxylate salts such as CEM-ALL®, Zirconium HEX-CEM®), manganese salts (e.g., Manganese HEX-CEM®, Manganese NAP-ALL®, Manganese Hydro Cure® and Hydro Cure® II), nickel salts (e.g., nickel chloride and nickel nitrate), quaternary ammonium salts Arquad® (e.g., Arquad 3HT-75®), lead salts (e.g., Lead CEM-ALL®, Lead NAP-ALL®), cobalt salts (e.g., Cobalt TEN-CEM®, Cobalt NAP-ALL®, Cobalt CEM-ALL®), zinc salts (e.g., Zinc NAP-ALL®, Zinc CEM-ALL®, Zinc HEX-CEM®, zinc stearate), nigrosine, pyrrole, sodium petronate, polyethylene imine, gum malaga, OLOA 1200, lecithin, polymers such as nitrocellulose, nitrocellulose based polymers, optionally doped, (e.g., Zaponlack), polyvynilene phenilene derivatives (e.g., MEH-PPV), polyvinyl chloride based polymers (e.g., Episol® 310, Episol® 410, Episol® 440, Epivyl® 32, Epivyl® 40, Epivyl® 43, Epivyl® S 43, Epivyl® 46) and acrylic resins (e.g., Elvacite® 2041) and any combination thereof.

Certain of the above materials are also suitable for particles 44 to the extent that they are able to form self-supporting structures.

Certain marks referenced herein may be common law or registered trademarks of third parties. Use of these marks is by way of example and shall not be construed as descriptive or limiting the scope of this invention to material associated only with such marks. Suitable equivalents of such materials may also be used.

Suitable materials which can be used as gas medium 16 include, without limitation, halogen and halogen containing gases e.g., $At_2$, $Br_2$, $Cl_2$, $F_2$, $I_2$, $WF_6$, $PF_5$, $SeF_6$, $TeF_6$, $CF_4$, $AsF_5$, $BF_3$, $CH_3F$, $C_5F_8$, $C_4F_8$, $C_3F_8$, $C_3F_6O$, $C_3F_6$, $GeF_4$, $C_2F_6$, $CF_3COCl$, $C_2HF_5$, $SiF_4$, $H_2FC$—$CF_3$, $CHF_3$, and $CHF_3$; inert gases, e.g., Ar, He, Kr, Ne, Rn, and Xe; nitrogen containing gases e.g., $N_2$, $NF_3$, $NH_3$, NO, $NO_2$, $C_4H_{11}N$ and $N_2O$; sulfur containing gases, e.g., $SF_6$, $SF_4$, $SO_2$ and $SO_2F_2$; oxygen comprising gases, e.g., $O_2$, CO, and $CO_2$; hydrogen containing gases, e.g., $H_2$, deuterium, i-$C_4H_{10}$, and $CH_4$; alkaline gases e.g., Cs, Li, Na, K, Cr, Rb, and Yb; and combinations thereof. In various exemplary embodiments of the invention the gas medium is chemically inert with respect to the surfaces of the cell or device.

Among the aforementioned suitable gas media, gases having reducing, oxidizing and halogenizing properties are particularly appropriate for modification purposes.

Suitable materials which can be used as spacer 28 include, without limitation, any insulating organic or inorganic compound, such as presently exemplified mica, polyhedral oligomer silsesquioxane, polypropylene, polyimide and silica derivatives.

Additional suitable materials can be identified by experiments performed as described in Example 6 of International Publication No. WO 2010/023669 A2, the contents of which are hereby incorporated by reference. Representative materials include those which were found to have a residual charge above 50% after 8 minutes of discharge, comprising: salts including aluminum fluoride, ammonium citrate, barium acetate, barium bromate, barium chloride monohydrate, barium sulfate, calcium acetate, boron nitride, calcium carbonate, calcium citrate, calcium phosphate tribasic, cesium bromide, cesium fluoride, cesium nitrate, gallium nitride, lithium fluoride, magnesium acetate, magnesium chlorate, magnesium fluoride, magnesium sulfate, potassium bromate, potassium bromide, potassium chlorate, potassium chloride, potassium perchlorate, sodium acetate, sodium bromate, sodium chloride, sodium chlorate, sodium nitrate, sodium perchlorate, sodium sulfate, strontium acetate, strontium carbonate, strontium chloride, strontium fluoride, strontium hydroxide, strontium nitrate, and strontium sulfate; oxides including aluminum oxide, calcium oxide, magnesium oxide and zinc oxide; and dyes including Bontron™ E-84, Bontron™ E-88, Bontron™ E-89, Bontron™ E-108, Bontron™ N-04, Bontron™ N-05 and Bontron™ N-07.

As previously mentioned, particles of the particulated structure may be made of relatively poor electrical conductors. By way of example, glass is considered a poor conductor since its typical conductivity at room temperature ($10^{-15}$ S/m) is considerably lower than the typical conductivity of metals (of the order of $10^6$ S/m). Nevertheless, a sufficiently thin layer or particles of such material can conduct significant electrical current, adequate for certain low power applications.

Representative examples of materials suitable for substrates 32 and 34 include, without limitation, metals, such as, but not limited to, aluminum, cadmium, chromium, copper, gadolinium, gold, iron, lead, magnesium, manganese, molybdenum, nickel, palladium, platinum, silver, tantalum, tin, titanium, tungsten, and zinc; semi-metals, including but not limited to antimony, arsenic, and bismuth; alloys, including but not limited to brass, bronze, duralumin, invar, and steel; intrinsic and doped, inorganic and organic, semi-conductors and semi-conductor hetero-structures, including but not limited to silicon wafers, germanium, silicon, aluminum gallium arsenide, cadmium selenide, gallium manganese arsenide, zinc telluride, indium phosphide, gallium arsenide and polyacetylene; lamellar materials including but not limited to graphite, graphene, graphite oxide, tungsten disulfide, molybdenum disulfide, tin disulfide, and hexagonal boron nitride; intrinsic or doped oxides including but not limited to silica, tungsten trioxide, manganese dioxide, manganese nickel oxide, tin-doped indium oxide (ITO); intrinsic or doped ceramics, including but not limited to boron nitride, aluminum nitride, and glass ceramics such as MACOR®; cermets, including but not limited to chromium silicide silica; glass and silicate compounds, including but not limited to glass and phlogopite mica; or combinations thereof. Also contemplated are substrates of any materials which are coated with any of the above materials.

Materials suitable for substrates and coatings can be magnetic (e.g., Co, Fe, Gd, Ni, GaMnAs and the like) and non-magnetic (e.g., Al, Cu and the like).

Surfaces 12 and 14 can be bare substrates (32 and 34), surface-modified substrates or coated substrates. A typical thickness of bare substrates 32 and 34 is from about 1 nm to about 100 µm. In some embodiments of the invention the thickness of the bare substrate can be between 1-20 nm. In some embodiments the thickness can be as low as a single atomic monolayer (0.34 nm in the case of graphene). In the case of certain surface-modified substrates, (such as electrochemically modified, oxidized or reduced surfaces) the typical thickness of surfaces 12 and 14 can be below 1 nm. However, in the case of coated or modified surfaces, the typical thickness of surfaces 12 and 14 is from about 1 nm to about 600 nm, but other thicknesses are not excluded from the scope of the present invention. In the case of any intermediate layer or binder layer (if present) between substrate 32 and surface 12 or between substrate 34 and surface 14 a typical thickness is from under 1 nm to about 250 nm.

As used herein the term "about" refers to ±20%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Example I

Theoretical Considerations

The theoretical considerations suggested by the present inventors as hypothetically underlying the generation of electrical current by thermal motion of gas molecules between surfaces having different charge transferability were provided in Example 1 of International Publication No. WO 2010/023669 A2, the contents of which are hereby incorporated by reference.

Example 2

Measurements by Kelvin Probe

The present example describes experiments performed in accordance with some embodiments of the present invention to assess the charge transferability of surfaces by means of a Kelvin probe. The experiments were performed as described in Example 3 of International Publication No. WO 2010/023669 A2, the contents of which are hereby incorporated by reference, with a minor modification regarding baseline vacuum levels.

The samples of Table 1A correspond to the experiments disclosed in WO 2010/023669 A2, for which the baseline vacuum level was of about $10^{-2}$ mbar.

In additional experiments, the Kelvin probe apparatus (Kelvin Control 07, Besocke Delta Phi) was placed in a sealable chamber allowing vacuum pressure of about $10^{-3}$ mbar. The samples were prepared by sputtering of layers of 30-1,000 nm of the desired material on a thin disc or square glass element of 1 mm thickness (for more details see Example 5, TGD and STG supports). Samples of aluminum (Al), gold (Au), calcium fluoride ($CaF_2$), gadolinium (Gd), hafnium (Hf), lanthanum hexaboride ($LaB_6$), manganese dioxide ($MnO_2$), nickel (Ni), lead (Pd), platinum (Pt) and tantalum (Ta) were tested in vacuum, air, argon (Ar), tetrafluoromethane ($CF_4$), hexafluoropropylene ($C_3F_6$), helium (He), nitrogen dioxide ($NO_2$), oxygen ($O_2$), sulfur hexafluoride ($SF_6$) and Xenon. Gases were generally purchased from BOC Gases at a purity of at least 99.99% and were used dried.

The Kelvin probe measured in a first step the contact potential difference (CPD) between the sample and a gold reference probe, whether in vacuum or gas. In a second step, the work function value of the gold probe (5.1 eV) was added to the previously measured CPD to give the work function (WF) of the measured sample.

Results

Tables 1A-1C summarize the work function (WF) in eV, as measured by a Kelvin probe at room temperature at different pressures indicated in mbar, when the basic vacuum pressure was $10^{-2}$ and $10^{-3}$ mbar, as indicated. Table 1A was disclosed in WO 2010/023669 and is reproduced below for convenience. Table 1B presents results obtained with various gases tested at a single pressure, whereas Table 1C presents results obtained with gases tested at three different pressures for each gas.

TABLE 1A

| Material | Medium | | | | | | | | | | |
|---|---|---|---|---|---|---|---|---|---|---|---|
| | Vacuum | Air | Ar | $C_2H_2$ | $CO_2$ | Kr | $N_2$ | $NF_3$ | $O_2$ | $SF_6$ | Xe |
| Pressure (mbar) | $1 \times 10^{-2}$ | $1 \times 10^3$ | $1 \times 10^3$ | $1 \times 10^3$ | $1 \times 10^3$ | $1 \times 10^3$ | $1 \times 10^3$ | $4 \times 10^3$ | $1 \times 10^3$ | $1 \times 10^3$ | $1 \times 10^3$ |
| Cesium Carbonate ($Cs_2CO_3$) | 4.00 | 4.50 | 3.95 | 3.85 | 4.15 | 4.00 | 3.75 | 3.70 | 4.20 | 3.80 | 4.20 |
| Cesium Fluoride (CsF) | 4.00 | 4.40 | 4.05 | 4.13 | 4.10 | 4.17 | 4.15 | 3.90 | 4.06 | 4.20 | 4.30 |
| Magnesium (Mg) | 2.90 | 3.60 | 2.90 | 2.90 | 2.85 | 2.95 | 2.90 | 2.60 | 3.70 | 3.05 | 3.00 |
| Polyethyleneimine (PEI) | 4.60 | 4.40 | 4.47 | 4.54 | 4.53 | 4.50 | 4.55 | 3.90 | 4.84 | 4.52 | 4.45 |

TABLE 1B

| Material | Medium | | | | | | | |
|---|---|---|---|---|---|---|---|---|
| | Vacuum | Air | $CF_4$ | $C_3F_6$ | He | $NO_2$ | $O_2$ | $SF_6$ |
| Pressure (mbar) | $1 \times 10^{-3}$ | $1 \times 10^3$ | $4 \times 10^2$ | $4 \times 10^2$ | $4 \times 10^2$ | $4 \times 10^2$ | $4 \times 10^2$ | $4 \times 10^2$ |
| Al | 4.10 | 4.37 | 4.29 | 4.41 | 4.29 | 4.37 | 4.22 | 4.40 |
| Au | 5.10 | 5.32 | 5.36 | 5.51 | 5.18 | 5.33 | 5.23 | 5.47 |
| $CaF_2$ | 3.43 | 3.79 | 3.34 | 3.46 | 4.06 | 4.50 | 3.17 | 3.52 |
| Gd | 3.64 | 4.52 | 3.58 | 3.82 | 3.77 | 4.12 | 3.56 | 3.69 |
| Hf | 3.85 | 4.07 | 4.08 | 4.23 | 4.01 | 4.89 | 3.99 | 4.17 |
| $LaB_6$ | 4.11 | 4.79 | 4.34 | 4.43 | 3.35 | 4.84 | 4.11 | 4.39 |
| $MnO_2$ | 5.13 | 5.68 | 5.27 | 5.40 | 5.44 | 5.23 | 5.25 | 5.43 |
| Ni | 4.85 | 5.16 | 5.17 | 5.28 | 4.95 | 5.26 | 5.00 | 5.29 |
| Pd | 5.06 | 5.28 | 5.30 | 5.41 | NA | 5.30 | 5.12 | 5.34 |
| Pt | 5.06 | 5.22 | 5.60 | 5.73 | 5.08 | 5.23 | 5.39 | 5.65 |
| Ta | 4.35 | 4.79 | 4.66 | 4.76 | 4.40 | 4.71 | 4.44 | 4.69 |

TABLE 1C

| Material | Medium | | | | | | |
|---|---|---|---|---|---|---|---|
| | Vacuum | Ar | Ar | Ar | Xe | Xe | Xe |
| Pressure (mbar) | $1 \times 10^{-3}$ | $4 \times 10^2$ | $1 \times 10^3$ | $2 \times 10^3$ | $4 \times 10^2$ | $1 \times 10^3$ | $2 \times 10^3$ |
| Al | 4.15 | 4.52 | 4.58 | 4.70 | 4.40 | 4.75 | 5.44 |
| Au | 5.10 | 5.32 | 5.41 | 5.57 | 5.42 | 5.80 | 6.35 |
| $CaF_2$ | 4.10 | 4.26 | 4.35 | 4.49 | 4.38 | 4.74 | 5.60 |
| Gd | 4.15 | 4.29 | 4.40 | 4.57 | 4.51 | 5.00 | 5.47 |
| Hf | 4.42 | 4.57 | 4.67 | 4.83 | 4.61 | 4.99 | 5.67 |
| $LaB_6$ | 3.50 | 3.69 | 3.77 | 3.91 | 3.30 | 3.68 | 4.19 |
| $MnO_2$ | 5.25 | 5.60 | 5.69 | 5.86 | 5.60 | 6.00 | 6.53 |
| Pt | 5.07 | 5.28 | 5.37 | 5.53 | 5.41 | 5.81 | 6.38 |
| Ta | 4.80 | 5.12 | 5.21 | 5.36 | 5.18 | 5.56 | 6.15 |

As shown, the WF is not the same in vacuum and in the presence of gas, and it depends on the gas type and on its pressure. For a given solid material, the WF was increased in the presence of one type of gas medium and decreased in the presence of another type of gas medium relative to the vacuum condition. Similarly, the presence of a given gas medium increased the WF for one solid material and decreases the WF for another solid material relative to the vacuum condition. Over the range of pressures tested, an increase in gas pressure increased the measured WF.

It is hypothesized that adsorbed gas molecules become charged as a result of their interaction with the surface of the test material. The charge transfer between the adsorbed molecule and the surface creates an electrical dipole which alters the measured WF This phenomenon allows the definition of a point of zero charge transferability (ZCT) for each gas medium. This point is defined as the WF of materials at which the gas changes from an electron donor to an electron receiver. In other words, the ZCT is the WF of materials which does not change in the presence of the gas. The ZCT of a gas falls between the work function of two materials which have the closest WF of all couples where one material displays an increase in WF and the other displays a decrease in WF.

The ZCT values for some gas media as estimated according to the above procedure are listed in Table 2.

TABLE 2

| Gas medium | Pressure (mbar) | ZCT (eV) |
|---|---|---|
| air | $1 \times 10^3$ | 4.45 |
| Xe | $1 \times 10^3$ | 4.45 |
| $O_2$ | $1 \times 10^3$ | 4.60-5.05 |
| $SF_6$ | $1 \times 10^3$ | 2.90-4.90 |
| $O_2$ | $4 \times 10^2$ | 4.01-4.82 |
| $CF_4$ | $4 \times 10^2$ | 1.90 |
| $C_3F_8$ | $4 \times 10^2$ | 0.43 |
| $NO_2$ | $4 \times 10^2$ | 5.50 |

As shown in the case of oxygen, the gas pressure may slightly affect the estimated ZCT. In the present case, at lower gas pressure (400 mbar) the estimated range of ZCT value is somewhat lower than the range at higher gas pressure (1,000 mbar). This is in line with the previous observations that WF increased with the gas pressure. In other words, the ZCT value is a function of the gas pressure.

In addition, the Kelvin probe was used to measure the work function of samples used in the experimental setups detailed below. In particular, the work function of the samples prepared by sputtering as described below in Example 5 was measured at room temperature in vacuum of no less than $10^{-2}$ mbar. The measured values, or ranges thereof, are provided following the identity of the external coating. The results obtained under the measurement conditions were: aluminum 3.9-4.1 eV, carbon 4.9-5.0 eV, Indium Tin Oxide 4.65 eV, molybdenum 4.9 eV, nickel oxide 5.5-5.6 eV, (Nickel:Manganese) oxide (at a ratio of 1:1) 5.5-5.6 eV, titanium 4.3-4.55 eV, tungsten 4.8 eV, titanium oxide 4.95-5.2 eV, chromium silicide:silica (at a ratio of 4:1) 4.55 eV, and mineral glass 1.4-2.0 eV.

The present example demonstrates that the gas molecules transport positive or negative charge away from the solid surface, and that the potential to which the surface becomes charged due to the interaction with the gas molecules depends on the type of solid material as well as the gas medium. The present example further demonstrates that a Kelvin probe may be useful for providing an indication of charge transferability.

Example 3

Electrodeposition

The present example describes coating via electrodeposition (ED). Electrodeposition can be subdivided into electrochemical deposition (ECD) where the electroactive species, generally salts, are dissociated into ions within a solvent, and electrophoretic deposition (EPD) where the electroactive species are charged within a solvent. In both cases, the solvent may be polar or non-polar.

The experiments were performed using a setup which is similar to the electrodeposition setup described in Example 5 of International Publication No. WO 2010/023669, the contents of which are hereby incorporated by reference. It is to be understood that any combination of materials and conditions described in WO 2010/023669 is also contemplated for use in the context of the present invention.

Electrophoretic deposition was performed on a pair of Aluminum disks (50 mm diameter, 2 mm thickness) placed in parallel to each other at a distance of about 1 cm in a 250 ml beaker. In these experiments, the coating layer was a nanoporous film. To obtain a layer of titania, 1.5 gr of $TiO_2$ nanoparticles having an average size of 25 nm (Deggusa, P-25) were dispersed in 250 ml of ethanol (Gadot AR). In addition, 33 mg of iodine, 4 ml of acetone and 2 ml of double distilled water were added to the solution. About 150 ml of the suspension were transferred to the electrodeposition beaker. The nanoporous $TiO_2$ film was cathodically electrodeposited on the Aluminum substrate under voltages in the range of 20-100 volt applied for up to one minute. For the preparation of a nanoporous film of manganese dioxide ($MnO_2$), manganese oxide nanoparticles were first synthesized by reduction of aqueous 0.3M potassium permanganate with an identical volume of ethanol. The synthesized nanoparticles were then washed with ethanol and were dried at room temperature for at least 24 hours. According to literature, manganese oxide nanoparticles prepared by this method should have an average size of 30 nm, which was not presently verified. For the electrodeposition step, 10 gr of dried manganese oxide nanoparticles were suspended in 250 ml of ethanol with 0.25 gr Triton™ H-66, a phosphate polyether ester anionic surfactant of Dow Chemical Company. 150 ml of this suspension were transferred to the electrodeposition beaker where a voltage of 20-100 V was applied to the aluminum electrodes for up to one minute to deposit a nanoporous film of manganese dioxide. Table 3 summarizes the main parameters of the above-mentioned electrodeposition experiments.

TABLE 3

| Dissolved/ Dispersed Species | Main Solvent | Voltage (V) | Deposition Time (min) | Intended coating | Thickness (μm) |
|---|---|---|---|---|---|
| $TiO_2$ + Iodine + Acetone | Ethanol | 20-100 | 1 | $TiO_2$ | 10 |
| $MnO_2$ + Triton ™ H-66 | Ethanol | 20-100 | 1 | $MnO_2$ | 10 |

In addition, sol-gel electrophoretic depositions were performed in particulated structures. These surface modifications are described below under chemical modification in liquid.

Example 4

Preparation of Particulated Structures

The present example describes experiments performed in accordance with some embodiments of the present invention for the preparation of particulated structures.
Materials and Methods
Materials having either poor bulk conductivity (e.g., glass), intermediate bulk conductivity (e.g., graphite oxide (GO)) or high bulk conductivity (e.g., aluminum) were used. As the electrical conductance of a material is affected by its geometry and crystallographic orientation, certain materials which may be considered to have poor bulk conductivity (e.g., below $10^{-9}$ S/m) can conduct current adequately in their thickness direction if sufficiently thin, whether comprising a single atomic monolayer or more.

When using particles made of sufficiently conductive material, non-conductive spacers were optionally added to the structure to separate opposing surfaces of adjacent particles. The spacers were "non-conductive" in the sense that they prevent short circuits between the particles occupying the gap between the two electrodes. The size of the spacers, which can, for example, be a nanostructure of any shape, was selected such that the area which the spacers cover on the platelet surface is substantially smaller than (e.g., less than 10% of) the area of the platelet surfaces, so as to allow sufficient effective exposure to one another of the facing surfaces. The present inventors also contemplate embodiments in which the spacers cover a surface which is more than 10%, for example, up to 20% of the area of the platelet surfaces. The following materials were used as spacers: polyhedral oligomer silsesquioxane (POSS) nanoparticles having an average diameter of 1.5 nm and silica nanoparticles having average diameters of 20, 35 and 50 nm.

In addition to having different conductive properties, the materials used in the present examples varied in their morphology and were either non-porous or porous and expandable or not. The individual particles were of a diversity of shapes, from generally planar flake-like or platelet-like particles (e.g., GO) to amorphous particles (e.g., perlite), through any intermediate shape. Any particle shape can be suitable as long as the overall area of the opposite/facing surfaces is sufficient to generate useful currents. The particles' typical longest dimension was from tens of nanometer to several millimeters and their average thickness was in the micron range down to one nanometer. Certain expandable and porous materials, such as perlite and vermiculite, had pore sizes or gaps of up to 10 μm.

The following materials were used for the preparation of the particulated structures: (a) Glass flakes having average sizes of about 150-1,750 μm for unmilled material and 25-50 μm for mortar milled and sieved flakes, and thickness of about 100 nm (Glassflake Ltd.); (b) Vermiculite, an expandable silicate, having a bulk density of about 76-112 $kg/m^3$ and a surface area of 5-14 $m^2/g$ (expanded no. 4, Grace Construction Products Ltd.); (c) Perlite, a porous amorphous volcanic glass, having average sizes between about 200-250 μm, a pore size ranging from about 10 nm to 7 μm and a bulk density of about 65 $kg/m^3$ (Grace Construction Products Ltd.); (d) MicroLite® 923, a chemically exfoliated form of vermiculite, a naturally occurring magnesium aluminium silicate mineral, having an average size above 45 μm, a thickness of about 0.6 nm for the fully exfoliated flakes, a percent solid content of 7.5% and an over size particles (OSP) of less than 15% (Grace Construction Products Ltd.); (e) chemically exfoliated Graphite Oxide (GO), having an average size of about 25-75 μm and an average thickness of about 3 nm, either used "as is" or at least partially reduced to yield graphene platelets; (f) conventionally milled graphite, having an average size of about 0.5-10 μm and average thickness in the range of about 1-100 nm (prepared from Asbury graphite 3763 having an unmilled flake size in the range of about 25-75 μm); and (g) non leafing Aluminum silver dollar shaped flakes having an average size of about 17 μm either uncoated having an average thickness of about 100 nm (Sparkle Silver Ultra® 6555, Silberline Manufacturing Co.; which contain 75% solids) or an average thickness of about 75 nm (Platinvario® PM-85001; Eckart; 50% solids in methoxy propanol), or coated with silica having an average thickness of about 300 nm (SilBerCote® PC 8602X, Silberline Manufacturing Co.; which contain 100% solids).

The average particle sizes were provided by the manufacturer and were further determined by sieve analysis to obtain populations of particles having a narrow known size distribution. The average dimensions of GO were assessed by AFM. The average thickness dimensions of the aluminum flakes were arbitrarily defined based on focused ion beam (FIB) analysis (FEI, Helios 600). The uncoated flakes of Sparkle Silver Ultra® 6555 above described as having an average thickness of 100 nm, displayed in microscopic analysis flakes' thicknesses in the range of about 50 to 500 nm. Similarly, the uncoated Platinvario® PM-85001 flakes described as having an average thickness of 75 nm also had flakes in the range of 50 to 200 nm and the silica coated aluminum flakes described as having an average thickness of about 300 nm represent a population in the range of 100 to 800 nm.

Graphite (Asbury graphite 3763 having a flake size in the range of about 25-75 μm) was oxidized and exfoliated using the method of Hirata (see e.g., U.S. Pat. No. 6,596,396). The resulting Graphite Oxide (GO) was cleaned, washed and concentrated using Microza® membrane filtration (Pall Corp., UMP-1047R). AFM scans established that the GO nanoplatelets so obtained had thicknesses ranging from single GO sheets of about 1 nm thickness to multiple sheets, with an overall average thickness of about 3 nm. In some experiments, the exfoliated GO was used without further treatment and in some experiments it was partially reduced by UV radiation and/or heat treatment.

Five techniques were used for the preparation of the particulated structures: a first technique was based on pressing within a mold, used for instance in the case of glass flakes, vermiculite, perlite, and coated and uncoated aluminum flakes; a second technique was based on sequential spin-coating, used for instance for MicroLite® and graphite oxide (eventually concomitantly reduced); a third technique was based on rod coating, used for instance for the preparation of a film of graphite oxide optionally comprising spacers; a fourth technique was based on sequential spraying of the particles on a substrate, exemplified below in the case of GO optionally comprising spacers; and a fifth technique used a mechanical holder in which the particles were maintained as a fixed structure, exemplified below in the case of coated and uncoated aluminum flakes.

Molding

In the first technique, the particles were pressed either as dry material or as a slurry (in a polar or non-polar solvent). For example, aluminum flakes were mixed with a minimal amount of deionized water to form an aqueous slurry. Since aluminum is oxidation sensitive, the particles, whether or not surface treated with silica, were supplied coated with a protective layer of fatty acid to reduce the formation of an external layer of alumina on the aluminum core. Therefore, in order to prepare an aqueous slurry from such material, the aluminum particles were first washed with methanol, while gently shaken for 10 minutes, and centrifuged at 10,000 RPM for 5 minutes (Thermo Sorvall RC6 Plus). This process was repeated three times and the particles were then dried for 4 hours at 100° C. in a vacuum oven. To increase wettability, the dried particles were optionally treated for 15 minutes with 2% sulfuric acid, followed by three washing steps performed as described above, this time with deionized water. It is noted that the spontaneous formation of at least partial alumina coating during the above-described washing process of the aluminum flakes is expected to affect the conductivity of the resulting particulated structure. Other particles were generally used without any preliminary washing or wetting step.

Generally the concentration by weight of the particles in the slurry was between 4 to 6%. The slurry was poured into a cylindrical metal mold, having the shape of a petri dish. The dimensions of the mold were selected according to the desired diameter of the structures, which was generally up to 52 mm. The amount of material poured into the mold largely determined the thickness of the end product. The mold was coated with reinforced Teflon® (Kastilo 5038 AP) to ease later release of the end product. The mold containing the slurry was placed on a sieve shaker (Restsch AS-200) to remove air bubbles trapped between the particles. The suspended particles were oriented by vibration at an amplitude of 0.3 mm/sec for at least 1 min, to ensure that the particles were substantially parallel to the mold base. A metal weighted cylindrical piston having a diameter suitable to fit into the mold was covered at one end with reinforced Teflon®. This coated extremity was delicately placed on the previously oriented particles. The cylindrical weight was slowly rotated within the mold to ensure the particles were properly packed and aligned. The liquid overflow was gently absorbed. Structures comprising for example GO flakes were prepared by this process. When desired, pressure was then applied to the piston using a hydraulic press (Mazzola & Co. W20) at predetermined force of up to 15 tons. Structures comprising for example glass flakes were prepared with this additional pressure step. The applied pressure compresses the structure, altering its thickness and bulk density. Adequate pressure can, in some instances, make the structure self-supporting upon removal from the mold. The pressed disc was then subjected to mild pressure for at least 12 hours while being maintained at 95° C. in a vacuum oven. Following this first drying step and subsequent cooling to room temperature, the resulting dehydrated disc was removed from the mold and further dried at 400° C. overnight to achieve improved desiccation.

Figure 12A:
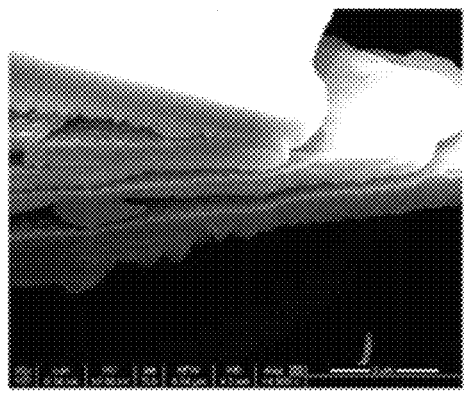
FIGS. 12A-12I show photomicrographs of cross sections and top views of particulated structures prepared according to some embodiments of the present invention.
Figure 12B:
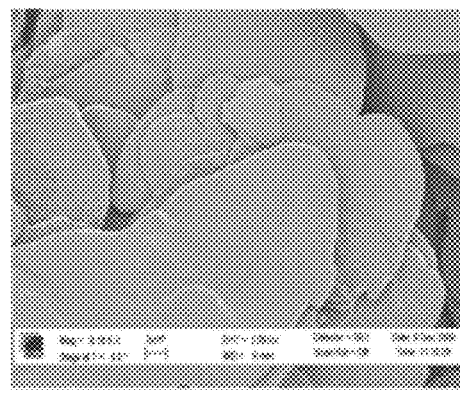
Figure 12C:
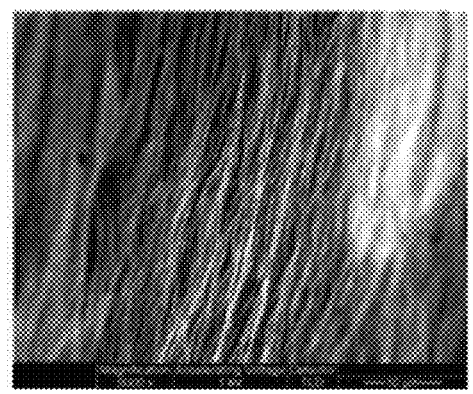
Figure 12D:
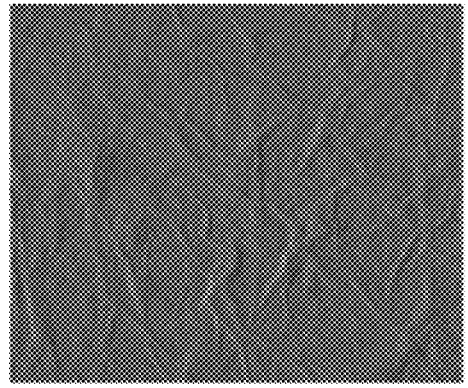
Figure 12E:
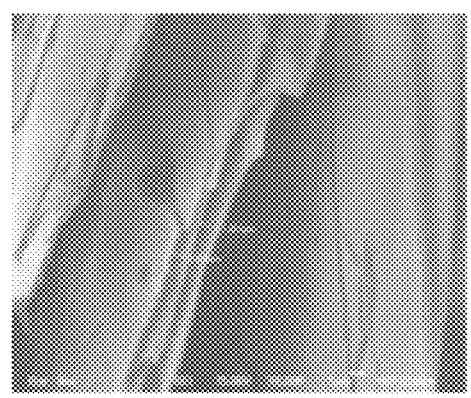
Figure 12F:
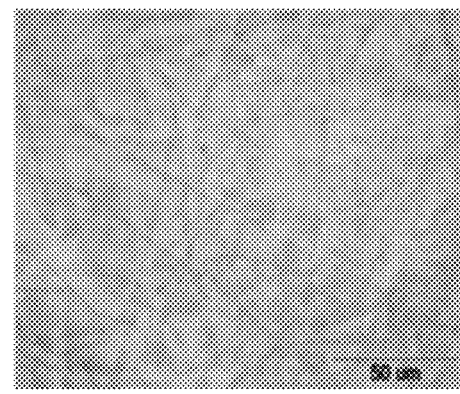
Figure 12G:
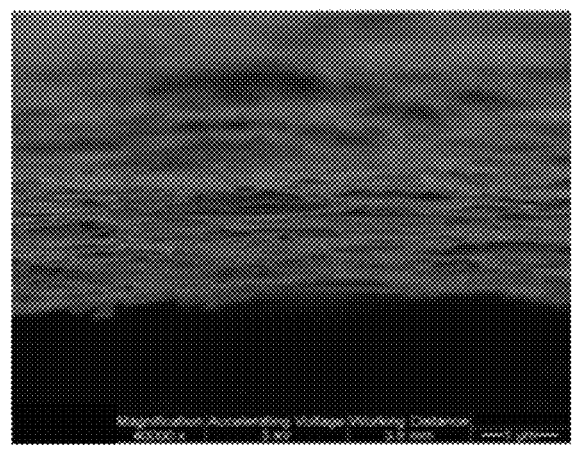
Figure 12H:
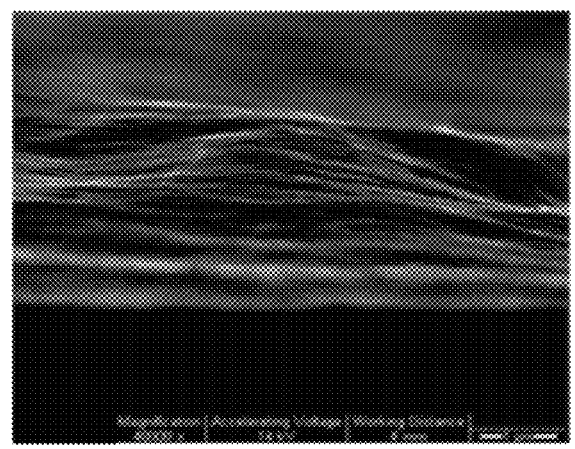
Figure 12I:
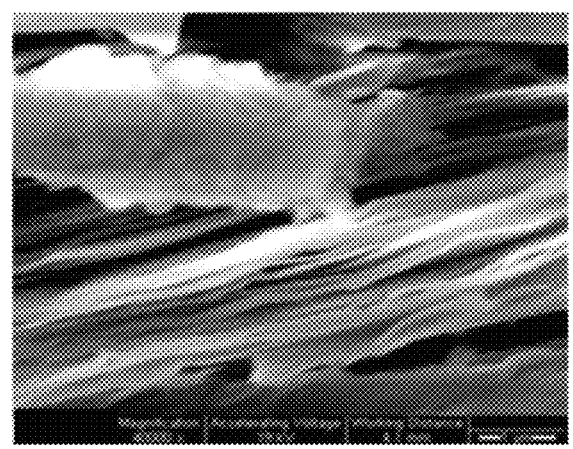

The same procedure was used to prepare particulated structures comprising expanded vermiculite (see item 6 Table 4). FIG. 12I displays a cross section of this particulated structure, as established by SEM.

Without wishing to be bound by any particular theory, it is believed that, in the case of certain materials, such as aluminum flakes, the pressure applied on the particles in the mold generates a sufficient level of adhesion between adjacent surfaces to enable the resulting cohesive structure to be self-supporting. The level of surface adhesion depends on the type and morphology of the particles, as well as on the applied pressure and on the duration of the process. Preferably, this process is used for particles made of, coated with, or spaced by a material having poor conductivity so that the partial adhesion of adjacent surfaces does not significantly degrade the overall efficiency of the structure. The particulated structure discs so prepared had a diameter of about 25 or about 52 mm, a thickness ranging from about 33 µm to about 2 mm and a percent void volume ranging from about 34% to about 77%.

Spin-Coating

In the second technique, the structure was fabricated by spin-coating. The particles were suspended in an organic solvent at a weight by weight concentration of up to 10% to obtain low viscosity mixtures. Polished D2 steel discs, having a diameter of about 52 mm, a thickness of about 5 mm, and less than 50 nm roughness, served as support substrates. The periphery of the disc was beveled to avoid thickness buildup at the outer edges of the end product. In some cases, the discs were coated with a thin layer of adhesive primer (for instance using the supernatant of settled MicroLite® HST-XE 20 in the case of MicroLite® flakes or a thin layer of gold in the case of exfoliated GO) so as to increase initial adhesion of the materials to the steel substrate. The discs, either pre-coated or not with adhesive primer, were placed on a spin head and thoroughly wetted (until overflow) with the slurry suspension. The rotation speed was then set to 200 RPM. The thin layer of material remaining on the substrate disc was then dried with a hot air blower while spinning. The temperature near the disc surface was monitored by a thermocouple (Fluka) and did not exceed 60° C. In the case of GO which was reduced by continuous UV irradiation during the coating process, the exfoliated GO nanoplatelets were suspended at 0.1-1% by weight in a solution of 1% by weight acetic acid and the primer adhesive layer was a thin coat of gold sputtered on the steel support disc. A UV lamp (190-400 nm) was placed about 10 cm above the disc being spin coated.

When the layer appeared dry, the spinning was stopped and the coating-spinning-drying steps were repeated (with concomitant UV irradiation when relevant) until the desired thickness was achieved. Each single spin coating cycle increased the thickness of the particulated structure by about one to five fold the thickness of an individual particle. The discs coated with the particulated structures were then further dried at 95° C. in a vacuum oven for 4 hours at 1-25 mbar. Following this preliminary drying step, the particulated structures were transferred to a furnace (Ney Vulcan 3-1750) where they were desiccated and the GO further reduced at a temperature which was gradually increased from room temperature to at least 200° C. at a rate of about 1° C./min. The discs were then held at a maximal temperature which was selected below the bulk melting point of the particles, for at least two more hours and were then removed from the furnace for cooling. Some of the particulated structures were gently separated from the steel support plate by heating to 600° C. for at least 1 hour. When the final thickness of the particulated structures was from about 1 μm to about 10 μm, they were used as-is, supported by the steel substrate disc. However, when the final thickness of the particulated structures was from about 10 μm to about 50 μm, they could be removed from the substrate as self-supporting structures.

Rod-Coating

The third technique used a rod coating machine. In rod coating, a cylindrical rod traverses across a carrier sheet which is supported on a flat surface. The traversing motion of the rod both spreads and meters the liquid (in this case a slurry) leaving a uniform coating on the carrier sheet. It is believed that the shearing forces of the rod on the slurry provide for the organization and orientation of the platelets in the structure. The thickness of the final particulated structure was controlled by the type and speed of the moving rod, and by the gap between the rod and the carrier sheet. The carrier sheet was coated with Teflon® backed with adhesive (Kastilo 5038 AP) to facilitate easy release of the coated structure from the carrier sheet substrate. A suspension of 3% to 4% wt/wt of exfoliated GO prepared and purified as above described was prepared in 1% wt/wt acetic acid. This suspension was used to produce the structure using a standard smooth rod with no patterning. The speed of the coating was constant and the rod was positioned at a height of about 250 μm above the coated carrier sheet. The resulting film of GO was dried with an air blower set not to exceed a coating temperature of about 70° C. A change in color from deep brown to mat black indicated that most of the solvent was successfully removed from the particulated structure. It is assumed that this process caused only minimal GO reduction as compared to the aforementioned fabrication method in which the GO flakes were exposed to UV irradiation to effect at least partial reduction. The same procedure was used for preparing particulated structures in which the inter-particle voids are maintained by spacers. In these experiments, the spacers were polyhedral oligomer silsesquioxane (POSS) nanoparticles (Hybrid Plastics) having an average diameter of about 1.5 nm. The spacer nanoparticles were added at 5% by weight of exfoliated GO. The suspension comprising the exfoliated GO and the POSS spacers nanoparticles was used to prepare a film using the rod coater as previously described.

Graphite can be milled by any conventional method, such as two roll mill, bead mill and mortar mill. In order to obtain a surface area of at least 250 m²/g, flakes having a thickness of less than 100 nm and x-y dimensions of at least 0.5 μm are typically desired. Graphite flakes having initial dimensions of about 25-75 μm (Asbury graphite 3763) were conventionally milled in either Isopar® G or L (Exxon Mobile), optionally with a surfactant, and the resulting BET value was 250 m²/g. The percent of solids in the resulting solution of milled graphite was determined in a moisture analyzer (Sartorius MA-150) and was found to be 27.5% (per weight of the total composition). An oil compatible surfactant was added to the solution at a ratio of 30% per weight of milled graphite. The surfactant and the milled graphite were mixed by high shear mixer at 24,000 RPM for at least 5 minutes. The mixed solution was introduced in the above described rod coating machine with a substrate carrier made of 100 μm thick paper. The velocity of the rod was 3.3 cm/sec and the rod was smooth. The resulting sheet was dried for 24 hrs in a vacuum oven at 60° C. and 100 mbar. FIG. 12G displays a cross section of this particulated structure as established by SEM.

Spraying

The fourth technique for the preparation of particulated structures was based on air spraying. An air spray gun (Mini jet spray gun K-350 HVLP nozzle size 0.5 mm) was used to spray a target substrate with particles suspended in a suitable carrier liquid. In some instances, the suspension also included nanoparticle spacers. The air flow and the spray nozzle were adjusted to achieve uniform coating of the substrate. Though various concentrations of solids were used, there was no clogging of particles in the nozzle. In one example, to fabricate a sheet of GO, a dispersion comprising 1% exfoliated GO solids in 1% acetic acid was applied by air spray onto a preheated hot surface (80° C.) covered with Teflon® backed with adhesive (Kastilo 5038 AP). The hot Teflon® substrate was sprayed from a distance of about 10 cm and a uniform coating of GO flakes was formed thereon. Once the first layer of wet film was dried by the heated substrate and changed in color from deep brown to mat gray, the coating procedure was repeated until the desired thickness was achieved.

In separate preparations, the GO flakes (0.1% in ethanol) were sprayed on permanent supports. For this purpose, the supports were dipped into ethanol solutions of either 1% aminosilane or 1% mercaptosilane, both known to efficiently bind between GO and surfaces of choice. Aminosilane was used to bind GO to glass and mercaptosilane was used to enhance the adhesion of GO to gold. After 10 minutes in the binder solution, the supports were washed with isopropanol and dried under a flow of nitrogen. The pretreated supports were then immediately coated (by dipping) with the GO suspension to allow initial binding between the reactive silanes and the relevant groups on the GO flakes. The pretreated and primed supports were then dried and sprayed with GO as previously described. When structures comprising reduced GO were desired, the process was performed with exposure to UV between each layer followed by thermal reduction at 200-1,000° C. for about 12 hrs in vacuum oven. The extent of GO reduction was determined by contact angle measurement (Krüss EasyDprop DO-4010) and four point probe testing the bulk resistivity of the structure. Structures displaying a contact angle of at least 80° and a bulk resistivity of less than 1,000 Ω·cm were considered suitably reduced.

The same spraying procedure was used for preparing particulated structures comprising MicroLite® (i.e. exfoliated vermiculite). In this case, a layer of primer coat (MicroLite® HTS-XE20; having a percent solid content of 17.5% and an OSP of less than 33%) was applied with a paint brush on the adhesive backed Teflon® support which was placed on a 60° C. hot surface. After the primer coat dried, displaying a mat finish, a solution comprising 7.5% solid of MicroLite® 923 was applied by air spray from a distance of about 10 cm onto the primed preheated substrate. Once the first layer of wet film was dried by the heated substrate and changed his shining finish to a mat one, a second layer was sprayed, the coating procedure was repeated until the desired thickness was achieved. FIG. 12H displays a cross section of this particulated structure as established by SEM.

The same procedure was used for preparing particulated structures in which the inter-particle voids are maintained by spacers. In these experiments, the spacers were polyhedral oligomer silsesquioxane (POSS) nanoparticles having an average diameter of 1.5 nm and silica nanoparticles having an average diameter of about 20, 35 and 50 nm (respectively, NexSil™ 20A, 35A and 85A from the acidic colloidal silica series of Nyacol Nano Technologies, Inc.). The spacer nanoparticles were added at 5% by weight of exfoliated GO. The suspension comprising the exfoliated GO and the spacer nanoparticles was air sprayed on a Teflon® coated support substrate as previously described.

Although in the present example the thickness was selected to allow peeling of the GO sheet from the Teflon® substrate to yield a self-supporting structure, thicker or thinner layers can be fabricated by controlling the slurry composition and the number of individual spraying cycles. In some instances, structures may be formed by spraying directly onto substrate surfaces able to be used as surface electrodes in the power source device.

Use of Mechanical Holder

The fifth manufacturing technique included application of pressure on the particles to form the desired structure using a mechanical holder designed to confine and maintain the particle structure in a desired shape, such as a disc. Unlike the aforementioned "molding" method, in which pressure on the structure was relieved in order to remove the self-supporting structures from the mold, mechanical pressure in the present method was maintained also during the subsequent stages of surface modification and current generation of the device. Although applicable for any suitable particulate material, this method is particularly useful for particles which do not readily lend themselves to fabrication into self-supporting structures.

The particles were placed in an inner cylindrical container, about 30 mm in diameter. The lower base plate and upper piston of the container were made of a material selected to serve as electrodes during the modification process and the current measurement phase of the experiment (see 613 and 621 below). The upper piston was removable. The external diameter of the cylindrical mechanical holder was about 50 mm to allow it to easily fit into the experimental set up to be later described. The peripheral edges of this removable cylindrical holder were made of Teflon®, constituting a non-conductive ring allowing confinement of the structures in the horizontal direction. The Teflon® ring, which allows penetration of gas and liquids, can be modified to allow any desired height of structure, from a tens of microns to several millimeters in thickness, and similarly different mechanical holders could accommodate rings or other shapes having any suitable dimensions. Following the insertion of the particles, the piston electrode was screwed down, pressing the particles into the shape of the mold. The amount of particles, and to some extent their individual shape and size, together with the pressure applied by the piston determine the thickness of the structure within the mechanical holder. For example, about 1.5 g of 100 nm uncoated aluminum flakes yielded a disc structure having a diameter of 30 mm and an approximate thickness of 2 mm. Once the particles were maintained in place by the applied pressure of the bolted piston, the Teflon® ring was optionally removed. Removal of the Teflon® retaining ring enables access to the outer periphery of the particulated disc. This is particularly useful in the case of conducting platelet-like particles which tend not only to orient themselves parallel to the base plate and piston surfaces, but also parallel to the peripheral Teflon® ring surface such that, at the outer edges the particles are oriented perpendicular to the electrode surfaces, which could lead to electrical shunting of the outer diameter of the disc. To prevent this, once the Teflon® retaining ring was removed, the outer perimeter of the disc was made easily accessible and could be brushed or scraped in order to remove the outermost oriented layers of particles. This procedure has the added benefit of increasing the accessibility of the inner volume of the structure to modifying fluids, if relevant, and to the gas medium during modification and current measurement.

Generally speaking, when the particles were made of material having poor bulk conductivity, no additional spacers were used and the distance between the opposing surfaces of the particles was determined largely by the particle surface roughness. Thus the gap between particles varied across the particle surfaces from 0 (contact) to tens or hundreds of nanometers in other areas depending on the size and distribution of the roughness features. When the particles were made of conductive material, insulating spacing means were employed as further detailed hereinabove. The height of the spacers along the z direction (generally perpendicular to the surface of the electrodes) can be from several to hundred nanometers. For example, mechanically held structures based on uncoated aluminum flakes were prepared with 0.5% by weight of silica spacers having an average diameter of about 20 nm (NexSil™ 20A).

The mechanical holder was also used for preparing particulated structures in which spacers were used despite the a priori low conductivity of the composing platelets. In these experiments, the spacers were silica nanoparticles having an average diameter of about 20, and 50 nm (respectively, NexSil™ 20A, 35A and 85A from the acidic colloidal silica series of Nyacol Nano Technologies, Inc.). The original suspensions of silica spacer nanoparticles were diluted with double distilled water to 0.3% by weight. 2.5 ml of the diluted suspensions were added to 1.5 g of dry silica-coated aluminum flakes (i.e. 0.5% weight spacer per weight nanoflakes) and the resulting preparation was thoroughly mixed for 5 minutes to ensure maximal coverage of the flakes. The spacer wetted flakes were dried in vacuum oven (50° C., 100 mbar) for at least 12 hours. HSEM analysis indicated that aluminum flakes prepared by this method displayed a surface area coverage of about 20-40% by the desired spacers. When the spacer coverage was calculated based on the relative amounts of platelets and spacers and their respective density, size and surface cross sections, the estimated average coverage was found to be of only 4%. This discrepancy between the observed and the calculated spacer coverage is not unexpected, the HSEM analysis representing only a single point estimate as compared to the calculated spacer coverage which addresses average coverage.

The prepared particulated structures were analyzed by microscopy. The following instruments were used: light microscope (Olympus PX71), confocal microscope (LEXT 3000 and LEXT 4000 from Olympus), Atomic Force Microscope (AFM) (diMultimode V model with "Nanoscope 5" controller from Veeco), high resolution scanning electron microscope (HRSEM; FEI Magellan 400), focused ion beam (FEI, Helios 600).

The particulated structures were also analyzed by BET surface analysis (ASAP 2020 Micromeritics) and X-ray diffraction (XRD) techniques, as known in the art of nanomaterials.

Representative views of the particulated structures are shown in FIGS. 12 A-I. FIGS. 12 A, C, E and G-I are cross-sections and FIGS. 12 B, D and F are top views of the particulated structures. The pictures were obtained by SEM microscopy, except for the top view of the structure comprising GO (FIG. 12D), which was taken from an AFM and the structure comprising glass flakes (FIG. 12F), which was taken using a regular optical microscope. The magnification of these images is as follows: FIG. 12A (×14,000) and FIG. 12B (×15,000), for structures comprising uncoated aluminum flakes; FIG. 12C (×5,000) and FIG. 12D (frame of 2 μm×2 μm), for structures comprising exfoliated GO flakes; FIG. 12E (×4,000) and FIG. 12F (×40), for structures comprising glass flakes; FIG. 12G (×40,000) for structures comprising Graphite; FIG. 12H (×40,000) for structures comprising exfoliated vermiculite; and FIG. 12I (×40,000) for structures comprising expanded vermiculite.

The volume occupied by inter-particle voids was determined, as a percentage of the total volume of the particulated structure, in the following manner. The weight of the particulated structure assuming zero void volume (bulk weight) was estimated by multiplying the volume of the structure, based on its measured dimensions, by the density of the material from which the particles are made (e.g., glass density is 2.5 g/cm$^3$). This estimated bulk weight is denoted $W_B$. The actual weight of the particulated structure was measured. This measured weight is denoted $W_P$. The percentage of inter-particle voids was then defined as the ratio $(W_B-W_P)/W_B$. Although the percentage of inter-particle voids is also affected by the type and morphology of the materials being used, for a given kind of particles, the percentage as defined above was considered an indicator of spacing between the individual surfaces, wherein structures having a lower percentage of inter-particle voids were deemed having smaller gaps between opposing surfaces. Note that the above calculation was made under the assumption that the final particulated structure is dry or comprises a negligible amount of solvent. If following drying the particulated structure comprises a non-negligible amount of surface adsorbed solvent, the above calculation understates the percentage of inter-particle voids.

Results

The information on the particulated structures prepared by these methods is presented in Table 4. The dimension indicated in the Material column relates to the approximate thickness of an individual particle. The reported force (Ton) relates to the force applied per structure of given dimensions. NA indicates that the information for a specific entry is not available.

TABLE 4

| No. | Material | Method | Weight (g) | Diameter (cm) | Final Thickness (μm/mm) | % Void Volume |
|---|---|---|---|---|---|---|
| 1 | Glass flakes 100 nm | Manual Press | 0.90 g | 5.2 cm | 70 μm | 77% |
| 2 | Glass flakes 100 nm | Hydraulic Press 1.5 T | 0.86 g | 5.2 cm | 42 μm | 65% |
| 3 | Glass flakes 100 nm | Hydraulic Press 4 T | 0.94 g | 5.2 cm | 33 μm | 48% |
| 4 | Glass flakes 100 nm | Hydraulic Press 10 T | 0.96 g | 5.2 cm | 34 μm | 48% |
| 5 | Glass flakes 1 μm | Hydraulic Press 10 T | 2.14 g | 5.2 cm | 70 μm | 43% |
| 6 | Expanded Vermiculite | Hydraulic Press 10 T | 3.00 g | 5.2 cm | 1-2 mm | 38% |
| 7 | Perlite | Hydraulic Press 10 T | NA | 5.2 cm | NA | NA |
| 8 | Uncoated Al flakes 100 nm | Hydraulic Press 10 T | 5.00 g | 5.2 cm | 1-2 mm | 34% |
| 9 | Silica Coated Al flakes 300 nm | Hydraulic Press 10 T | 5.00 g | 5.2 cm | 1-2 mm | 34% |
| 10 | MicroLite ® | Spin Coating 10 steps | 0.08 g | 5.2 cm | 10-50 μm | 44% |
| 11 | GO flakes 3 nm | Spin Coating 7 steps | NA | 5.2 cm | NA | NA |
| 12 | UV Reduced GO 3 nm | Spin Coating 7 steps | NA | 5.2 cm | NA | NA |
| 13 | GO flakes 3 nm | Wire Rod Coating | 0.04 g | 5.2 cm | 10-30 μm | 10% |
| 14 | GO flakes 3 nm + POSS spacers 1.5 nm | Wire Rod Coating | 0.01 g | 5.2 cm | 11 μm | 72% |
| 15 | Graphite 1-100 nm | Wire Rod Coating | 0.01 g | 4 cm | 150 μm | 76% |
| 16 | GO flakes 3 nm | Air Spraying 20 steps | 0.05 g | 5.2 cm | 20-30 μm | 62% |
| 17 | GO flakes 3 nm + silica spacers 20 nm | Air Spraying | 0.01 g | 5.2 cm | 25 μm | 75% |

TABLE 4-continued

| No. | Material | Method | Weight (g) | Diameter (cm) | Final Thickness (μm/mm) | % Void Volume |
|---|---|---|---|---|---|---|
| 18 | GO flakes 3 nm + silica spacers 35 nm | Air Spraying | 0.004 g | 5.2 cm | 12 μm | 80% |
| 19 | GO flakes 3 nm + silica spacers 50 nm | Air Spraying | 0.005 g | 5.2 cm | 8 μm | 56% |
| 20 | MicroLite ® | Air Spraying | 0.23 g | 5.5 cm | 150 μm | 75% |
| 21 | Uncoated Al flakes 100 nm | Mechanically Held | 1.50 g | 3.0 cm | 2 mm | NA |
| 22 | Uncoated Al flakes 100 nm + 20 nm silica spacers | Mechanically Held | 0.25 g | 3.0 cm | 1 mm | NA |
| 23 | Silica Coated Al flakes 300 nm + silica spacers 20 nm | Mechanically Held | 0.25 g | 3.0 cm | 1 mm | NA |
| 24 | Silica Coated Al flakes 300 nm + silica spacers 35 nm | Mechanically Held | 0.25 g | 3.0 cm | 1 mm | NA |
| 25 | Silica Coated Al flakes 300 nm + silica spacers 50 nm | Mechanically Held | 0.25 g | 3.0 cm | 1 mm | NA |

The particulated structures prepared as above described showed good homogeneity and mechanical stability. These structures were used either as-is, without further coating, or coated on at least one side, for instance by sputtering, as described in the following example. The particulated structures both before and after sputtering, were stored in a dessicator until their use in the devices of the invention. The structures prepared in the mechanical holder were generally used for current measurement experiments directly following surface modification without intermediate storage.

Example 5

Sputtering of Surfaces

The present example describes experiments performed to deposit on at least one of the outermost external surfaces of the particulated structures of the invention a thin and continuous layer of material emitted by cathode sputtering. This method was also used to prepare samples used in the Kelvin Probe measurements of Example 2 and in the electrical measurements of Example 8.

Materials and Methods

Sputtering is widely used to either apply thin films by depositing material from a target onto a substrate or to remove unwanted films in a reversal of this process. Sputtering methods are known in the art of thin film coating (see for instance chapters 4 and 5 in the $2^{nd}$ edition of "Materials science of thin films" by Milton Ohring, 2001).

The sputtering process, achieved by bombarding the target material with argon gas ions to coat the opposing substrate, took place inside a vacuum chamber under low base pressure of down to about $2.7 \times 10^{-7}$ mbar. The sputtering was performed using an ATC Orion 8 HV sputtering system (AJA International Inc). The sputtering system, included a DC and an RF power sources, and was customized to accommodate up to four 3" targets (about 7.62 cm), which allowed performing sequential sputtering with different materials or co-sputtering with combinations of different materials. The sputtering system was also able to accommodate reactive gases, such as $CH_4$, $N_2$, $O_2$ and the like, to perform reactive sputtering. This was used for instance to perform reactive sputtering of Manganese in the presences of Ar and $O_2$ at a flow ratio of 10:5 sccm, which resulted in the deposition of a layer of Manganese oxide (See items 28-30 in Table 5). All gases used for sputtering were at least 99.99% pure. The system was optimized to achieve thickness uniformity with variations of less than 1% on substrates of up to about 15 cm in diameter.

The following structures were used as substrates: (i) particulated structures were prepared as described in Example 4 and are listed and detailed in Table 4 (ii) discs of Aluminum (Al, AL6061-T4) or Stainless Steel (S/S, AISI303) having 50 mm or 25 mm in diameter, 5 mm in thickness and no more than 100 nm in roughness; (iii) Thin Glass Discs (TGD, Menzel-Gläser Inc.) having 30 mm or 50 mm in diameter, 100 μm in thickness and less than 50 nm in roughness; (iv) Square Thick Glass (STG, Menzel-Gläser Inc.) having 30 mm in length, 25 mm in width, 1 mm in thickness and less than 50 nm in roughness (v) Float Glass Discs (FGD, Perez Brothers, Israel) having 40 mm or 50 mm in diameter, 5 mm or 10 mm in thickness and less than 10 nm in roughness; (vi) double side polished silicon (Si) wafer discs (Virginia Semiconductor Inc.) having 50.8 mm in diameter, 300 μm in thickness, at most 1 nm in roughness, crystallographic orientation <100> and electrical resistivity of 8-12 Ω·cm or 0.1-1.2 Ω·cm of boron (B) dopant, or 8-12 Ω·cm or 0.7-1.3 Ω·cm of phosphorous (P) dopant; (vii) single side polished Si wafer discs (Virginia Semiconductor Inc.) having 50.8 mm in diameter, 350 μm in thickness, crystallographic orientation <111> and electrical resistivity of 7-10 Ω·cm of phosphorous (P) dopant; (viii) single side polished Indium Antimonide (InSb) wafer discs (China Rare Metal Material Co.) having 50.8 mm in diameter, 500 μm in thickness, crystallographic orientation <111> and telluride (Te) doped (0.0004 Ω·cm); and (ix) single side polished Gallium Arsenide (GaAs) wafer discs (Institute of Electronic Materials Technology Inc.) having 50.8 mm in diameter, 500 μm in thickness, crystallographic orientation <111> and telluride doped (0.016 Ω·cm).

When not supplied by the manufacturer, the roughnesses of the substrates were determined by surface profilometer (Veeco—Dektak 3ST).

The following materials were used as target materials to ultimately coat, alone or in combination, the substrates: Aluminum (Al), Aluminum nitride (AlN), Barium titanate ($BaTiO_3$), Boron nitride (BN), Calcium fluoride ($CaF_2$), Calcium oxide (CaO), Chromium (Cr), Chromium silicide ($Cr_3Si$), Copper (Cu), Carbon (C), Gadolinium (Gd), Gold (Au), Hafnium (Hf), Indium Tin Oxide (ITO), Lanthanum hexaboride ($LaB_6$), Lanthanum oxide ($La_2O_3$), Manganese (Mn), Molybdenum (Mo), Nickel (Ni), Palladium (Pd), Palladium-gold (Pd—Au), Platinum (Pt), Silica ($SiO_2$), Strontium oxide (SrO), Tantalum (Ta), Titanium (Ti), Tungsten (W), Tungsten trioxide ($WO_3$), Yttria ($Y_2O_3$), Zinc (Zn), Zirconium oxide ($ZrO_2$), and Mineral Glass. The purity of each target material was at least 99.9% (excluding the Mineral Glass target which has an unknown purity). All target materials were purchased from AJA International Inc. or Kurt Lesker Company, except the Mineral Glass supplied by Perez Brothers, Israel.

To ensure optimal adhesion and homogenous thin film deposition, the non-particulated substrates (ii)-(ix) were first cleaned by sonication in organic solvents (sequentially in n-hexane, acetone and isopropanol, for 5 minutes each), followed by rinsing under sonication in filtered deionised water for one minute, and drying under a nitrogen gas stream. Prior to sputtering, the cleaned non-particulated substrates underwent plasma etching to remove any residual organic/non-organic contamination from the surface using typically 20 minutes plasma at $4\times10^{-3}$ mbar, 30 W RF power, 10 Sccm Ar.

Results

Selected examples of the thin coatings so prepared on any of the previously described substrates (i)-(ix) are presented in Table 5. Listed in Table 5 are the main sputtering conditions, including the type of power supply and its strength (watts), the temperature the sample holder was heated (° Celsius), the flow rate of the gases (standard cubic centimeters per minute, sccm), the pressure in the chamber (mbar), and the duration of the sputtering (seconds). The thickness (nm) of the resulting coatings was determined by surface profilometer. NA indicates that a certain entry is not applicable (e.g., the substrate was not heated or the thickness not measured).

In all following examples, the distance between the target and the substrate was 146 mm. Sputtering was performed on one or both sides of the substrate, with same or different materials, as desired. Layers of different materials could be sequentially applied by this method, for instance all glass substrates (TGD, FGD and STG) were generally first entirely sputtered on both sides with a thin layer of 15 nm Chromium for two minutes for better adhesion of the following thin layers. When the desired outermost layer was very thin (e.g., less than 20 nm), the supports were used directly with no intermediate chromium layer. Any other sequential sputtering could be performed and for instance some supports were first coated with a layer of 210 nm $LaB_6$ followed by a layer of 20 nm $SiO_2$ under the conditions below detailed in Table 5. Two materials or more could be co-sputtered, as indicated by a colon between the targets which were used simultaneously (e.g., $Cr:SiO_2$, $Cr_3Si:SiO_2$, Mn:Cu, Ni:Mn). In such case, the power refers to the one applied for each target. In a similar manner, two targets could be used in asymmetrical amounts so that one material served as dopant to the other. This was the case for supports sputtered with $SiO_2$ which were, when desired, co-sputtered with Aluminum. For this purpose, the $SiO_2$ target was partially covered with an aluminum foil that accounted for about 10% of the target surface.

When different conditions are available, one asterisk indicates the coatings that were typically applied upon structures comprising graphite oxide. Some samples were heated during the sputtering process as indicated in column 4, Table 5. Two asterisks indicate that following the sputtering procedure, the samples were post-annealed for one hour at 550° C., at $10^{-6}$ mbar. Three asterisks indicate the samples which were sputtered with nitrogen ($N_2$) or methane ($CH_4$) for reactive sputtering or doping, respectively. For example, when the substrates were sputtered with aluminum nitride under heating conditions of 500° C., there was a flow of reactive nitrogen of 15 sccm, whereas unheated substrates were sputtered in presence of 0.5 sccm doping methane, each in addition to the relevant argon flow. Similarly, the unheated substrates sputtered with boron nitride were deposited in presence of 10 sccm argon and 0.5 sccm methane for doping purposes.

TABLE 5

| Target | Power supply | Power [w] | Temp. [° C.] | Ar flow [sccm] | $O_2$ flow [sccm] | Pressure [mbar] | Time [s] | Film thickness [nm] |
|---|---|---|---|---|---|---|---|---|
| Au | DC | 70 | NA | 10 | 0 | $4 \times 10^{-3}$ | 1,320 | 200 |
| Al | DC | 100 | NA | 10 | 0 | $4 \times 10^{-3}$ | 10 | 0.5 |
| Al | DC | 200 | NA | 10 | 0 | $4 \times 10^{-3}$ | 2,700 | 300 |
| Al | DC | 100 | NA | 10 | 0 | $4 \times 10^{-3}$ | 3,600 | 200* |
| Al | DC | 100 | NA | 10 | 8 | $4 \times 10^{-3}$ | 64,800 | NA |
| AlN*** | RF | 300 | 500 | 10 | 0 | $4 \times 10^{-3}$ | 14,400 | 200** |
| AlN*** | RF | 200 | NA | 30 | 0 | $4 \times 10^{-3}$ | 14,400 | 200** |
| BN | RF | 200 | 500 | 10 | 0 | $4 \times 10^{-3}$ | 10,800 | 300 |
| BN*** | RF | 200 | NA | 10 | 0 | $4 \times 10^{-3}$ | 10,800 | 300 |
| Carbon | RF | 200 | NA | 10 | 0 | $4 \times 10^{-3}$ | 18,540 | 200 |
| $CaF_2$ | RF | 200 | 350 | 10 | 0 | $4 \times 10^{-3}$ | 28,800 | 500 |
| Cr | DC | 200 | NA | 10 | 0 | $4 \times 10^{-3}$ | 120 | 15 |
| Cr | DC | 200 | NA | 10 | 0 | $4 \times 10^{-3}$ | 2,700 | 340 |
| Cr | DC | 100 | NA | 10 | 0 | $4 \times 10^{-3}$ | 3,600 | 200* |
| $Cr:SiO_2$ | DC:RF | 50:250 | NA | 10 | 0 | $4 \times 10^{-3}$ | 3,600 | 180 |
| $Cr_3Si:SiO_2$ | DC:RF | 190:75 | NA | 10 | 0 | $4 \times 10^{-3}$ | 5,400 | 540 |
| Gd | DC | 80 | NA | 10 | 0 | $4 \times 10^{-3}$ | 13 | 2 |
| Gd | DC | 80 | NA | 10 | 0 | $4 \times 10^{-3}$ | 1,320 | 210 |

TABLE 5-continued

| Target | Power supply | Power [w] | Temp. [° C.] | Ar flow [sccm] | $O_2$ flow [sccm] | Pressure [mbar] | Time [s] | Film thickness [nm] |
|---|---|---|---|---|---|---|---|---|
| Gd | DC | 100 | NA | 10 | 5 | $4 \times 10^{-3}$ | 1,800 | 1,800 |
| Hf | DC | 100 | NA | 10 | 0 | $4 \times 10^{-3}$ | 3,600 | 360 |
| ITO | DC | 100 | NA | 10 | 0 | $4 \times 10^{-3}$ | 1,500 | 210** |
| $LaB_6$ | DC | 100 | NA | 10 | 0 | $4 \times 10^{-3}$ | 3,600 | 210 |
| $LaB_6$ | DC | 100 | NA | 10 | 0 | $4 \times 10^{-3}$ | 5,000 | 300 |
| $La_2O_3$ | RF | 200 | NA | 10 | 0 | $4 \times 10^{-3}$ | 9,000 | 120 |
| Mineral glass | RF | 250 | NA | 10 | 0 | $4 \times 10^{-3}$ | 28,800 | 400 |
| Mn | DC | 100 | NA | 10 | 0 | $4 \times 10^{-3}$ | 29 | 2 |
| Mn | DC | 100 | NA | 10 | 0 | $4 \times 10^{-3}$ | 5,100 | 360 |
| Mn | DC | 100 | NA | 10 | 5 | $4 \times 10^{-3}$ | 57,600 | 750 |
| Mn | DC | 100 | NA | 10 | 5 | $4 \times 10^{-3}$ | 122,400 | 1,500 |
| Mn | DC | 100 | NA | 10 | 5 | $4 \times 10^{-3}$ | 201,600 | 2,500 |
| Mn:Cu | DC:DC | 25:100 | NA | 10 | 5 | $4 \times 10^{-3}$ | 216,000 | 580 |
| Mo | DC | 100 | NA | 10 | 0 | $4 \times 10^{-3}$ | 4,200 | 330 |
| Ni | DC | 100 | NA | 10 | 0 | $4 \times 10^{-3}$ | 4,800 | 370 |
| Ni | DC | 100 | NA | 10 | 0 | $4 \times 10^{-3}$ | 2,700 | 200* |
| Ni | DC | 150 | NA | 10 | 8 | $4 \times 10^{-3}$ | 25,200 | 500 |
| Ni | DC | 150 | NA | 10 | 8 | $4 \times 10^{-3}$ | 50,400 | 1,000 |
| Ni | DC | 150 | NA | 10 | 8 | $4 \times 10^{-3}$ | 126,400 | 2,500 |
| Ni:Mn | DC:DC | 60:90 | NA | 10 | 8 | $4 \times 10^{-3}$ | 18,000 | 300 |
| Pd | DC | 80 | NA | 10 | 0 | $4 \times 10^{-3}$ | 2,100 | 230 |
| Pt | DC | 100 | NA | 10 | 0 | $4 \times 10^{-3}$ | 1,600 | 200 |
| $SiO_2$ | RF | 250 | NA | 10 | 0 | $4 \times 10^{-3}$ | 1,080 | 20 |
| $SiO_2$ | RF | 250 | NA | 10 | 0 | $4 \times 10^{-3}$ | 18,000 | 500 |
| Ta | DC | 100 | NA | 10 | 0 | $4 \times 10^{-3}$ | 2,500 | 300 |
| Ti | DC | 200 | NA | 10 | 0 | $4 \times 10^{-3}$ | 4,500 | 360 |
| W | DC | 200 | NA | 10 | 0 | $4 \times 10^{-3}$ | 3,600 | 430 |
| W | DC | 200 | NA | 10 | 0 | $4 \times 10^{-3}$ | 1,380 | 200* |
| $WO_3$ | RF | 200 | NA | 10 | 5 | $4 \times 10^{-3}$ | 8,400 | 500 |

Structures having at least one of their outermost surfaces prepared according to the above described method were eventually subjected to surface modifications (as detailed in the following Example) and used in the experimental setup schematically illustrated in FIG. 7 (as detailed in Examples 7 and 8 below). The work function of some of the structures so prepared was assessed in vacuum and/or in the present of various gases by Kelvin Probe as described in Example 2.

Example 6

Modification of Particle Surfaces

The present example describes experiments performed in accordance with some embodiments of the present invention for modifying the surfaces of the particles to provide particles in which opposing surfaces have different charge transferabilities.

In the present example, the surfaces, which can be made of materials having a priori the same or similar charge transferability, are first organized into particulated structures, for instance as described in Example 4 above. The structures, wherein the opposing surfaces within each cell device of the particulated structures can be considered essentially symmetrical in terms of their charge transferability, are modified, according to some embodiments of the present invention, to break the symmetry and induce different charge transferabilities on the opposing surfaces.

Experiment I

Methods

In this experiment, the particulated structures were prepared with surface electrodes having different work function. The individual particles can be viewed as subjected to a permanent electric field created solely by the difference in the work function of the surface electrodes, without application of voltage from an additional power source. Structures coated on each external face with a different material were prepared by sputtering as described in Example 5 above. A disc of phlogopite mica having a diameter of 50 mm and 10 μm thick was cut from a block of 5×10 cm having a thickness of 1 mm by intercalating a scalpel between the mica layers. The disc of phologopite mica, which could be viewed as a uniformly organized layered structure, was sputtered on one side with Aluminum and on the other side with Gold as mentioned above. The work function of the external surface electrodes was measured at room temperature in vacuum using a Kelvin Probe (Kelvin Control 07, Besocke Delta Phi).

Results

Selected examples of particulated structures having different thin coatings on each external side are presented in Table 6. In Table 6, ΔWF indicates the difference between the work function of the surface electrodes and is provided in eV. The absolute values of ΔWF between the surface electrodes ranged from about 0.00 eV (e.g., Ni/Mo) to about 1.20 eV (e.g., Au/Al). It is assumed that the strength of the electric field present between the electrodes in the absence of any voltage applied by an external power source is correlated to ΔWF. The electrode at Side 1 (electrode 1) of the structure and the electrode at Side 2 of the structure (electrode 2) were used for measurement respectively as connected (621) and grounded (613) electrodes (see FIG. 7) for current and voltage measurements.

TABLE 6

| No. | Structure comprising | Structure thickness [mm/μm] | Side 1 (621) | Electrode 1 thickness [nm] | Side 2 (613) | Electrode 2 thickness [nm] | ΔWF [eV] |
|---|---|---|---|---|---|---|---|
| 1 | 100 nm Glass flakes | 1 mm | Al | 300 nm | Ni | 370 nm | −0.80 eV |
| 2 | 100 nm Glass flakes | 1 mm | Mn | 360 nm | Ti | 360 nm | 0.05 eV |
| 3 | 100 nm Glass flakes | 1 mm | Mn | 360 nm | Mo | 330 nm | −0.50 eV |
| 4 | 100 nm Glass flakes | 1 mm | W | 430 nm | Mo | 330 nm | 0.10 eV |
| 5 | 100 nm Glass flakes | 1 mm | Mo | 330 nm | Ti | 360 nm | 0.45 eV |
| 6 | 100 nm Glass flakes | 1 mm | Ni | 370 nm | Mo | 330 nm | 0.00 eV |
| 7 | 100 nm Glass flakes | 1 mm | Ni | 370 nm | Mn | 360 nm | 0.50 eV |
| 8 | 100 nm Glass flakes | 1 mm | Mo | 330 nm | Mo | 330 nm | 0.00 eV |
| 9 | 100 nm Glass flakes | 1 mm | Ti | 360 nm | Ni | 370 nm | −0.45 eV |
| 10 | 3 nm GO flakes | 30 μm | Al | 200 nm | Al | 200 nm | 0.00 eV |
| 11 | 3 nm GO flakes | 30 μm | Al | 200 nm | Ni | 200 nm | 0.80 eV |
| 12 | 3 nm GO flakes | 30 μm | W | 200 nm | Ni | 200 nm | 0.50 eV |
| 13 | 3 nm GO flakes | 30 μm | Cr | 200 nm | Ni | 200 nm | 0.60 eV |
| 14 | 300 nm Silica coated Aluminum flakes | 0.75 mm | Pd—Au | 300 nm | Pt | 300 nm | −0.20 eV |
| 15 | Phlogopite mica | 10 μm | Au | 200 nm | Al | 300 nm | 1.20 eV |
| 16 | Expanded Vermiculite | 150 μm | Au | 200 nm | Al | 300 nm | 1.20 eV |

In the experimental setup described herein below, the surface electrodes were connected directly to a current measurement meter (Keithley) with not external resistive load. Particulated structures having surface electrodes of different work function can be further modified as described below.

Experiment II

Methods

In this experiment, electrothermal modification in a dry environment was employed.

Particulated structures prepared according to certain embodiments of the invention were inserted in the experimental set-up to be described in detail below. Briefly, a positive or negative voltage of up to 1,000V in absolute value was applied on one external side of the structure, while the other side was grounded. Typically, a negative voltage was applied to the side of the structure due to be connected to the ground in the experimental phase when current is measured (see Example 7 for details).

This experiment can be divided into three phases: heating, steady temperature and cooling. During the heating phase the temperature could be raised while voltage could be applied. At some cases the voltage was decreased as temperature was increased to prevent electrical breakdown of the structure. The steady temperature phase could last up to 24 hours in which a voltage of up to 1,000V could be applied on the structure electrodes while the sample is at constant temperature of up to 800° C. During the cooling phase the temperature was gradually decreased to ambient conditions of about 20-25° C. or other desired operative temperatures, typically between room temperature to 200° C.

A potential difference of up to 1,000V across the structure was maintained for different periods of time of up to 24 hours and while the structure was maintained at temperatures of up to 800° C. The voltage and temperature were either constant during the modification period or modified with time. In the latter case, the higher voltage was generally applied at the lowest temperature. The voltage can be applied during the heating phase, in which case the voltage was decreased as temperature was increased, or can be applied once the particulated structure reached the highest desired temperature. In any event, the voltage is applied during the cooling phase and is increased as the temperature decreased. The temperature decrease and voltage increase can occur simultaneously. The experiments were performed in vacuum conditions (pressure of at most $10^{-2}$ mbar). In some experiments the voltage was applied only during cooling, and in some experiments the voltage was applied both during heating and during the cooling phase when the temperature was gradually decreased to ambient conditions, generally about 20-25° C., or other desired operating temperatures (e.g., as illustrated in the following examples for the measurement of current).

In the present experiment, as-is particulated structures (as prepared in Example 4) and coated particulated structures (as prepared in Example 5) were used.

Results

Selected examples of modified particulated structures so prepared are listed in Table 7. The structures presented below were made of glass flakes having an individual particle thickness of about 1 μm (item 1 in Table 7) and 100 nm (items 2-7) and of silica coated aluminum flakes having individual particle thickness of 300 nm (item 8). These structures were prepared by applying pressure ranging from 11 tons to 13 tons as described in Example 4, and had an overall thickness of about 1 mm. Table 7 indicates the type of coating of each side of the respective structure and the modification conditions: voltage (V), temperature (° C.), and duration (hrs). In the Time column, the left value refers to the duration of the heating and steady phase during which the structure is at the desired modification temperature (or range thereof). The right value refers to the duration of the cooling phase only when the potential difference was continuingly applied during this phase. "NR" indicates that the voltage was no longer applied following the end of the steady maximal activation temperature. A positive voltage was applied to Side 1 of the structure, while Side 2 was grounded. In the measurement experiments (see Example 7), Side 1 was grounded, while side 2 was connected to the measurement instrument.

manufactured particulated structure in its thickness direction increased the exposure of the inner part of the particulated structure to the modifying fluids.

Electrochemical Modifications in Liquid Environment

For liquid electrochemical modification, the liquid carriers used in the present experiment comprised at least one of ultrapure double distilled water and organic solvent of high purity (e.g., above 99%) including benzene, chloroform, dimethyl sulfoxide (DMSO), ethanol, hexane, isopropanol (IPA), and methanol. In some cases, the liquid carriers also included at least one supplemental electroactive species.

For convenience, some of these electroactive species were assigned a code number (T-No.) indicated in parenthesis next to the name of an exemplary source. The electroactive

TABLE 7

| No. | Structure comprising | Side 1 | Side 2 | Voltage Applied [V] | Temperature [° C.] | Time Heating/ Cooling [hrs] |
|---|---|---|---|---|---|---|
| 1 | 1 μm Glass Flakes | Al | Al | −100 V | 400° C. | 0.5/2.0 |
| 2 | 100 nm Glass Flakes | Al | Al | −500 V | 710° C. | 3.0/8.0 |
| 3 | 100 nm Glass Flakes | Al | Al | −500 V | 700° C. | 14.0/NR |
| 4 | 100 nm Glass Flakes | Al | Al | −400 V | 780° C. | 3.0/8.0 |
| 5 | 100 nm Glass Flakes | Al | Al | −1,000 to −350 V | 200 to 800° C. | 3.0/8.0 |
| 6 | 100 nm Glass Flakes | W | Mo | −400 V | 780° C. | 3.0/8.0 |
| 7 | 100 nm Glass Flakes | Cr | Cr | −1,000 V | 600° C. | 14.0/8.0 |
| 8 | 300 nm Silica coated Aluminum Flakes | Au | Au | −200 V | 600° C. | 2.0/2.0 |

Without wishing to be bound by any particular theory, it is believed that the applied electrical field across the structure creates a steady internal electrical polarization inside the insulating part of the particles. This polarization is established by migration of ions and/or polarization of molecules in the direction of the externally applied electric field. In other words, this modification technique causes a steady dipole polarization or orientation in particles that were initially symmetrical in terms of their charge transferability. Such effect can be considered analogous to the one observed in the preparation of electrets. Since the modification was performed in the absence of foreign chemicals such as electroactive species and in vacuum, it is assumed that only the internal or near-surface properties of the particles were modified.

Experiment III

Methods

In this experiment, electrochemical modifications in liquid and gaseous environment were employed.

Some of the particulated structures which were subjected to electrochemical modifications in this experiment were prepared as described in Example 4. The structures were cut to the shape of a disc having a diameter of about 50 mm or less. The structures prepared in the mechanical holder were used without cutting. The removal of the edges of the species included salts such as cesium acetate ($CH_3CO_2Cs$), manganese sulfate ($MnSO_4$), nickel chloride ($NiCl_2$), nickel nitrate ($Ni(NO_3)_2$), rare earth neodecanoate and versatate salts (T-4; e.g., supplied as 6% Rare Earth TEN-CEM® by OMG), cerium 2-ethylhexanoate (e.g., supplied as 10% Cerium HYDRO-CEM® (T-5) or as 12% Cerium HEX-CEM® (T-1116), both by OMG), manganese carboxylates (T-25; e.g., manganese propionate and neodecanoate, supplied as Manganese HYDRO-CURE® by OMG), neodymium 2-ethylhexanoate (T-1137; e.g., as supplied as NEO-CEM® 250 by OMG), cobalt borate neodecanate complexes (T-1111; e.g., supplied as ULTRA-DRI 360D by OMG); dyes such as Basonyl® blau 636 (BASF), Flexo Black and Methyl Violet 2B; oxides such as titanium isopropoxide ($Ti(OCH(CH_3)_2)_4$), magnesium methoxide ($Mg(OCH_3)_2$) and nickel oxide (NiO); monomers such as pyrrole and surfactants such as barium-(bis(tridecyl) sulfosuccinate)$_2$ (T-29; wherein the sulfoccinate moiety of the salt $C_{30}H_{57}O_7S^-$ was obtained from sodium-(bis(tridecyl) sulfosuccinate), e.g., supplied as Aerosol TR-70 by Cytec), dioctyl sodium sulfosuccinate (T-39; $C_{20}H_{37}O_7NaS$, e.g., supplied as Aerosol OT-100 by Cytec).

When relevant, each supplemented electroactive species was suspended or dissolved at up to 30% weight by weight in the relevant liquid carrier. In some cases, the pH of the liquid carrier was modified with suitable acids or bases. For instance, nickel chloride was dissolved at a concentration of 300 g/L, in water acidified with 30 g/L of boric acid ($H_3BO_3$). The stock solutions of metal salts purchased from OMG generally contained as excipients non negligible amounts of surfactants and/or organic solvents. Similarly, the stock solution of the surfactant T-29 was available at a weight concentration of 5.5% in Isopar® L. Therefore, the modifying liquid media that comprised up to 0.2% of electroactive species if using more than one electroactive species, also eventually contained minute amounts of surfactants or different organic solvents.

Figure 7:
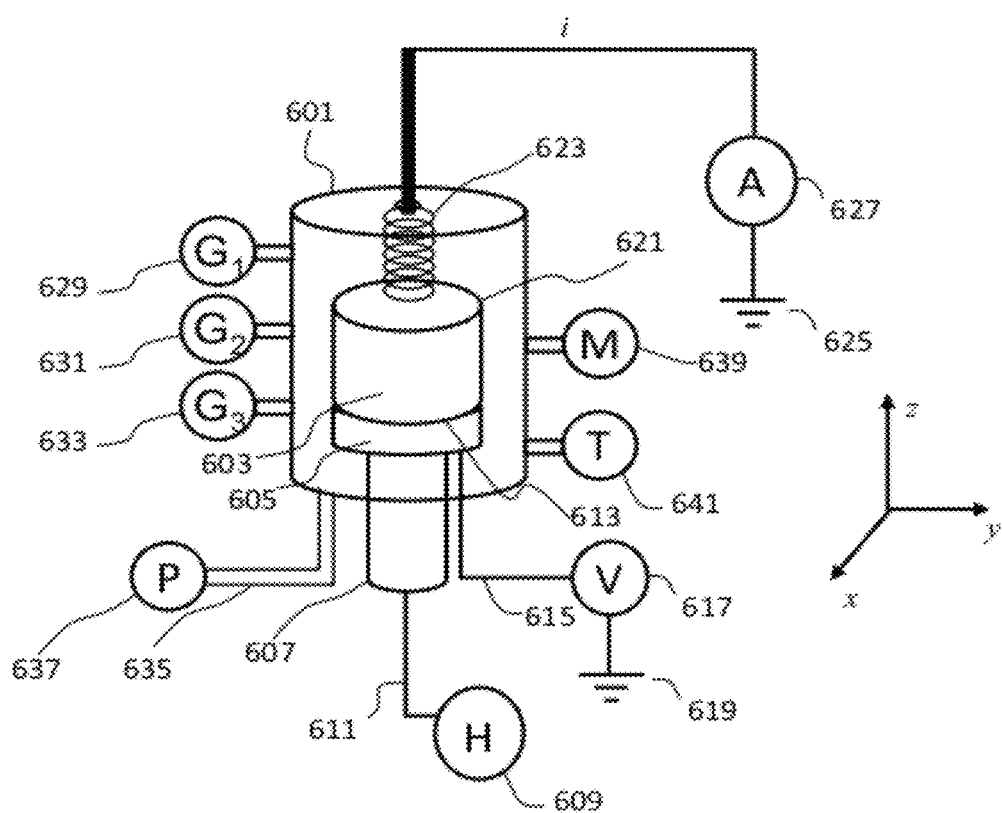
FIG. 7 is a schematic illustration of an experimental setup used for measuring current generated by a particulated structure according to some embodiments of the present invention.

The particulated structure was placed in chamber 601 of the experimental setup to be detailed in FIG. 7 and Example 7. Once placed on the surface of the internal heater as holder, the structure was allowed to absorb by capillarity the modifying liquid medium (namely liquid carrier with or without supplemental electroactive species), for up to 30 minutes at ambient temperature. Once the liquid medium fully penetrated the inter-particle voids, the wet structure was gently wiped of excess liquid (if any), and was secured between the contacts of the internal heater and the conductive spring-spring in the chamber.

An electric field was generated by applying a voltage of up to 1,000 V either on the lower side (see 613 below) or the upper side (see 621 below) of the particulated structure, with the opposite side grounded. This liquid modification was performed at temperatures of up to 600° C. for duration of up to 14 hours. The temperature was set using the internal heater of the experimental setup. Following the modification, the chamber was evacuated overnight at $T_{In}$ of up to 200° C. to remove the modifying liquid, while continuing to apply the external voltage.

Some sample preparations included an annealing step following the initial modification. This was the case for certain particulated structures prepared in the mechanical holder. Such structures comprising uncoated aluminum flakes having an average thickness of 100 nm and silica spacers having an average size of 20 nm (0.5% spacer by weight of platelets) were first impregnated with the modifying fluid and submitted to the desired voltage for periods of up to 15 minutes at temperatures of up to 60° C. Then, the chamber was evacuated to remove the residual modifying liquid. The temperature of $T_{In}$ was raised to up to 300° C. for an annealing of the coating of up to about 20 minutes, during which the desired voltage was continuously applied. This procedure was used for electroactive species comprising metal salts or oxides (See items 28-34 in Table 8).

For example, for nickel activation, the modifying fluid contained 0.2M of nickel chloride hexahydrate ($NiCl_2.6H_2O$; MP biomedicals) in dimethyl sulfoxide (DMSO; MP biomedicals). For $TiO_2$ or MgO activation, the modifying fluids consisted of 0.5 gr of, respectively, titanium isopropoxide ($Ti(OCH(CH_3)_2)_4$) or magnesium methoxide ($Mg(OCH_3)_2$), both purchased from Sigma Aldrich, 2 ml of double distilled water and 15 μl of nitric acid ($HNO_3$) dissolved in 250 ml ethanol. In one experiment, 1 ml of aqueous 0.01M potassium chloride (KCl; Sigma Aldrich) was added to 10 ml of the previously described titanium isopropoxide solution in order to increase the coating conductivity. For NiO activation, an aqueous solution containing 0.2M nickel nitrate hexahydrate ($Ni(NO_3)_2.6H_2O$; Sigma Aldrich) and 0.2M hexamethylenetetramine (($CH_2)_6N_4$; Sigma Aldrich) was used. For $MnO_2$ deposition aqueous solution of 0.2M manganese sulfate monohydrate ($MnSO_4.H_2O$; Sigma Aldrich) was used. For polypyrrole deposition, an aqueous solution comprising 0.1 M of Pyrrole and 0.1 M of para-toluene sulfonic acid (p-TS) was used. The amplitude of the applied voltage and the duration of the modification are indicated in Table 8.

Electrochemical Modifications in Gaseous Environment

For gaseous electrochemical modification, the modifying gases used in the present experiment included nitrogen dioxide ($NO_2$), nitrogen trifluoride ($NF_3$) and hydrogen chloride (HCl). The particulated structure, prepared for instance as described in Example 4, was first placed in chamber 601 and secured between the surface of the internal heater (see 605 below) and the conducting spring-spring (see 623 below). The chamber was sealed and evacuated, and voltage was applied, at which stage the modifying gas was injected at the desired pressure. The surface modification was performed at predetermined temperatures of up to 200° C. for specific duration of up to 2 hours, while voltage of up to 600 V was applied across the structure. In some cases, the external heater was also turned on during the modifications.

Results

Selected examples of electrochemically modified particulated structures are listed in Table 8. The concentration of the electroactive species (e.g., salts, dyes, oxides, monomers and surfactants) in the modifying fluid (gas or liquid) are unless otherwise stated provided in percent weight from weight of total composition or in molar concentration. When used in combinations, the weight or molar concentration relates to each electroactive species and the ratio between the different chemicals is provided using the same weight or molar unit. Unless otherwise indicated, the organic solvents used were at least 99% pure. When the modifying fluid comprised more than one fluid, the ratio between the different fluids is provided by volume.

A negative voltage in Table 8 indicates that a voltage was applied on the bottom electrode (see 613 below), whereas a positive voltage indicates that the voltage was applied on the upper electrode (see 621 below), with the opposite side grounded. In current measurement experiments (see Example 7), the bottom electrode was grounded and the upper electrode was connected to an external circuit. In Table 8, temperatures of 20-25° C. indicate no heating was applied and other temperatures indicate that the structure was heated during the electrochemical modification by setting the internal and/or external heater of the experimental setup (see FIG. 7) at the temperatures indicated for $T_{In}$ and $T_{Ex}$. Unless otherwise indicated, the values reported in Table 8 relate to $T_{In}$ during the electrochemical modification. Structures subjected to electrochemical modification in liquid environment are reported as item Nos. 1-34, and structures subjected to electrochemical modification in gaseous environment are reported as item Nos. 35-38. Ann. relates to the annealing conditions (e.g., duration) when relevant.

TABLE 8

| No. | Structure Comprising | Side 1/ Side 2 613/ 621 | Modifying Fluid | Voltage Applied [V] | Temperature [° C.] | Time [hrs] |
|---|---|---|---|---|---|---|
| 1 | 300 nm Silica coated Aluminum flakes | NR/ NR | Benzene | 200 V | 20-25° C. | 2.0 |
| 2 | 300 nm Silica coated Aluminum flakes | NR/ NR | Chloroform | 200 V | 20-25° C. | 2.0 |
| 3 | 300 nm Silica coated Aluminum flakes | NR/ NR | Methanol | 200 V | 20-25° C. | 2.0 |
| 4 | 100 nm Glass flakes | Cr/Cr | 0.1% Cesium Acetate in IPA:$H_2O$ (4:1) | −330 to −50 V | 20-25° C. | 3.0 |
| 5 | 100 nm Glass flakes | Cr/Cr | 0.1% Cesium Acetate in IPA:$H_2O$ (4:1) | −1,000 V | 600° C. | 14.0 |
| 6 | 300 nm Silica coated Aluminum flakes | NR/ NR | 0.1% T-5 in hexane | 300 V | 20-25° C. | 2.0 |
| 7 | 300 nm Silica coated Aluminum flakes | NR/ NR | 0.1% T-25 in hexane | 300 V | 20-25° C. | 2.0 |
| 8 | 300 nm Silica coated Aluminum flakes | NR/ NR | 0.1% T-29 in hexane | 300 V | 20-25° C. | 2.0 |
| 9 | 300 nm Silica coated Aluminum flakes | NR/ NR | 0.1% T-39 in hexane | 300 V | 20-25° C. | 2.0 |
| 10 | 300 nm Silica coated Aluminum flakes | NR/ NR | 0.1% T-5:T-29 (1:1) in hexane | 300 V | 20-25° C. | 2.0 |
| 11 | 300 nm Silica coated Aluminum flakes | NR/ NR | 0.1% T-5:T-39 (1:1) in hexane | 300 V | 20-25° C. | 2.0 |
| 12 | 300 nm Silica coated Aluminum flakes | NR/ NR | 0.1% T-25:T-29 (1:1) in hexane | 300 V | 20-25° C. | 2.0 |
| 13 | 300 nm Silica coated Aluminum flakes | NR/ NR | 0.1% T-25:T-39 (1:1) in hexane | 300 V | 20-25° C. | 2.0 |
| 14 | 300 nm Silica coated Aluminum flakes | NR/ NR | 0.1% Methyl violet 2B in chloroform | 100 V | 20-25° C. | 0.5 |
| 15 | 300 nm Silica coated Aluminum flakes | NR/ NR | 0.1% Basonyl ® blau 636 in chloroform | 100 V | 20-25° C. | 0.5 |
| 16 | 300 nm Silica coated Aluminum flakes | NR/ NR | 0.1% Flexo black in chloroform | 100 V | 20-25° C. | 0.5 |
| 17 | 300 nm Silica coated Aluminum flakes | Pd—Au/ Pd—Au | 0.1% T-25:T-39 (1:1) in hexane | 300 V | 20-25° C. | 2.0 |
| 18 | 300 nm Silica coated Aluminum flakes | Pd—Au/ Pd—Au | 0.1% T-39:T-1111 (1:1) in hexane | 300 V | 20-25° C. | 2.0 |
| 19 | 300 nm Silica coated Aluminum flakes | Pd—Au/ Pd—Au | 0.1% T-39:T-1137 (1:1) in hexane | 200 V | 20-25° C. | 2.0 |
| 20 | 300 nm Silica coated Aluminum flakes | Pd—Au/ Pd—Au | 0.1% T-29:T-1116 (1:1) in hexane | 200 V | 20-25° C. | 2.0 |
| 21 | 300 nm Silica coated Aluminum flakes | Pd—Au/ Pd—Au | 0.1% T-39:T-1116 (1:1) in hexane | 200 V | 20-25° C. | 2.0 |
| 22 | 300 nm Silica coated Aluminum flakes | Pd—Au/ Pd—Au | 0.1% T-4:T-29 (1:1) in hexane | 200 V | 20-25° C. | 2.0 |
| 23 | 300 nm Silica coated Aluminum flakes | Pd—Au/ Pd—Au | 0.1% T-4:T-39 (1:1) in hexane | 200 V | 20-25° C. | 2.0 |
| 24 | 300 nm Silica coated Aluminum flakes | Pd—Au/ Pd—Au | 0.1% T-5:T-29 (1:1) in hexane | 200 V | 20-25° C. | 2.0 |

TABLE 8-continued

| No. | Structure Comprising | Side 1/Side 2 613/621 | Modifying Fluid | Voltage Applied [V] | Temperature [° C.] | Time [hrs] |
|---|---|---|---|---|---|---|
| 25 | 300 nm Silica coated Aluminum flakes | Pd—Au/Pd—Au | 0.1% T-5:T-39 (1:1) in hexane | 200 V | 20-25° C. | 2.0 |
| 26 | 300 nm Silica coated Aluminum flakes-mechanically held | Al/Al | 0.1% T-5:T-29 (1:1) in hexane:chloroform (1:1) | −200 V | 20-25° C. | 2.0 |
| 27 | 3 nm GO flakes and 35 nm silica spacers | Cr/Cr | 300 g/L $NiCl_2$ + 30 g/L Boric Acid in water | −2 V | $T_{In}$ 30° C. $T_{Ex}$ 30° C. | 1.75 |
| 28 | 100 nm Aluminum flakes + 20 nm silica spacers-mechanically held | Al/Al | 40 g/L $NiCl_2$ in DMSO | −30 V | $T_{In}$ 60° C. and annealing at $T_{In}$ 300° C. | 0.1 + 0.3 ann. |
| 29 | 100 nm Aluminum flakes + 20 nm silica spacers-mechanically held | Al/Al | $Ti(OCH(CH_3)_2)_4$ in ethanol | −30 V | $T_{In}$ 60° C. and annealing at $T_{In}$ 300° C. | 0.1 + 0.3 ann. |
| 30 | 100 nm Aluminum flakes + 20 nm silica spacers-mechanically held | Al/Al | $Ti(OCH(CH_3)_2)_4$ in ethanol + 0.01M KCl in water | −30 V | $T_{In}$ 60° C. and annealing at $T_{In}$ 300° C. | 0.1 + 0.3 ann. |
| 31 | 100 nm Aluminum flakes + 20 nm silica spacers-mechanically held | Al/Al | $Mg(OCH_3)_2$ in ethanol | −30 V | $T_{In}$ 60° C. and annealing at $T_{In}$ 300° C. | 0.1 + 0.3 ann. |
| 32 | 100 nm Aluminum flakes + 20 nm silica spacers-mechanically held | Al/Al | 0.2M $Ni(NO_3)_2$ + 0.2M $(CH_2)_6N_4$ in water | −3 V | $T_{In}$ 50° C. and annealing at $T_{In}$ 260° C. | 0.1 + 0.3 ann. |
| 33 | 100 nm Aluminum flakes + 20 nm silica spacers-mechanically held | Al/Al | 0.2M $MnSO_4$ in water | −10 V | $T_{In}$ NA | 0.25 |
| 34 | 100 nm Aluminum flakes + 20 nm silica spacers-mechanically held | Al/Al | 0.1M pyrrole + 0.1M Na-pTS in water | −6 V | $T_{In}$ 40° C. | 0.25 |
| 35 | 300 nm Silica coated Aluminum flakes | NR/NR | $NO_2$ at 200 mbar | −600 V | $T_{In}$ 200° C. $T_{Ex}$ NA | 1.0 |
| 36 | 3 nm GO flakes | Al/Al | $NO_2$ at 235 mbar | −5 V | $T_{In}$ 50° C. $T_{Ex}$ 40° C. | 1.5 |
| 37 | 3 nm GO flakes and 1.5 nm POSS spacers | Al/Al | HCl at 300 mbar | −2 V | $T_{In}$ 40° C. $T_{Ex}$ 40° C. | 2.0 |
| 38 | Phlogopite Mica | Al/Au | $NF_3$ at 200 mbar | −200 V | $T_{In}$ 400° C. $T_{Ex}$ 150° C. | 0.5 |

Some of the particulated structures modified by the above-described methods, were used in experiments directed to the generation of electricity in a device according to various exemplary embodiments of the invention. These experiments are detailed in Example 7 below.

Example 7

Generation of Electrical Current by Thermal Motion of Gas Molecules

The present example describes experiments performed in accordance with some embodiments of the present invention to generate electrical current by thermal motion of gas molecules between the surfaces of adjacent platelets within a particulated structure. In the experiments described below, the individual platelets were kept apart by non-conductive spacers or outwardly protruding roughness features on their surfaces. The outermost surfaces of the particulated structures prepared using these platelets were bare or modified by either the same or different materials.

Setup

The experimental setup used in all experiments of the present example is schematically illustrated in FIG. 7. This setup was used for measurement of current and voltage, and, with slight variations described below, for some of the electrochemical and electrothermal modification techniques that preceded those measurements (see Experiments II and III in Example 6).

The experiments took place within a sealable stainless steel chamber 601 (AISI 316). A particulated structure 603 was positioned over the electrically insulating ceramic interface 605 of an internal heater 607. A controller 609 (Ceramisis—Controllable Sample Heater up to 1,200° C.) was connected to heater 607 via a connection line 611.

During electrochemical and electrothermal modifications, the particulated structure 603 was connected on a first side 613 via a connection line 615 to power and voltameter 617 (Trek Model 615A-1), and on a second side 621 via a conductive spring 623 to ground 625. Conductive spring 623 was made of music wire high carbon steel and was positioned above the particulated structure 603.

During measurements of current and voltage, side 613 of particulated structure 603 was grounded to 619, and side 621 was connected through an electrical feed-through in the upper wall of chamber 601 to an external electrometer 627 (Keithley 6517A).

The electrometer was calibrated and displayed a high accuracy of less than ±1% of readings. Though the external sides 613 and 621 of the structure could have any other position and orientation in space, in the following descriptions and in line with the schematic illustration of the experimental set up, side 613 is interchangeably referred to as the lower or bottom side and side 621 is interchangeably referred to as the upper or top side.

In experiments in which one or more of sides 613 and 621 was made of or coated with a material of poor bulk conductivity, an overlapping disc made of conductive material (generally an aluminum disc made of AL6061-T4 and having a diameter of 50 mm and a thickness of 12 mm) was placed below or above structure 603 to ensure connectivity to the external circuitry via 615 and/or 623.

Chamber 601 was cylindrical in shape, with an average diameter of about 8.5 cm, a height of about 7 cm, walls about 0.17 cm thickness, and a gas capacity of about 400 cm$^3$. The chamber was built of corrosive resistant low-outgassing materials and was electropolished. Its parts and connections through O-rings were adapted to sustain at least the operational vacuum and temperature conditions. Chamber 601 was provided with inlets 629, 631 and 633 for injecting gas into the chamber, and an outlet 635 configured for evacuating gas out of the chamber via vacuum pump 637 (Boc Edwards, XDS 10; optionally connected in series through a second vacuum pump Boc Edwards, EXT-255H Turbo). The pressure within chamber 601 was controlled upon gas injection and evacuation. The pressure was monitored using manometer 639 (BOC Edwards, Active digital controller, with gauge models APG100-XLC, ASG 2000 mbar, and WRG-SL each covering a different portion in the range of pressure measurement). The experiments were conducted at various pressures, in the range of $10^{-10}$ to 8 bars.

The temperatures during the experiments were controlled in two ways: the temperature $T_{In}$ of structure 603 was controlled via internal heater 605 and controller 607, and the temperature $T_{Ex}$ of the walls of chamber 601 was controlled by means of an external ribbon heater (not shown), connected to the external wall of the chamber. The experiments were conducted at various internal and external temperatures, both for modification purposes, when relevant, and for measurement purposes. Specifically, $T_{In}$ was varied from 25° C. to 800° C. and $T_{Ex}$ was varied from about 25° C. to about 200° C. $T_{In}$ and $T_{Ex}$ were monitored using a type-k thermocouple and controller 641 (Eurotherm 2216e).

It was established in preliminary experiments in which both sides 613 and 621 of particulated structure 603 were connected to thermocouples, that when only internal heating was applied (via heater 605) while the external heating was switched off, the temperature difference between the sides 613 and 621 was negligible in the presence of gas. Specifically, the Kelvin temperature of side 613 was higher by no more than 1% than that of side 621. As demonstrated in the results section below, in vacuum there was no current above noise level and measurable current was observed only in the presence of gas.

As the signals monitored in this experiment were generally below 1 mA, any device which might affect the recorded signals, and which was not essential at the time of the measurement, was disconnected once no longer required. For instance, the manometer was turned off once the desired stable pressure was reached and measured.

Materials

The experiments described below employed for structures 603 materials having high electrical conductivity (above $10^3$ S/m), poor electrical conductivity (below $10^{-9}$ S/m) or midrange electrical conductivity (between $10^{-9}$ and $10^3$ S/m). In some experiments, the particulated structures comprised spacers. The particulated structures were prepared and optionally sputtered and/or modified as previously described in Examples 5 to 7. It is assumed that when the external coatings were identical, they played an insignificant role if any in breaking the initial symmetry of the structure and their role was merely to provide electrical connectivity to the external circuitry.

Methods

Some of the particulated structures 603 were cut to form a disc of up to about 50 mm in diameter as further detailed hereinabove. Circumferential edges were removed to improve uniformity, as heretofore described. The resistance between the two sides 613 and 621 of the structure 603 was measured using a Wavetek Meterman DM28XT Multimeter (not drawn). The resistance was consistently above 2 GigaOhm demonstrating that there were no significant electrical shorts within the structure.

Each experiment was preceded by evacuation of chamber 601 in accordance with the following procedure. The chamber was sealed, vacuum was applied for at least 1 hour (to baseline pressure of at most $10^{-2}$ bar) while in most cases the particulated structure was heated using the internal heater 607 to at least 100° C. to remove residual moisture. The chamber was periodically evacuated overnight at high vacuum while heated to $T_{Ex}$ of 150° C., to further eliminate the possibility of contamination from outgassing from the chamber wall between experiments. The stabilization of the experimental setup was verified by ensuring a stable baseline pressure $P_b$ and about null baseline current $i_b$. Unless otherwise stated, $P_b$ was less than $10^{-2}$ bar and $i_b$ was less than 0.1 pA.

For each experiment, the following parameters were varied and monitored: (i) type of gas fed into the previously evacuated chamber, (ii) pressure (P) in the chamber, (iii) temperature ($T_{In}$) of the internal heater, and (iv) temperature ($T_{Ex}$) of the wall of the chamber. The gases used were at least 99.9% pure and supplied by BOC gases.

The resulting current or voltage across the structures for each set of parameters was measured and recorded at a sampling rate of approximately 1 measurement per second. Since the typical time scale for a single experiment was 10-50 hours, there were $10^4$-$10^5$ measurements per run. The statistical error of the experiments is therefore marginal.

When relevant, the open circuit voltage $V_{OC}$ was measured in an IV scan as follows. The bottom side 613 of the structure was connected to a voltage supply (Yokogawa 7651) which applied a voltage ranging from −3V to +3V at a rate of 1 mV/s. The resulting current was measured on the upper side 621 of the structure and recorded when stable for 30 seconds. The current measured (I) was plotted against the voltage applied (V) and the value of $V_{OC}$ was retrieved from the IV curve at null current.

Results

The results are generally summarized in Tables 9 and 10, below, and graphical presentations of some of the results are depicted in FIGS. 8-11.

Experiment I

Figure 8:
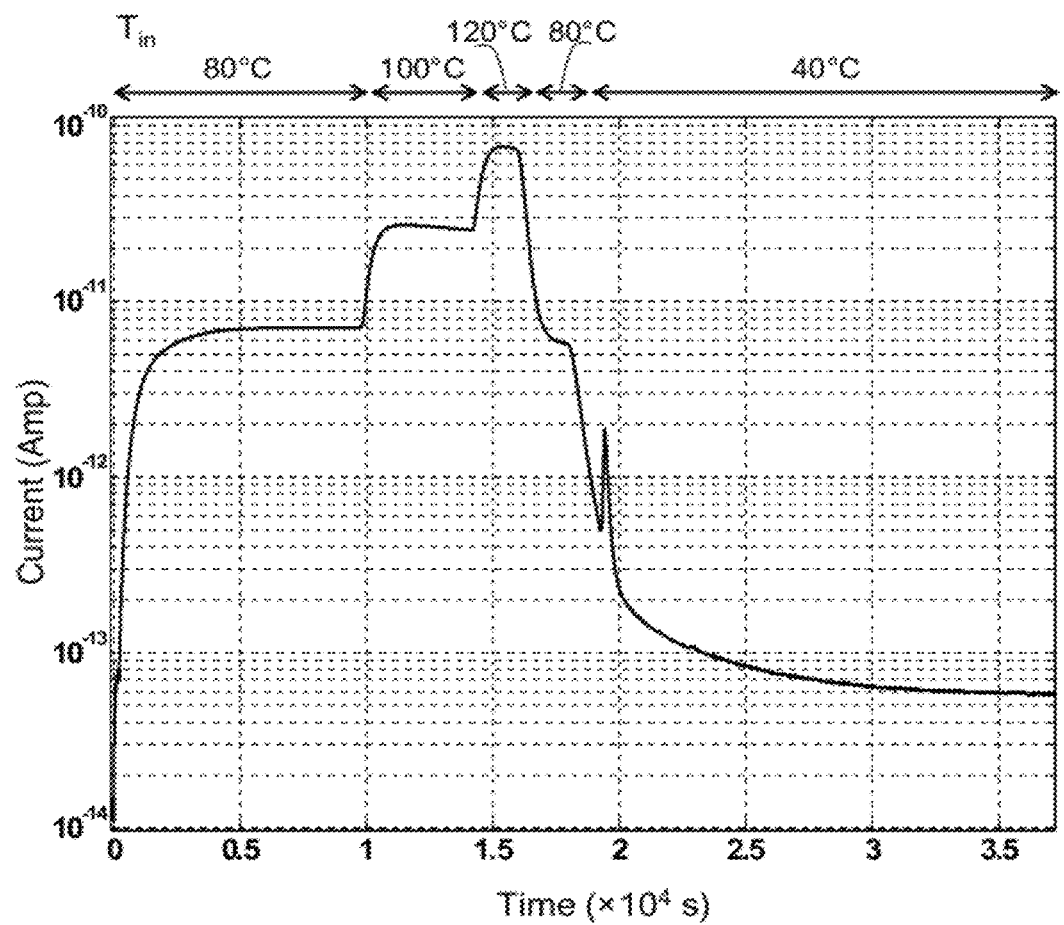
FIG. 8 shows a current as a function of time, as measured for several temperatures during an experiment performed according to some embodiments of the present invention.

FIG. 8 shows the measured current (Amp) as a function of time (s) as measured in an experiment corresponding to entry Nos. 1-5 in Table 10. The internal temperatures at each time interval are indicated in the upper part of the figure. As shown in FIG. 8, at the initial temperature of 80° C., the baseline current in vacuum was negligible, $10^{-14}$ Amp. Following injection of Helium at 250 seconds, the current increased to 7 pA. When after about 2 hrs and 39 minutes the internal temperature $T_{In}$ was increased to 100° C., the current further increased to 26 pA. This temperature dependence was further confirmed when about an hour later $T_{In}$ was increased to 120° C., which brought the current to about 74 pA. Half an hour later, the temperature was decreased to 80° C. at which stage the current decreased to 6 pA close to its previous value of 7 pA at this same temperature, thus establishing the repeatability of the signal. About 5 hrs and 20 minutes following the beginning of the experiment, the chamber was evacuated to confirm that the current depends on the presence of gas within the structure and the internal temperature was decreased to 40° C. When the current in vacuum reached 0.5 pA, Helium was reinjected at 1,200 mbar and, following a transient spike, current at 40° C. was measured. Though the measured value of 0.06 pA is low, it was above baseline of about 0.01 pA.

This experiment established that a particulated structure according to some embodiments of the invention generated current in the presence of a gas medium. In the present experiment, the individual platelets were made of a material having poor conductivity (100 nm glass flakes). The structure was subjected to two types of modification techniques: (a) the external surfaces of the structure were coated with different materials, tungsten and molybdenum and (b) the coated structure was submitted to an electric field at high temperature (−400V at 780° C., see item 6 Table 7). The generation of current depended on the presence of a gas medium and its level increased with increasing temperature according to the predictions of current generated by thermal motion of gas molecules. In this configuration, the current direction was positive, indicating that the tungsten, and the surfaces of the flakes having the same internal orientation, acted as electron acceptors whereas the molybdenum, and the surfaces of the flakes having the same internal orientation, acted as electron donors.

The fact that the current is temperature-dependent is in accordance with the gas mediated charge transfer mechanism discovered by the present inventors.

Experiment II

Figure 9:
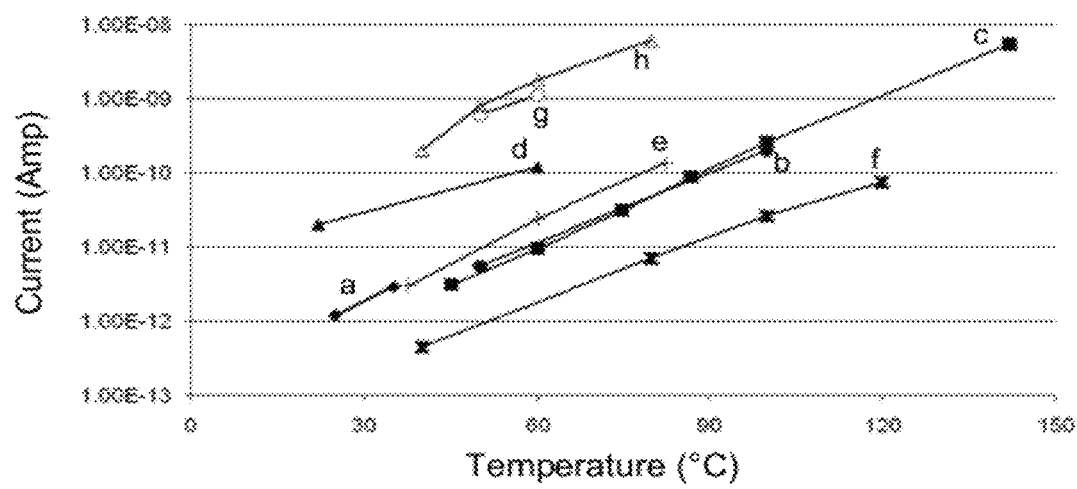
FIG. 9 shows a current as a function of temperature, as measured for several structures activated by various methods according to some embodiments of the present invention.

FIG. 9 shows the measured current in absolute values (Amperes) as a function of the temperature (° C.) as measured in experiments corresponding to entry Nos. 6-11 and 21-22 in Table 10. Each experiment was identified by a letter indicated in the following next to the relevant shapes. In FIG. 9, (a) diamonds correspond to an experiment with electrothermally modified aluminum coated structure comprising 100 nm glass flakes, (b) filled circles correspond to an experiment with the electrothermally modified aluminum coated structure comprising 1 μm glass flakes, (c) squares correspond to an experiment with the Titanium/Molybdenum coated structure comprising 100 nm glass flakes, for which the modification results from ΔWF, (d) filled triangles correspond to an experiment with uncoated structure comprising 300 nm silica coated aluminum flakes, which was electrochemically modified with $NO_2$ gas, (e) plus signs correspond to an experiment with uncoated structure comprising 300 nm silica coated aluminum flakes, which was electrochemically modified with benzene, (f) crosses correspond to an experiment with electrothermally activated Tungsten-Molybdenum coated structure comprising 100 nm glass flakes, (g) open circles correspond to an experiment with aluminum coated structure comprising 3 nm GO flakes, which was electrochemically modified with $NO_2$ gas, and (h) open triangles correspond an experiment with the aluminum coated structure comprising 3 nm GO flakes separated by POSS spacers, which was electrochemically modified with HCl gas.

FIG. 9 demonstrates that all the tested modification techniques are suitable for the preparation of particulated structures which generate electricity. It is believed by the inventors that this production of energy is based on the thermal motion of the gas molecules in inter-particle voids between opposing surfaces having different charge transferability. Since the non-modified structures were essentially symmetrical in terms of their charge transferability, the results of this experiment confirm that the modification methods according to some embodiments of the invention break the symmetry such that opposing surfaces of the particles have different charge transferabilities.

This interpretation of the role of the modification process is further supported by the controlled results of run (e). The current measured on the structure that was not subjected to the modification was of opposite direction and at all temperatures at least about 6-fold lower than the current measured on the structure that was subjected to the modification (data not shown). Moreover, the open circuit voltage measured across the non-modified structure was negligible, −0.04 V at about 40° C., as compared to the modified structure which displayed a $V_{OC}$ of +0.18 V under the same conditions.

FIG. 9 demonstrates that the temperature dependence of the measured current is generally similar, and roughly exponential, irrespective of the technique employed for modifying the particles. The temperature dependence was not affected by the heating method (external heating in run (a) and internal heating in runs (b)-(h)). This indicates that the measured current does not result from any minor temperature gradient which may exist across the structure when heating only the lower side, but from the thermal energy of the gas itself.

The results of the experiments (see runs (a) and (d)) demonstrate that modified particulated structures can generate measurable current sufficiently above noise level at room temperature. Furthermore, extrapolation of any of the curves in FIG. 9 suggests that measurable current sufficiently above noise level is obtainable from modified particulated structures at room temperature or below. The results of the experiments (see runs (d) and (e)) demonstrate that the particulated structures do not have to be coated on their external sides to be of use in the present invention. The results of the experiments further demonstrate that the particulated structures of the invention can comprise spacers (see run (h)).

Experiment III

Representative examples of normalized currents (pAmp) and average $V_{OC}$ (V) at $T_{In}$ of 75° C. as measured on the connected sides of externally modified particulated structures are presented in Table 9, below. In the experiments of Table 9, the particulated structures were prepared as detailed in Example 4 and coated as described in Example 5. Before modification, the opposing particle surfaces were symmetrical (namely similar to one another in their charge transferability). The particulated structures were inserted into the chamber of the experimental setup between the grounded heater 605 and the conductive spring 623. The heater was set to $T_{In}$ of 45° C. and the chamber was evacuated for 6 hours down to $10^{-4}$ mbar vacuum. No external heat was applied to the chamber. Following evacuation, Helium was injected at a pressure of 1,100 mbar. Current and open circuit voltage ($V_{OC}$) were measured as previously described both in vacuum and in presence of gas medium. The temperature of the internal heater was then gradually raised and measurements were repeated at $T_{In}$ of 60, 75, 90, 105 and 150° C. A test structure coated on both external sides with the same material (molybdenum) served as control.

Non-particulated structures comprising two glass cover slips (50 mm in diameter, 130 μm thickness) plasma etched on their facing sides and sputtered with different metals on their outermost sides were used for comparison with the particulated structures. No spacers were used between the facing glass surfaces and the size of the gap was determined by the wavyness of the glass lenses (50 nm). The nature and thickness of the external coatings of the bi-glass lenses so prepared follows and the measured ΔWF is provided in parenthesis. The first named coating was connected to 621 and the second named coating was grounded to 613: Gd 220 nm/Al 200 nm (+0.25 eV); Al 200 nm/Cr 200 nm (−0.20 eV); Gd 220 nm/Ni 200 nm (−0.75 eV); and Al 200 nm/Ni 200 nm (−1.00 eV). After chamber evacuation, these bi-glass lens structures (overall thickness of about 260 μm) were tested at $T_{In}$ of 160° C. and pressure of 1,100 mbar Helium.

The electrical current values in Table 9 are considered normalized as they represent the values measured in the presence of gas minus the baseline vacuum values. The $V_{OC}$ values of Table 9 represent the average of the measurements made in vacuum and in the presence of gas, since $V_{OC}$ was not affected by this parameter. Another parameter in Table 9 is ΔWF, defined as $WF_1$-$WF_2$. This parameter indicates the difference between the work function $WF_1$ of the connected sides (621) and the work function $WF_2$ of the grounded sides (613). In Table 9, "NA" indicates that data for a certain entry is not available.

TABLE 9

| No. | Structure comprising | Grounded Side 613 | Connected Side 621 | ΔWF [eV] | $V_{OC}$ [eV] | I [pA] |
|---|---|---|---|---|---|---|
| 1 | 100 nm Glass Flakes | Mo | Mo | 0.00 eV | 0.01 V | +0.6 pA |
| 2 | 100 nm Glass Flakes | Ni | Al | −0.80 eV | −0.71 V | −49.0 pA |
| 3 | 100 nm Glass Flakes | Ti | Mn | 0.05 eV | +0.07 V | +1.5 pA |
| 4 | 100 nm Glass Flakes | Mo | Mn | −0.50 eV | −0.35 V | −28.5 pA |
| 5 | 100 nm Glass Flakes | Ti | Mo | +0.45 eV | +0.47 V | +22.0 pA |
| 6 | 100 nm Glass Flakes | Mo | Ni | 0.00 eV | +0.01 V | +0.4 pA |
| 7 | 100 nm Glass Flakes | Mn | Ni | +0.50 eV | +0.35 V | +14.5 pA |
| 8 | 100 nm Glass Flakes | Ni | Ti | −0.45 eV | −0.50 V | −36.5 pA |
| 9 | 3 nm GO film | Al | Ni | 0.80 eV | +0.01 V | +6 nA |
| 10 | 300 nm silica coated aluminum flakes | Pd/Au | Pt | −0.20 eV | −0.24 V | −50 pA |
| 11 | Phlogopite mica | Al | Au | 1.20 eV | 0.8 V | 1 pA |
| 12 | Expanded vermiculite | Al | Au | 1.20 eV | 0.7 V | 4 pA |

Table 9 demonstrates the correlation between ΔWF and the measured $V_{OC}$. Gas molecules are charged by their interaction with the surfaces of the particles. The work function difference between the external electrodes creates an electric field which is applied across the entire particulated structure. Therefore, some of the charged gas molecules drift towards the opposing particle surface along the electric field, effecting a progressive drift of charges towards the external electrodes which collect the charges, hence ensure flow of electrical current across the structure. In open circuit mode, the electric potential across the particulated structure continues to increase until the electric field created by the charged surfaces of the individual particles cancels the electric field created by the work function difference of the two electrodes. This condition leads to a situation where $V_{OC}$ approximately equals ΔWF. The data further show that the measured $V_{OC}$ values are often additives for given pairs of materials (see, e.g., entry Nos. 4, 6 and 7 of Table 9). The fact that the voltage is additive confirms that the measurements result from the gas mediated charge transfer occurring within the structures, and not from the external circuit.

Figure 10:
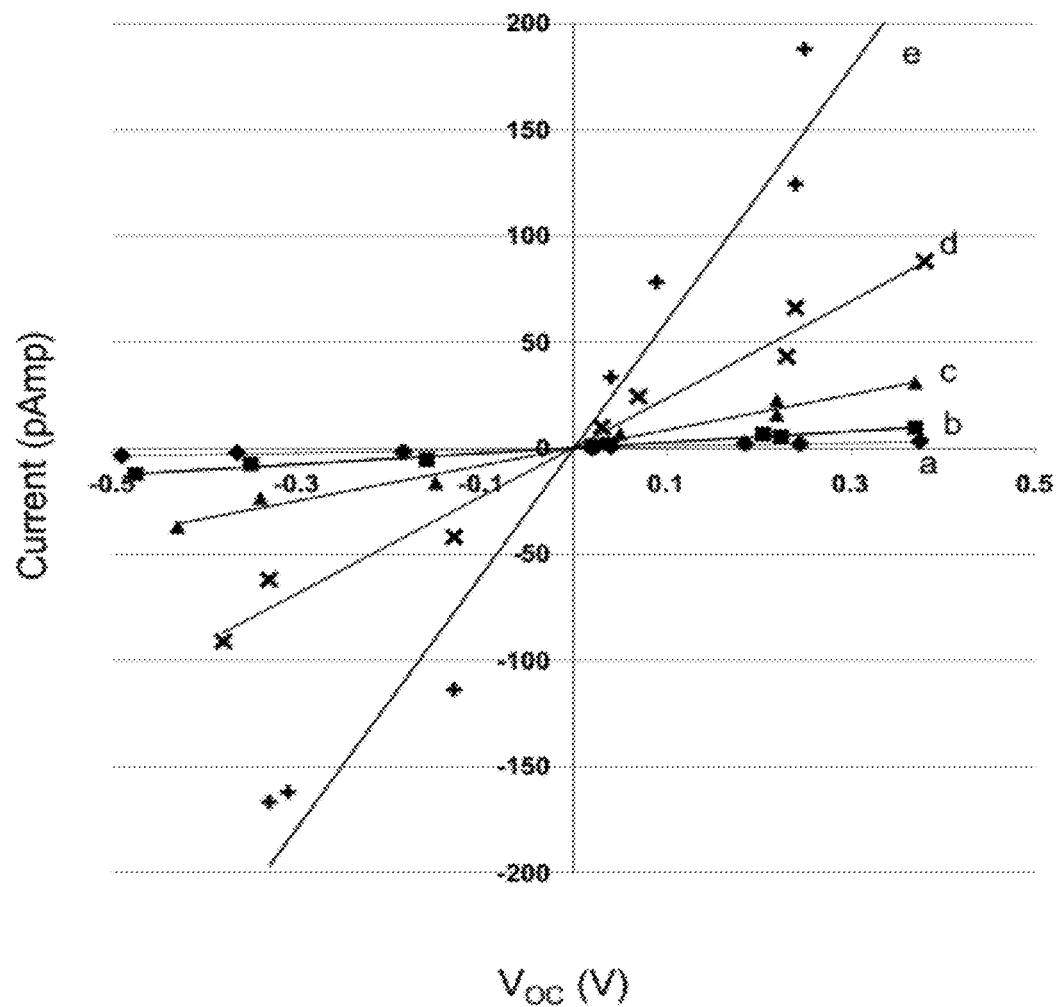
FIG. 10 shows a current as a function of open circuit voltage, as measured at various temperatures for several structures according to some embodiments of the present invention.

FIG. 10 shows the currents (pA) measured in helium as a function of the $V_{OC}$ (V) as measured for particulated structures prepared as detailed in Example 4 and coated as described in Example 5. In FIG. 10, each symbol corresponds to a different internal temperature applied on the structure, whereas for a given symbol, each point corresponds to a different structure enclosed between a specific pair of electrodes as indicated by the distinct $V_{OC}$ values. Also shown is a linear fit which was calculated for each temperature. Line (a) corresponds to $T_{In}$ of 45° C. wherein each diamond correspond to a different structure with a distinct pair of external coatings, line (b) and squares correspond to 60° C., line (c) and triangles correspond to 75° C., line (d) and crosses correspond to 90° C. and line (e) and plus signs correspond to 105° C. The points corresponding to $T_{In}$ of 150° C. were in the nanoAmp range and are therefore not shown on FIG. 12. The currents measured at $T_{In}$ of 150° C. are reported in Table 10 below as items Nos. 12-20, and additional results obtained with other particulated structures enclosed between electrode structures of different work function are provided as items 8 and 46-47 in Table 10.

FIG. 10 shows a good correlation between the measured current and the $V_{OC}$ (itself proportional to $\Delta WF$). Moreover, as already shown above, the measured current rises with the temperature. Over the range of temperatures displayed (45-105° C.), $V_{OC}$ remained relatively stable with minor variations of less than 20% (data not shown).

The present inventors found that structures made of two plain glass cover slides generated relatively lower current than particulated structures made of similar materials, submitted to comparable $\Delta WF$ or experiencing analogous $V_{OC}$. For example, bi-glass lenses externally coated with Al/Gd displayed at 160° C. a $V_{OC}$ of +0.36 V which is comparable with the $V_{OC}$ measured at 75° C. for the glass flakes externally coated with Mn/Ni (+0.35 V, see item 7 in Table 9). However, the current of +4.8 pA measured for the bi-glass lenses is relatively smaller than the one measured for the particulated structure (+14.5 pA), especially in view of the facts (a) that the temperature of the measurements should have favored higher currents at 160° C. (plain) than at 75° C. (particulated) and (b) that for comparable $V_{OC}$, the electrical field perceived across the structures should be stronger in the thinner structure (the plain structure is about 4-fold thinner than the particulated one).

Similarly, the bi-glass lenses externally coated with Ni/Gd displayed a $V_{OC}$ of −0.72 V which is comparable with the $V_{OC}$ measured for the analogous particulated structure externally coated with Ni/Al (−0.71 V, see item 2 in Table 9). However, the current of −7.8 pA measured for the bi-glass lenses is again relatively smaller than the one measured for the particulated structure (−49.0 pA). The bi-glass lenses externally coated with Al/Cr displayed a $V_{OC}$ of −0.075 V which is comparable in magnitude with the $V_{OC}$ measured for the analogous particulated structure externally coated with Ti/Mn (+0.07 V, see item 3 in Table 9). Though in this case the current measured for the bi-glass lenses was similar in absolute value to the one measured for the particulated structure (1.5 pA), such similitude was achieved at a significantly higher temperature and stronger field (per gap distance). The bi-glass lenses externally coated with Ni/Al displayed a $V_{OC}$ of −1.0 V and a current of −12.3 pA at 160° C. Therefore, for given conditions, the current generated by the particulated structure of the present embodiments is significantly higher than the current that would have been generated, had the structure included two or a few active surfaces.

Experiment IV

Figure 11:
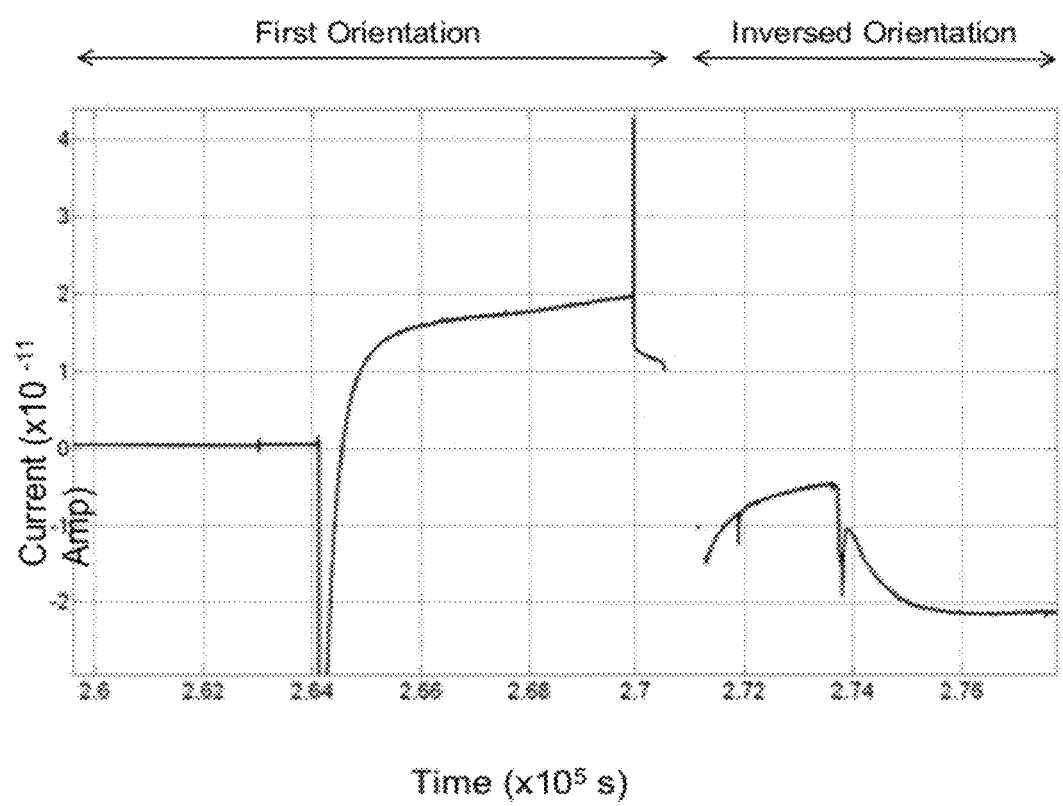
FIG. 11 shows a current as a function of time, as measured for two orientations of a structure during an experiment performed according to some embodiments of the present invention.

FIG. 11 shows the current ($\times 10^{-11}$ Amp) as a function of time ($\times 10^5$ sec) as measured in an experiment with an uncoated particulated structure, about 1.7 mm in thickness, composed of silica coated aluminum flakes having an average individual thickness of 300 nm, and chemically activated with pure $NO_2$ gas. The purpose of the experiment was to study the effects of structure orientation on current direction. The orientation of the structure at each time interval is indicated in the upper part of the figure. As shown in FIG. 11, the baseline current in vacuum for the first orientation was negligible. Following injection of $NO_2$ at t~264,300 seconds, the current increased to about 20 pA after a transient peak typically observed after gas injection. When after about 1 hr and 40 minutes (at t~270,000 s) the chamber was evacuated, the current dropped back toward baseline current. The chamber was opened after this expected trend was established, but before current became null. The structure was removed, inverted and replaced in the chamber and the current measurements were continued in this inverted orientation. The chamber was then evacuated, which lead the initial negative current to decrease toward null baseline. Having established this expected trend, $NO_2$ was injected at t~273,700 sec. Following the usual transient pick, the current stabilized at a value of about −21 pA which has a similar magnitude and opposite polarity compared to the earlier observed current when the structure was in its original orientation.

The fact that both in the presence of gas and during evacuation, the currents as measured in both orientations (heads-up and tails-up) have similar behavior as a function of the time confirms that the measured current stems from the activated particulated structures and their interaction with the gaseous medium and not from an artifact or undesired experimental effect.

Representative results of additional experiments directed to measure the currents generated by particulated structure subjected to electrothermal modifications in which an electric field at elevated temperatures was employed in absence of added liquid or gaseous chemicals are presented in Table 10 item Nos. 1, 7, 11 and 57-58. Representative IT curves of structures subjected to the electrothermal modification were presented in FIG. 9 runs (a), (b) and (f).

Representative results of additional experiments directed to measure the currents generated by particulated structure subjected to an electric field in presence of modifying fluids are presented in Table 10 item Nos. 9-10, 21-45, 48-56 and 59-68. Representative IT curves of electrochemically modified structures were presented in FIG. 9 runs (d), (e), (g) and (h). It is noted that in all of the experiments, there was no drop in gas pressure, indicating that no gas was consumed through gaseous reaction.

Table 10, below, summarizes the results of all the experiments performed with particulated structures. In Table 10, NA indicates that a given entry is not applicable. The temperatures shown relate to $T_{In}$ and/or $T_{Ex}$ as applicable. For instance, $T_{Ex}$ NA indicates that the external heater was turned off and that the chamber was therefore at least at ambient temperature.

TABLE 10

| No. | Structure Comprising | 613/ 621 | Modification (Item # in Table #) | Gas & Pressure [mbar] | $T_{In}$ $T_{Ex}$ [° C.] | Current [pA/nA] |
|---|---|---|---|---|---|---|
| 1 | 100 nm Glass flakes | W/Mo | −400 V at 780° C. (item 6 in Table 7) | Vacuum at $10^{-6}$ mbar | $T_{In}$ 80° C. $T_{Ex}$ NA | 0.01 pA |

TABLE 10-continued

| No. | Structure Comprising | 613/621 | Modification (Item # in Table #) | Gas & Pressure [mbar] | $T_{In}$ $T_{Ex}$ | $T_{In}$ $T_{Ex}$ [° C.] | Current [pA/nA] |
|---|---|---|---|---|---|---|---|
| 2 | 100 nm Glass flakes | " | −400 V at 780° C. (item 6 in Table 7) | Helium at 1,200 mbar | $T_{In}$ $T_{Ex}$ | 80° C. NA | 6-7 pA |
| 3 | 100 nm Glass flakes | " | −400 V at 780° C. (item 6 in Table 7) | Helium at 1,200 mbar | $T_{In}$ $T_{Ex}$ | 100° C. NA | 26 pA |
| 4 | 100 nm Glass flakes | " | −400 V at 780° C. (item 6 in Table 7) | Helium at 1,200 mbar | $T_{In}$ $T_{Ex}$ | 120° C. NA | 74 pA |
| 5 | 100 nm Glass flakes | " | −400 V at 780° C. (item 6 in Table 7) | Helium at 1,200 mbar | $T_{In}$ $T_{Ex}$ | 40° C. NA | 0.05 pA |
| 6 | 100 nm Glass flakes | Al/Al | −500 V at 710° C. (item 2 in Table 7) | Helium at 1,800 mbar | $T_{In}$ $T_{Ex}$ | NA 25-35° C. | 1.2-2.9 pA |
| 7 | 1 μm Glass flakes | Al/Al | −100 V at 400° C. (item 1 in Table 7) | Helium at 1,500 mbar | $T_{In}$ $T_{Ex}$ | 50-100° C. NA | 5.5-200 pA |
| 8 | 100 nm Glass flakes | Ti/Mo | ΔWF (item 5 in Table 9) | Helium at 1,100 mbar | $T_{In}$ $T_{Ex}$ | 45-142° C. NA | 3 pA to 5.3 nA |
| 9 | 300 nm Silica coated aluminum flakes | NA/NA | $NO_2$ gas (item 35 Table 8) | $NO_2$ at 200 mbar | $T_{In}$ $T_{Ex}$ | 22-60° C. NA | 20-120 pA |
| 10 | 300 nm Silica coated aluminum flakes | NA/NA | Benzene (item 1 Table 8) | Helium at 1,100 mbar | $T_{In}$ $T_{Ex}$ | 37-82° C. NA | 3-135 pA |
| 11 | 100 nm Glass flakes | W/Mo | −400 V at 780° C. (item 6 in Table 7) | Helium at 1,200 mbar | $T_{In}$ $T_{Ex}$ | 40-120° C. NA | 0.1-74 pA |
| 12 | 100 nm Glass flakes | Mo/Mo | ΔWF (item 1 in Table 9) | Helium at 1,100 mbar | $T_{In}$ $T_{Ex}$ | 45-150° C. NA | −0.2 pA to +1.1 nA |
| 13 | 100 nm Glass flakes | Ni/Al | ΔWF (item 2 in Table 9) | Helium at 1,100 mbar | $T_{In}$ $T_{Ex}$ | 45-150° C. NA | −55 to −669 pA |
| 14 | 100 nm Glass flakes | Ti/Mn | ΔWF (item 3 in Table 9) | Helium at 1,100 mbar | $T_{In}$ $T_{Ex}$ | 45-150° C. NA | 1.8 pA to 3.4 nA |
| 15 | 100 nm Glass flakes | Mo/Mn | ΔWF (item 4 in Table 9) | Helium at 1,100 mbar | $T_{In}$ $T_{Ex}$ | 45-150° C. NA | −2 pA to −2.5 nA |
| 16 | 100 nm Glass flakes | Ti/Mo | ΔWF (item 5 in Table 9) | Helium at 1,100 mbar | $T_{In}$ $T_{Ex}$ | 45-150° C. NA | 34 pA to 5.3 nA |
| 17 | 100 nm Glass flakes | Mo/Ni | ΔWF (item 6 in Table 9) | Helium at 1,100 mbar | $T_{In}$ $T_{Ex}$ | 45-150° C. NA | 1 pA to 2.0 nA |
| 18 | 100 nm Glass flakes | Mn/Ni | ΔWF (item 7 in Table 9) | Helium at 1,100 mbar | $T_{In}$ $T_{Ex}$ | 45-150° C. NA | 20 pA to 3.7 nA |
| 19 | 100 nm Glass flakes | Ni/Ti | ΔWF (item 8 in Table 9) | Helium at 1,100 mbar | $T_{In}$ $T_{Ex}$ | 45-150° C. NA | −30 pA to −1.8 nA |
| 20 | 3 nm GO flakes | Al/Ni | ΔWF (item 9 in Table 9) | Helium at 1,500 mbar | $T_{In}$ $T_{Ex}$ | NA 40-65° C. | 1.2 to 4.0 nA |
| 21 | 3 nm GO flakes | Al/Al | $NO_2$ gas (item 36 in Table 8) | Helium at 1,500 mbar | $T_{In}$ $T_{Ex}$ | 50-60° C. 40° C. | 0.6 to 1.1 nA |
| 22 | 3 nm GO flakes with 1.5 nm POSS spacers | Al/Al | HCl gas (item 37 in Table 8) | Helium at 1,500 mbar | $T_{In}$ $T_{Ex}$ | 40-80° C. 40° C. | 0.2 to 6.0 nA |
| 23 | 300 nm Silica coated aluminum flakes | NA/NA | Methanol (item 3 in Table 8) | Helium at 1,100 mbar | $T_{In}$ $T_{Ex}$ | 50° C. NA | −2.5 pA |
| 24 | 300 nm Silica coated aluminum flakes | NA/NA | Chloroform (item 2 in Table 8) | Helium at 1,100 mbar | $T_{In}$ $T_{Ex}$ | 50° C. NA | 0.2 pA |
| 25 | 300 nm Silica coated aluminum flakes | NA/NA | Benzene (item 1 in Table 8) | Helium at 1,100 mbar | $T_{In}$ $T_{Ex}$ | 50° C. NA | 3 pA |
| 26 | 300 nm Silica coated aluminum flakes | NA/NA | Methyl violet 2B (item 14 in Table 8) | Helium at 1,100 mbar | $T_{In}$ $T_{Ex}$ | 50° C. NA | 0.1 pA |
| 27 | 300 nm Silica coated aluminum flakes | NA/NA | Basonyl ® blau 636 (item 15 in Table 8) | Helium at 1,100 mbar | $T_{In}$ $T_{Ex}$ | 50° C. NA | 0.3 pA |
| 28 | 300 nm Silica coated aluminum flakes | NA/NA | Basonyl ® blau 636 (item 15 in Table 8) | Oxygen at 500 mbar | $T_{In}$ $T_{Ex}$ | 50° C. NA | 2.7 pA |
| 29 | 300 nm Silica coated aluminum flakes | NA/NA | Flexo black (item 16 in Table 8) | Oxygen at 500 mbar | $T_{In}$ $T_{Ex}$ | 50° C. NA | 1 pA |

TABLE 10-continued

| No. | Structure Comprising | 613/621 | Modification (Item # in Table #) | Gas & Pressure [mbar] | $T_{In}$ $T_{Ex}$ | [° C.] | Current [pA/nA] |
|---|---|---|---|---|---|---|---|
| 30 | 300 nm Silica coated aluminum flakes | NA/NA | T-29 (item 8 in Table 8) | Helium at 1,100 mbar | $T_{In}$ $T_{Ex}$ | 50° C. NA | −0.7 pA |
| 31 | 300 nm Silica coated aluminum flakes | NA/NA | T-5 (item 6 in Table 8) | Helium at 1,100 mbar | $T_{In}$ $T_{Ex}$ | 50° C. NA | 1 pA |
| 32 | 300 nm Silica coated aluminum flakes | NA/NA | T-25 (item 7 in Table 8) | Helium at 1,100 mbar | $T_{In}$ $T_{Ex}$ | 50° C. NA | 2.2 pA |
| 33 | 300 nm Silica coated aluminum flakes | NA/NA | T-39 (item 9 in Table 8) | Helium at 1,100 mbar | $T_{In}$ $T_{Ex}$ | 50° C. NA | 0.1 pA |
| 34 | 300 nm Silica coated aluminum flakes | NA/NA | T-5:T-29 (item 10 in Table 8) | Helium at 1,100 mbar | $T_{In}$ $T_{Ex}$ | 50° C. NA | −1.7 pA |
| 35 | 300 nm Silica coated aluminum flakes | NA/NA | T-25:T-29 (item 12 in Table 8) | Helium at 1,100 mbar | $T_{In}$ $T_{Ex}$ | 50° C. NA | 3 pA |
| 36 | 300 nm Silica coated aluminum flakes | NA/NA | T-5:T-39 (item 11 in Table 8) | Helium at 1,100 mbar | $T_{In}$ $T_{Ex}$ | 50° C. NA | 5 pA |
| 37 | 300 nm Silica coated aluminum flakes | NA/NA | T-25:T-39 (item 13 in Table 8) | Helium at 1,100 mbar | $T_{In}$ $T_{Ex}$ | 50° C. NA | 0.5 pA |
| 38 | 300 nm Silica coated aluminum flakes | Pd—Au/Pd—Au | T-25:T-39 (item 17 in Table 8) | Helium at 1,100 mbar | $T_{In}$ $T_{Ex}$ | 50° C. 50° C. | 8 pA |
| 39 | 300 nm Silica coated aluminum flakes | NA/NA | T-5:T-39 (item 11 in Table 8) | $NO_2$ at 200 mbar | $T_{In}$ $T_{Ex}$ | 50° C. NA | 3 pA |
| 40 | 300 nm Silica coated aluminum flakes | NA/NA | T-5:T-39 (item 11 in Table 8) | $CF_4$ at 125 mbar | $T_{In}$ $T_{Ex}$ | 50° C. 50° C. | 12 pA |
| 41 | 300 nm Silica coated aluminum flakes | Pd—Au/Pd—Au | T-39:T-1111 (item 18 in Table 8) | $CF_4$ at 125 mbar | $T_{In}$ $T_{Ex}$ | 50° C. 50° C. | −160 pA |
| 42 | 300 nm Silica coated Aluminum flakes | NA/NA | $NO_2$ gas (item 35 in Table 8) | $NO_2$ at 500 mbar | $T_{In}$ $T_{Ex}$ | 60° C. NA | 120 pA |
| 43 | 3 nm GO flakes | Al/Al | $NO_2$ gas (item 36 in Table 8) | $NO_2$ at 500 mbar | $T_{In}$ $T_{Ex}$ | NA NA | 20 pA |
| 44 | 3 nm GO flakes | Al/Al | $NO_2$ gas (item 36 in Table 8) | Helium at 1,300 mbar | $T_{In}$ $T_{Ex}$ | 50° C. 40° C. | 600 pA |
| 45 | 3 nm GO flakes and 1.5 nm POSS spacers | Al/Al | HCl gas (item 37 in Table 8) | Helium at 1,300 mbar | $T_{In}$ $T_{Ex}$ | 50° C. 40° C. | 800 pA |
| 46 | 3 nm GO flakes | Ni/Al | ΔWF (item 2 in Table 9) | Helium at 1,200 mbar | $T_{In}$ $T_{Ex}$ | 50° C. 50° C. | 100 pA |
| 47 | 300 nm Silica coated Aluminum flakes | Pt/Pd—Au | ΔWF (item 10 in Table 9) | $CF_4$ at 135 mbar | $T_{In}$ $T_{Ex}$ | 150° C. NA | −160 pA |
| 48 | 300 nm Silica coated Aluminum flakes | Pd—Au/Pd—Au | T-29:T-1116 (item 20 in Table 8) | Helium at 1,700 mbar | $T_{In}$ $T_{Ex}$ | 100° C. NA | −13 pA |
| 49 | 300 nm Silica coated Aluminum flakes | Pd—Au/Pd—Au | T-39:T-1137 (item 19 in Table 8) | Helium at 1,700 mbar | $T_{In}$ $T_{Ex}$ | 100° C. NA | 13 pA |
| 50 | 300 nm Silica coated Aluminum flakes | Pd—Au/Pd—Au | T-4:T-29 (item 22 in Table 8) | Helium at 1,700 mbar | $T_{In}$ $T_{Ex}$ | 100° C. NA | 40 pA |
| 51 | 300 nm Silica coated Aluminum flakes | Pd—Au/Pd—Au | T-4:T-39 (item 24 in Table 8) | Helium at 1,700 mbar | $T_{In}$ $T_{Ex}$ | 100° C. NA | −14 pA |
| 52 | 300 nm Silica coated Aluminum flakes | Pd—Au/Pd—Au | T-5:T-29 (item 24 in Table 8) | Helium at 1,700 mbar | $T_{In}$ $T_{Ex}$ | 100° C. NA | −485 pA |

TABLE 10-continued

| No. | Structure Comprising | 613/ 621 | Modification (Item # in Table #) | Gas & Pressure [mbar] | $T_{In}$ $T_{Ex}$ [° C.] | Current [pA/nA] |
|---|---|---|---|---|---|---|
| 53 | 300 nm Silica coated Aluminum flakes | Pd—Au/ Pd—Au | T-5:T-39 (item 25 in Table 8) | Helium at 1,700 mbar | $T_{In}$ 100° C. $T_{Ex}$ NA | −195 pA |
| 54 | 300 nm Silica coated Aluminum flakes | Al/Al | T-5:T-29 (item 26 in Table 8) | Helium at 1,100 mbar | $T_{In}$ 50° C. $T_{Ex}$ 50° C. | 65 pA |
| 55 | 3 nm GO flakes and 1.5 nm POSS spacers | Al/Al | HCl gas (item 37 in Table 8) | HCl at 300 mbar | $T_{In}$ 40° C. $T_{Ex}$ 40° C. | 2.5 nA |
| 56 | 3 nm GO flakes and 35 nm silica spacers | Cr/Cr | $NiCl_2$ (item 27 in Table 8) | Helium at 1,500 mbar | $T_{In}$ 30° C. $T_{Ex}$ 30° C. | 1.0 nA |
| 57 | 300 nm Silica coated Aluminum flakes | Au/Au | −200 V at 600° C. (item 8 in Table 7) | Helium at 1,100 mbar | $T_{In}$ 50° C. $T_{Ex}$ 50° C. | 8.5 pA |
| 58 | 300 nm Silica coated Aluminum flakes | Au/Au | −200 V at 600° C. (item 8 in Table 7) | $CF_4$ at 160 mbar | $T_{In}$ 50° C. $T_{Ex}$ 50° C. | 4.5 pA |
| 59 | Phlogopite mica | Al/Au | $NF_3$ gas (item 38 in Table 8) | $NF_3$ at 200 mbar | $T_{In}$ 150° C. $T_{Ex}$ 150° C. | 130 pA |
| 60 | Phlogopite mica | Al/Au | $NF_3$ gas (item 38 in Table 8) | Helium at 1,100 mbar | $T_{In}$ 150° C. $T_{Ex}$ 150° C. | 15 pA |
| 61 | Phlogopite mica | Al/Au | $NF_3$ gas (item 38 in Table 8) | Helium at 1,100 mbar | $T_{In}$ 350° C. $T_{Ex}$ 150° C. | 250 pA |
| 62 | 100 nm Aluminum flakes + 20 nm silica spacers | Al/Al | $NiCl_2$ (item 28 in Table 8) [→ Ni] | Helium at 1,400 mbar | $T_{In}$ 150° C. $T_{Ex}$ NA | 2 pA |
| 63 | 100 nm Aluminum flakes + 20 nm silica spacers | Al/Al | Titanium isopropoxide (item 29 in table 8) [→ $TiO_2$] | Helium at 1,400 mbar | $T_{In}$ 150° C. $T_{Ex}$ NA | 2 pA |
| 64 | 100 nm Aluminum flakes + 20 nm silica spacers | Al/Al | Titanium isopropoxide + KCl (item 30 in table 8) [→ $TiO_2$] | Helium at 1,400 mbar | $T_{In}$ 150° C. $T_{Ex}$ NA | 10 pA |
| 65 | 100 nm Aluminum flakes + 20 nm silica spacers | Al/Al | Magnesium methoxide (item 31 in table 8) [→ MgO] | Helium at 1,800 mbar | $T_{In}$ NA $T_{Ex}$ NA | 40 pA |
| 66 | 100 nm Aluminum flakes + 20 nm silica spacers | Al/Al | $NiCl_2$ (item 32 in table 8) [→ NiO] | Helium at 1,800 mbar | $T_{In}$ 50° C. $T_{In}$ NA $T_{Ex}$ NA | 65 pA 5 pA |
| 67 | 100 nm Aluminum flakes + 20 nm silica spacers | Al/Al | $MnSO_4$ (item 33 in table 8) [→ $MnO_2$] | Helium at 1,800 mbar | $T_{In}$ NA $T_{Ex}$ NA | 0.15 pA |
| 68 | 100 nm Aluminum flakes + 20 nm silica spacers | Al/Al | Pyrrole (item 34 in table 8) [polypyrrole] | Helium at 1,800 mbar | $T_{In}$ NA $T_{Ex}$ NA | 30 pA |

Table 10 demonstrates that electrical current was generated using particulated structures according to the teachings of the present embodiments. The experiments showed that the measured current and voltage originated from the interactions between the selected materials and gas medium. This was evidenced by the temperature dependence of the current, by the fact that no current was observed in vacuum, and by the fact that current direction was reversed when the orientation of the particulated structure was inverted. The experiments further showed that current was generated even with noble gases and/or inert materials.

The fact that the total observed voltage was additive further indicates that the measured electrical power generated by this invention is not derived from any external circuit or undesired experimental effect. The observations made in connection with the generation of current and voltage according to some embodiments of the invention were in agreement with the gas mediated charge-transfer mechanism discovered by the present inventors. The generation of electricity was shown for a variety of surfaces of different charge transferability, with a conductivity range spanning several orders of magnitude. Various gasses were found suitable under various working conditions. The dependence of current upon temperature evidences existence of conversion of thermal energy to electricity by the gas mediated charge-transfer mechanism of this invention. The experiments show that, pursuant to this invention, the current, already significant above noise at room temperature, grows exponentially with temperature (FIG. 9).

Example 8

Generation of Electrical Current by Thermal Motion of Gas Molecules

Experiments were performed in accordance with some embodiments of the present invention to generate electrical current by thermal motion of gas molecules between surfaces having different charge transferability. The experiments were performed as described in Example 8 of International Publication No. WO 2010/023669 A2, the contents of which are hereby incorporated by reference. For brevity of presentation, some of the materials described in WO 2010/023669 A2 are omitted from Table 11, but it is to be understood that any combination of materials and conditions described in WO 2010/023669 A2 is also contemplated for use in the context of the present invention.

The surfaces were prepared as described in above examples. Kapton® is a polyimide film and Prolene® is a polypropylene mesh. Strips of these materials were placed between the overlapping surfaces indicated in the table to serve as spacers. MEH-PPV stands for poly[2-methoxy-5-(2'-ethylhexyloxy)-p-phenylene vinylene. The conductive polymer solution was prepared by dissolving 1 mg MEH-PPV (Sigma Aldrich) per ml chloroform upon stirring for two hours at 40° C. The dissolved polymer was applied on the desired support by spin coating at 600 RPM as previously described.

The results are summarized in Table 11, below.

TABLE 11

| No. | Grounded Structure Surface | Non-Grounded Structure Surface | Spacers | Gas | Measurement Conditions P (mbar) $T_{In}$ (° C.) $T_{Ex}$ (° C.) | | Measured Current (pAmp) |
|---|---|---|---|---|---|---|---|
| 1 | TiO$_2$ nano film on Aluminum | Stainless steel | NA | Helium | P<br>$T_{In}$<br>$T_{Ex}$ | 1,400 mbar<br>200° C.<br>70° C. | 5.5 pA |
| 2 | Glass | Chromium | NA | Chlorine | P<br>$T_{In}$<br>$T_{Ex}$ | 200 mbar<br>100-200° C.<br>70° C. | 15 to 200 pA |
| 3 | Glass | MEH-PPV on Al | NA | Helium | P<br>$T_{In}$ | 1,400 mbar<br>150-180° C. | 0.4 to 1.6 pA |
| 4 | Nickel | MEH-PPV on Gd | Alumina, 3 µm | Diethyl amine | P<br>$T_{In}$ | 25 mbar<br>50° C. | −30 pA |
| 5 | MEH-PPV on Gd | LiClO$_4$ doped nitro cellulose on Ni | Alumina, 3 µm | Diethyl amine | P<br>$T_{In}$<br>$T_{Ex}$ | 25 mbar<br>100° C.<br>50° C. | 13.5 pA |
| 6 | 400 nm mineral glass on Al | Nickel | 7 µm Kapton ® | dry air | P<br>$T_{In}$ | 500 mbar<br>150° C. | 120 pA |
| 7 | 400 nm mineral glass on Gd | Nickel | NA | Helium | P<br>$T_{In}$<br>$T_{Ex}$ | 800 mbar<br>80° C.<br>40° C. | 15 pA |
| 8 | 400 nm mineral glass on Gd | Manganese oxide nanofilm on SS | NA | Helium | P<br>$T_{In}$ | 1,050 mbar<br>NA | 1 pA |
| 9 | 400 nm mineral glass on Gd | Manganese oxide nanofilm on SS | NA | SO$_2$F$_2$ | P<br>$T_{In}$ | 300 mbar<br>NA | 0.05 pA |
| 10 | Aluminum | GaAs wafer | NA | Helium | P<br>$T_{In}$ | 1,100 mbar<br>80° C. | −90 to −170 pA |
| 11 | SiO$_2$ | GaAs wafer | NA | Helium | P<br>$T_{In}$ | 1,100 mbar<br>120-200° C. | +0.02 to +0.06 pA |
| 12 | 20 nm SiO$_2$ on LaB$_6$ | GdO$_2$ | NA | Helium | P<br>$T_{In}$ | 1,100 mbar<br>80-160° C. | −0.01 to −3 pA |
| 13 | MnO$_2$ | Cr$_3$Si—SiO$_2$ | NA | Helium | P<br>$T_{In}$ | 1,100 mbar<br>80-170° C. | +1.23 to 1400 pA |
| 14 | MnO$_2$ | Cr$_3$Si—SiO$_2$ | NA | Air | P<br>$T_{In}$ | 1,000 mbar<br>80-120° C. | +0.2 to 14 pA |
| 15 | MnO$_2$ | 10% Al doped SiO$_2$ | NA | Helium | P<br>$T_{In}$ | 1,100 mbar<br>80-140° C. | −1.5 to 6.6 pA |
| 16 | MnO$_2$ | NiO | NA | Helium | P<br>$T_{In}$ | 1,100 mbar<br>120-240° C. | +0.6 to 31 pA |
| 17 | MnO$_2$ | NiO | NA | Oxygen | P<br>$T_{In}$ | 500 mbar<br>120-240° C. | −0.75 to −110 pA |
| 18 | 400 nm Mineral glass on Al | MnO$_2$ | 4 µm Prolene ® | Helium | P<br>$T_{In}$ | 1,100 mbar<br>30-130° C. | +2 to 920 pA |

TABLE 11-continued

| No. | Grounded Structure Surface | Non-Grounded Structure Surface | Spacers | Gas | Measurement Conditions P (mbar) $T_{In}$ (° C.) $T_{Ex}$ (° C.) | | Measured Current (pAmp) |
|---|---|---|---|---|---|---|---|
| 19 | 400 nm Mineral glass on Al | $MnO_2$ | 4 μm Prolene ® | Helium | P<br>$T_{In}$ | 1,100 mbar<br>45° C. | +6,500 pA |
| 20 | $SiO_2$ | $CH_4$:Ar (0.5:10) doped AlN | NA | Helium | P<br>$T_{In}$ | 1,100 mbar<br>120-200° C. | −0.005 to −0.5 pA |
| 21 | Aluminum | $CH_4$:Ar (1:10) doped AlN | NA | Helium | P<br>$T_{In}$ | 1,100 mbar<br>80° C. | +0.5 pA |
| 22 | $SiO_2$ | Aluminum | NA | Helium | P<br>$T_{In}$ | 1,100 mbar<br>80-160° C. | −0.25 to 1.4 pA |
| 23 | 400 nm Mineral glass on Al | $MnO_2$ | NA | Helium | P<br>$T_{In}$<br>$T_{Ex}$ | 1,100 mbar<br>NA<br>27° C. | +0.05 pA |
| 24 | 400 nm Mineral glass on Al | $MnO_2$ | NA | $NO_2$ | P<br>$T_{In}$<br>$T_{Ex}$ | 100 mbar<br>NA<br>27° C. | +0.20 pA |
| 25 | 400 nm Mineral glass on Al | $MnO_2$ | NA | Oxygen | P<br>$T_{In}$<br>$T_{Ex}$ | 1,100 mbar<br>80-140° C.<br>100° C. | +47 to 600 pA |
| 26 | 400 nm Mineral glass on Al | NiO | NA | Helium | P<br>$T_{In}$<br>$T_{Ex}$ | 1,100 mbar<br>40-50° C.<br>40-50° C. | +1.5 to 5 pA |
| 27 | 400 nm Mineral glass on Al | NiO | NA | $NO_2$ | P<br>$T_{In}$<br>$T_{Ex}$ | 100-300 mbar<br>50° C.<br>50° C. | +3 to 6 pA |
| 28 | 400 nm Mineral glass on Al | NiO | NA | $NO_2$ | P<br>$T_{In}$<br>$T_{Ex}$ | 400 mbar<br>19-30° C.<br>19-30° C. | +0.2 to 3 pA |
| 29 | 400 nm Mineral glass on Al | NiO | NA | $O_2$ | P<br>$T_{Ex}$ | 500 mbar<br>17-50° C. | +0.1 to 2.5 pA |
| 30 | $MnO_2$ | InSb wafer | 7 μm Kapton ® | Helium | P<br>$T_{In}$ | 1,100 mbar<br>80-200° C. | −10 to −230 pA |
| 31 | $CaF_2$ | 400 nm Mineral glass on $LaB_6$ | NA | $SO_2$ | P<br>$T_{In}$ | 270 mbar<br>160° C. | −3 pA |
| 32 | $CaF_2$ | 400 nm Mineral glass on $LaB_6$ | NA | Helium | P<br>$T_{In}$ | 1,100 mbar<br>160° C. | −2.2 pA |
| 33 | 400 nm Mineral glass on Gd | $CaF_2$ | NA | $SO_2$ | P<br>$T_{In}$ | 300 mbar<br>80-120° C. | +0.5 to 6 pA |
| 34 | Nickel | $LiClO_4$ doped nitro cellulose on Al | NA | $SO_2$ | P<br>$T_{In}$ | 260 mbar<br>80° C. | +1.6 pA |
| 35 | Nickel | $LiClO_4$ doped nitro cellulose on Al | NA | Helium | P<br>$T_{In}$ | 260 mbar<br>80° C. | +2 pA |
| 36 | Nickel | $LiClO_4$ doped nitro cellulose on Al | NA | $SO_2$ + Helium | P each<br>$T_{In}$ | 100 mbar<br>80° C. | +3.8 pA |
| 37 | Chromium | $LiClO_4$ doped nitro cellulose on Al | NA | Helium | P<br>$T_{In}$ | 1,100 mbar<br>80° C. | +8 pA |
| 38 | $MnO_2$ | Nickel | 7 μm Kapton ® | Helium | P<br>$T_{In}$ | 1,200 mbar<br>160° C. | −102 pA |
| 39 | $MnO_2$ | Au | 7 μm Kapton ® | Helium | P<br>$T_{In}$ | 1,100 mbar<br>120° C. | −20 pA |
| 40 | $MnO_2$ | Au | 7 μm Kapton ® | $NO_2$ | P<br>$T_{In}$ | 400 mbar<br>120° C. | −2.5 pA |
| 41 | $MnO_2$ | Au | 7 μm Kapton ® | $O_2$ | P<br>$T_{In}$ | 400 mbar<br>160° C. | −15 pA |
| 42 | Gadolinium | $CaF_2$ | 7 μm Kapton ® | $NO_2$ | P<br>$T_{In}$ | 400 mbar<br>160° C. | −3.2 pA |
| 43 | Gadolinium | $CaF_2$ | 7 μm Kapton ® | $O_2$ | P<br>$T_{In}$ | 400 mbar<br>160° C. | −5.9 pA |

TABLE 11-continued

| No. | Grounded Structure Surface | Non-Grounded Structure Surface | Spacers | Gas | Measurement Conditions P (mbar) $T_{In}$ (° C.) $T_{Ex}$ (° C.) | | Measured Current (pAmp) |
|---|---|---|---|---|---|---|---|
| 44 | MnO$_2$ | Al | 7 μm Kapton ® | Helium | P $T_{In}$ | 1,100 mbar 160° C. | −0.1 pA |
| 45 | NiO | Al | 7 μm Kapton ® | Helium | P $T_{In}$ | 1,100 mbar 120° C. | −0.35 pA |
| 46 | TiO | Al | 7 μm Kapton ® | Helium | P $T_{In}$ | 1,100 mbar 160° C. | −1.5 pA |

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. The spacers are described as being formed of particles or separate elements, the surface asperities (surface roughness) of the partially-conducting surfaces themselves may act as spacers, in that only a small percentage of one surface actually makes contact with the other surface, so that the overall conductivity between the surfaces remains low, notwithstanding the surface asperity contact. In addition, while the invention describes methods and devices that operate at or near room temperature, the method may be practiced at elevated temperatures such as 50, 100, 150, 200 or 400° C. as well as at higher, intermediate and lower temperatures.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A particulated structure for use in an electrical generator device utilizing a compatible gas to mediate charge transfer between particles for converting thermal energy to electricity, the particulated structure comprising:
a multiplicity of particles in dried state and inter-particle voids, said inter-particle voids being between first and second opposing surfaces of at least some of said particles;
wherein, in conjunction with said gas, the charge transferability of at least a portion of said first opposing surfaces is different from the charge transferability of at least a portion of said second opposing surfaces, such that, in the absence of externally applied voltage, the respective first active surfaces transfer an electric charge to gas molecules interacting therewith and the respective second active surfaces receive an electric charge from gas molecules interacting therewith, resulting in a charge transfer between opposing particles and a net charge transfer from one side of said particulated structure to an opposite side thereof; and
wherein for at least a portion of said particle surfaces, a concentration or type of molecules, atoms or ions is different on said first opposing surface than on said second opposing surface.

2. An electrical generator device for converting thermal energy to electricity, the device comprising:
the particulated structure according to claim 1; and
a gas medium having gas molecules in at least a portion of said voids.

3. A method of powering an electrically activated system, comprising connecting the electrically activated system to the device according to claim 2.

4. The particulated structure according to claim 1, wherein for each particle of a portion of said particles, the charge transferability is generally the same for all surfaces of said particle.

5. The particulated structure according to claim 1, wherein the first opposing surface and the second opposing surface have substantially identical chemical composition.

6. The particulated structure according to claim 1, further comprising a first electrode and a second electrode disposed such that said particulated structure is between said electrodes, wherein said first electrode and said second electrode have operative surfaces of the same material.

7. The particulated structure according to claim 1, further comprising a first electrode and a second electrode disposed such that said particulated structure is between said electrodes, wherein said first electrode and said second electrode have operative surfaces of materials characterized by different work functions.

8. The particulated structure according to claim 1, wherein said particles form a self-supporting structure.

9. The particulated structure according to claim 1, wherein said particles are in a powder form and are contained in a supporting structure.

10. The particulated structure according to claim 1, wherein the charge transferability of said first opposing surfaces is positive and the charge transferability of said second opposing surfaces is negative.

* * * * *